(12) United States Patent
Misaka

(10) Patent No.: US 9,507,252 B2
(45) Date of Patent: Nov. 29, 2016

(54) PHOTOMASK AND PATTERN FORMING METHOD USING PHOTOMASK

(71) Applicant: Panasonic Intellectual Property Management Co., Ltd., Osaka (JP)

(72) Inventor: Akio Misaka, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 16 days.

(21) Appl. No.: 14/798,542

(22) Filed: Jul. 14, 2015

(65) Prior Publication Data

US 2015/0316841 A1 Nov. 5, 2015

Related U.S. Application Data

(63) Continuation of application No. PCT/JP2013/005834, filed on Oct. 1, 2013.

(30) Foreign Application Priority Data

Jan. 21, 2013 (JP) ................. 2013-008272

(51) Int. Cl.
*G03F 1/28* (2012.01)
*G03F 1/70* (2012.01)

(52) U.S. Cl.
CPC .. *G03F 1/28* (2013.01); *G03F 1/70* (2013.01)

(58) Field of Classification Search
CPC .................................... G03F 1/28; G03F 1/70
USPC ........................................................... 430/5
See application file for complete search history.

(56) References Cited

U.S. PATENT DOCUMENTS

2007/0003841 A1 1/2007 Choi
2013/0260293 A1 10/2013 Misaka et al.

FOREIGN PATENT DOCUMENTS

| JP | 7-253650 | 10/1995 |
|---|---|---|
| JP | 2001-356469 | 12/2001 |
| JP | 2001-358073 | 12/2001 |
| JP | 2004-501405 A | 1/2004 |
| JP | 2005-345920 | 12/2005 |
| JP | 2007-013088 | 1/2007 |
| JP | 2009-230126 | 10/2009 |
| JP | 2009-258250 | 11/2009 |
| JP | 2012-032783 | 2/2012 |
| JP | 2012-058324 | 3/2012 |
| WO | 2013/145044 | 10/2013 |

OTHER PUBLICATIONS

International Search Report of PCT application No. PCT/JP2013/005834 dated Dec. 10, 2013.

*Primary Examiner* — Christopher Young
(74) *Attorney, Agent, or Firm* — McDermott Will & Emery LLP

(57) ABSTRACT

A photomask includes a transparent substrate, and a light shield provided to the transparent substrate. The light shield includes a translucent mask pattern opening, and the mask pattern opening includes a plurality of translucent regions which are provided to a periphery of a region corresponding to a desired pattern, and allow exposure light beams to be transmitted at at least three different phases. Each of the plurality of translucent region spaced apart from the region corresponding to the desired pattern, advances more toward an exposure object spaced a predetermined distance apart compared to a phase plane of an exposure light beam transmitted through a translucent region of the plurality of translucent regions, the translucent region close to the region corresponding to the desired pattern, such that the exposure light beams that are transmitted through the mask pattern opening form a projection image of the desired pattern on the exposure object.

55 Claims, 66 Drawing Sheets

FIG. 39G1 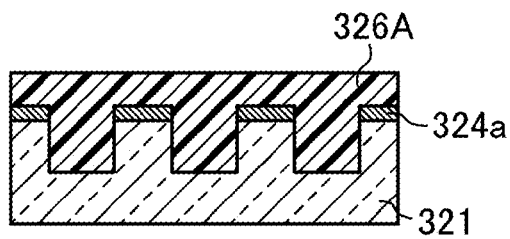
FIG. 39G2 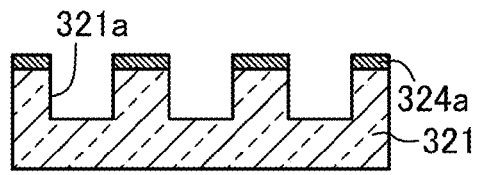

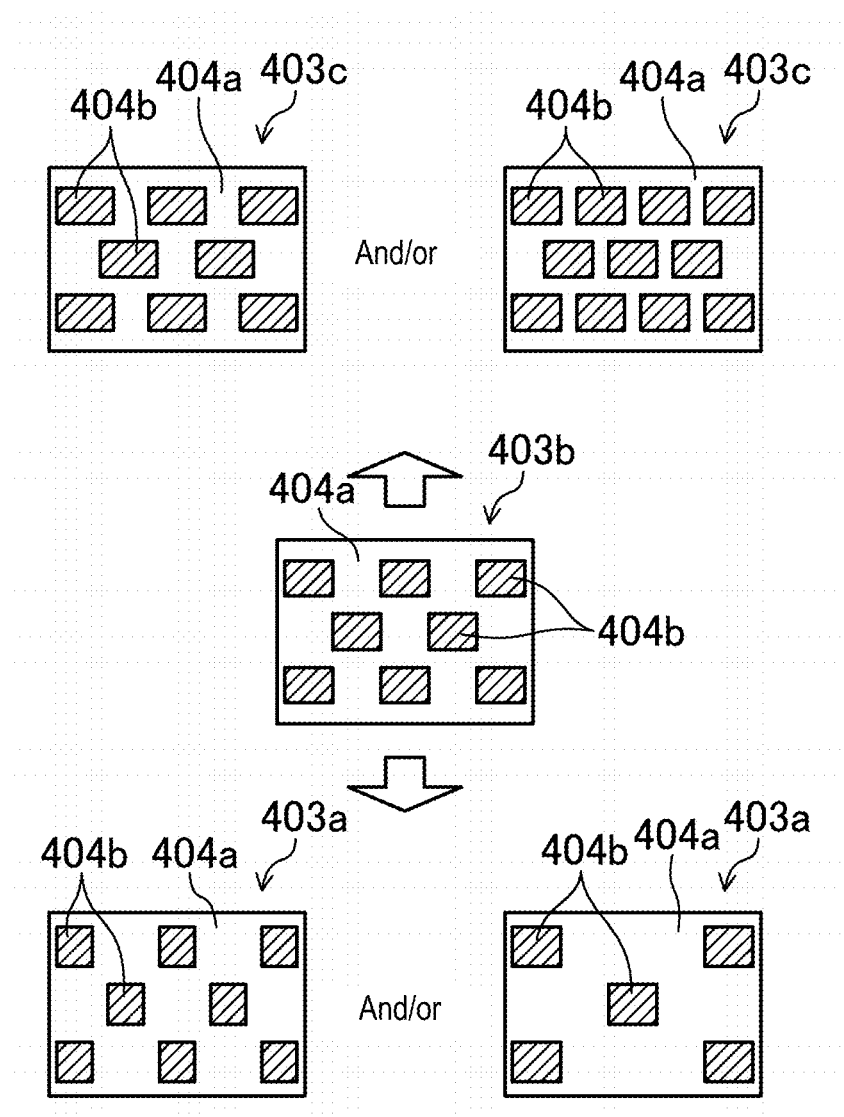

PHOTOMASK AND PATTERN FORMING METHOD USING PHOTOMASK

BACKGROUND OF THE INVENTION

1. Field of the Invention

The present disclosure relates to a photomask and a pattern forming method which uses the photomask. More particularly, the present disclosure relates to a photomask which is used for proximity exposure for forming a pattern with an interval smaller than a limit value that can be achieved by exposure in lithography, and a pattern forming method which uses the photomask.

2. Description of the Related Art

In micromachining of a semiconductor integrated circuit, MEMS (micro electro mechanical systems) processing and surface finishing of a flat panel such as liquid crystal, lithography is used in which a photosensitive resin layer formed on a substrate to be processed is subjected to pattern exposure, and the exposed photosensitive resin layer is developed to form a pattern of interest. In lithography, light beams are generally applied through a photomask on which a pattern is drawn. In this case, exposure is usually performed by providing a gap between the photomask and an exposure object, i.e., proximity exposure is usually performed to prevent a damage caused when the photomask closely adheres to the exposure object.

However, when such a gap is provided, even if a pattern of about several multiples of an exposure wavelength dimension is provided on a mask to form a fine pattern of about several multiples of the exposure wavelength dimension, there is a problem that a pattern having a dimension of interest cannot be formed on a substrate which is an exposure object due to the Fresnel diffraction phenomenon or the like. More specifically, even when an exposure light beam whose exposure wavelength is 365 nm is used, if a gap of several tens of μm is provided between a mask and an exposure object, a resolution up to 4 μm to 5 μm can only be obtained.

When exposure is performed with use of exposure photomask 903 in which light shield 902 is formed on transparent substrate 901 as illustrated in, for example, FIG. 48, light beams 904 transmitted through photomask 903 are diffracted, and diffracted light beams 904 blur a pattern before reaching substrate 905 which is an exposure object.

However, in recent years, a projection transfer exposure method is used in some cases, in which a projection lens is provided between photomask 903 and substrate 905 mentioned above. According to the projection transfer exposure method, it is possible to transfer a pattern image to the exposure object and, consequently, a resolution corresponding to an exposure wavelength can be obtained. In this regard, however, a precise lens is necessary, and therefore an exposure device is enormously costly.

Hence, a method is being proposed for achieving a desired pattern of fine dimension in proximity exposure, in which phase shifters which change phases of exposure light beams are provided on a photomask to improve a contrast of light intensities using interferences of light beams.

A method of forming a pattern smaller than a limit value that can be achieved by exposure in lithography with use of photomask 903A will be described with reference to FIG. 49 (see, for example, Patent Literature 1).

As illustrated in FIG. 49, photomask 903A is a phase shift mask in which main pattern (light transmissive portion) 906 including a linear main opening, and transmissive and linear auxiliary patterns (light transmissive portions) 908 provided on a lateral side of main pattern 906 are partitioned by phase shift films 909. Further, light shielding films (chrome films) 907 are provided in a region on an outer side of auxiliary patterns 908.

Auxiliary pattern 908 are each an opening pattern which is not resolved by development processing, and are arranged in regions on both lateral sides symmetrically with respect to a center line of main pattern 906. It is disclosed that phase shift films 909 shift phases of passing light beams by 180° to cause light beams widened by diffraction in main pattern 906 to interfere with light beams of reverse phases transmitted through auxiliary patterns 908 and to cancel each other in order to improve a degraded resolution.

CITATION LIST

Patent Literature

PTL 1: Unexamined Japanese Patent Publication No. 2012-58324

However, the proximity exposure still degrades the resolution as an interval between a photomask and an exposure object becomes longer, and can only cancel part of light beams which widen as a result of diffraction. Hence, a resolution limit dimension can only improve up to half of the original resolution limit dimension, and therefore an effect is limited.

SUMMARY OF THE INVENTION

In light of the above problem, an object of the present disclosure is to realize, in proximity exposure, a principle of projection transfer exposure for allowing light beams transmitted through a photomask to form an image on an exposure object spaced a predetermined interval apart, realize improvement of the resolution independently of whether an interval between the exposure object and the photomask is long or short and realize substantial improvement of a resolution limit in principle to be equivalent to that of the projection transfer exposure.

To achieve the above object, the present disclosure employs a configuration of a photomask where a plurality of translucent regions are provided to a periphery of a region corresponding to a desired pattern in a translucent region provided to a mask pattern opening, and phase planes of light beams transmitted through the translucent regions advance more with increasing distance from the desired pattern.

More specifically, a photomask according to the present disclosure includes:

a transparent substrate; and a light shield which is provided to the transparent substrate, and shields an exposure light beam, and the light shield includes a translucent mask pattern opening, the mask pattern opening includes a plurality of translucent regions which are provided to a periphery of a region corresponding to a desired pattern, and allow exposure light beams to be transmitted at at least three different phases, and the plurality of translucent regions are configured such that a phase plane of an exposure light beam that is transmitted through a translucent region of the plurality of translucent regions, the translucent region spaced apart from the region corresponding to the desired pattern, advances more toward an exposure object spaced a predetermined distance apart compared to a phase plane of an exposure light beam that is transmitted through a translucent region of the plurality of translucent regions, the translucent region close to the region corresponding to the desired pattern, such that the exposure light beams that are transmitted through the mask pattern opening form a projection image of the desired pattern on the exposure object.

According to the present disclosure, a phase plane of an exposure light beam that is transmitted through a translucent region which is spaced apart from the region corresponding to the desired pattern among the plurality of translucent regions which are provided in the periphery of a region which is the translucent mask pattern opening and corresponds to the desired pattern is configured to advance more toward the exposure object compared to a phase plane of an exposure light beam that is transmitted through the translucent region close to the region corresponding to the desired pattern. Consequently, phases of light beams that are transmitted through translucent regions on both sides of the desired pattern match to match the desired pattern on an exposure object spaced a predetermined distance apart from the photomask. Consequently, it is possible to form a desired pattern image as in a lens function.

In the photomask according to the present disclosure, exposure light beams that are transmitted through the respective translucent regions may be configured to be lowered in transmission intensity with increasing distance from the region corresponding to the desired pattern.

By so doing, when a desired pattern image is formed on the exposure object spaced a predetermined distance apart from the photomask, a balance between intensities of light beams that are transmitted through a region spaced apart from the region corresponding to the desired pattern on the photomask, and intensities of light beams that are transmitted through a region close to the region corresponding to the desired pattern on the photomask is adjusted. Consequently, it is possible to form a pattern of a good shape.

In the photomask according to the present disclosure, the mask pattern opening may include a main pattern provided in the region corresponding to the desired pattern, an auxiliary pattern may be provided in a periphery of the region corresponding to the desired pattern, the auxiliary pattern allowing an exposure light beam to be transmitted at a phase different from a phase of the main pattern, the auxiliary pattern including the plurality of translucent regions, the auxiliary pattern may include a first phase shifter which is provided to a region close to the main pattern, and a second phase shifter which is provided to a region far from the main pattern, and a phase plane of an exposure light beam that is transmitted through the second phase shifter may be configured to advance more toward the exposure object compared to a phase plane of an exposure light beam that is transmitted through the first phase shifter.

Thus, the phases of the exposure light beams that are transmitted through the main pattern, the first phase shifter and the second phase shifter match at a position corresponding to the desired pattern on the exposure object spaced a predetermined distance apart from the photomask, and enhance each other. Consequently, it is possible to form an image of a high contrast.

In this case, light shields may be provided around the auxiliary pattern.

Thus, it is possible to form the desired pattern as an isolated transfer image.

Further, in this case, the main pattern and the auxiliary pattern may be linear, and the first phase shifter and the second phase shifter may be provided to make a pair at positions sandwiching the main pattern on both sides of a stretching direction of the main pattern.

Thus, a desired line pattern condenses more light beams, so that it is possible to form an image of a higher contrast.

Further, in this case, at least one of the first phase shifter and the second phase shifter may have a width equal to or more than an exposure wavelength.

Further, in this case, a phase difference between exposure light beams that are transmitted through the first phase shifter and the second phase shifter may be 120° or less.

Thus, it is possible to form an image of a high contrast.

Further, in this case, each of the first phase shifter and the second phase shifter may be linear, and a width of the second phase shifter may be narrower than a width of the first phase shifter.

Thus, the phases of the exposure light beams that are transmitted through the first phase shifter and the second phase shifter more reliably match at a position corresponding to the desired pattern on the exposure object spaced a predetermined distance apart from the photomask. Consequently, it is possible to form an image of a high contrast.

Further, in this case, a width of the second phase shifter may be a 0.71-fold width ($1/\sqrt{2}$) of the first phase shifter or less.

Further, in this case, each of the first phase shifter and the second phase shifter may be linear, and a length of the second phase shifter may be shorter than a length of the first phase shifter.

Further, in this case, the main pattern may include a protruding corner which protrudes outward, and the auxiliary pattern may not be provided to a periphery of the protruding corner.

Further, in this case, the main pattern may include a protruding corner which protrudes outward, and a width of the auxiliary pattern is narrow in a periphery of the protruding corner.

Further, in this case, the main pattern may include a linear end or a protruding corner which protrudes outward, the first phase shifter and the second phase shifter may be provided in parallel to an outer circumference of the main pattern, and the second phase shifter may be segmented in the end or a periphery of the protruding corner.

Further, in this case, the auxiliary pattern may include a pattern which produces the same phase as a phase of the main pattern or produces a phase different from the phase of the main pattern by an integer multiple of 360°.

Further, in this case, the first phase shifter and the second phase shifter may be formed by carving the transparent substrate.

Thus, it is possible to make the photomask only by carving the transparent substrate. Consequently, it is possible to easily make the photomask.

Further, the photomask in this case may further include a transparent film which is provided on the mask pattern opening on the transparent substrate, and a thickness of a formation region of the first phase shifter in the transparent film may be thicker than a thickness of a formation region of the second phase shifter in the transparent film.

Thus, it is possible to form an image of a high contrast.

In this case, a thickness of a formation region of the main pattern in the transparent film may be thicker than the thicknesses of the formation regions of the first phase shifter and the second phase shifter in the transparent film.

Further, in this case, a plurality of linear light shields may be provided in a region between the transparent substrate and the transparent film and to the first phase shifter and the second phase shifter, and a width of each of the plurality of light shields may be equal to a wavelength of the exposure light beam or less.

Thus, it is possible to reliably advance the phases of the exposure light beams that are transmitted through the second phase shifter compared to the phases of the exposure light beams that are transmitted through the first phase shifter.

In this case, an interval between adjacent ones of the light shields provided to the first phase shifter may be longer than an interval between adjacent ones of the light shields provided to the second phase shifter.

Thus, it is possible to reliably lower the effective transmittance (referred to as an effective transmittance below) of the second phase shifter with respect to the exposure light beams compared to the effective transmittance of the first phase shifter.

Further, in this case, an interval between adjacent ones of the light shields may be equal to the wavelength of the exposure light beam or less.

Thus, it is possible to reliably adjust phases of exposure light beams that are transmitted through each phase shifter.

Further, in this case, a width of each of the light shields provided to the first phase shifter may be narrower than a width of each of the light shields provided to the second phase shifter.

Thus, it is possible to lower the effective transmittance of the second phase shifter with respect to the exposure light beams compared to the effective transmittance of the first phase shifter.

Further, in this case, a plurality of isolated light shields including micro openings may be provided in a region between the transparent substrate and the transparent film and to the first phase shifter and the second phase shifter, and an area ratio per unit area of the micro openings provided to the first phase shifter may be higher than an area ratio per unit area of the micro openings provided to the second phase shifter.

Thus, it is possible to reliably lower the effective transmittance of the second phase shifter with respect to the exposure light beams compared to the effective transmittance of the first phase shifter.

Further, in this case, a plurality of isolated light shields including micro openings may be provided in a region between the transparent substrate and the transparent film and to the first phase shifter and the second phase shifter, and an interval between adjacent ones of the micro openings provided to the first phase shifter may be shorter than an interval between adjacent ones of the micro openings provided to the second phase shifter.

Thus, it is possible to reliably lower the effective transmittance of the second phase shifter with respect to the exposure light beams compared to the effective transmittance of the first phase shifter.

Further, in this case, a plurality of isolated light shields may be provided in a region between the transparent substrate and the transparent film and to the first phase shifter and the second phase shifter, and an area ratio per unit area of the plurality of light shields provided to the first phase shifter may be lower than an area ratio per unit area of the plurality of light shields provided to the second phase shifter.

Thus, it is possible to reliably lower the effective transmittance of the second phase shifter with respect to the exposure light beams compared to the effective transmittance of the first phase shifter.

Further, in this case, a plurality of isolated light shields may be provided in a region between the transparent substrate and the transparent film and to the first phase shifter and the second phase shifter, and an interval between adjacent ones of the light shields provided to the first phase shifter may be longer than an interval between adjacent ones of the light shields provided to the second phase shifter.

Thus, it is possible to reliably lower the effective transmittance of the second phase shifter with respect to the exposure light beams compared to the effective transmittance of the first phase shifter.

In the photomask according to the present disclosure, the mask pattern opening may include an auxiliary pattern provided to a periphery of the region corresponding to the desired pattern, the auxiliary pattern may include a first carved portion which is provided in a region close to the region corresponding to the desired pattern, and a second carved portion which is provided in a region far from the region corresponding to the desired pattern, the first carved portion and the second carved portion may be formed by carving the transparent substrate, and a depth of the second carved portion may be deeper than a depth of the first carved portion.

Thus, it is possible to reliably advance the phases of the exposure light beams that are transmitted through the second carved portion compared to the phases of the exposure light beams that are transmitted through the first carved portion.

In this case, the auxiliary pattern may include a third carved portion in a region farther from the region corresponding to the desired pattern than the second carved portion, and a depth of the third carved portion may be deeper than one of the depth of the first carved portion and the depth of the second carved portion.

Thus, it is possible to reliably advance the phases of the exposure light beams that are transmitted through the third carved portion compared to the phases of the exposure light beams that are transmitted through the first carved portion or the second carved portion.

In the photomask according to the present disclosure, the mask pattern opening may include an auxiliary pattern provided to a periphery of the region corresponding to the desired pattern, the auxiliary pattern may include a first waveguide which is provided in a region close to the region corresponding to the desired pattern, and a second waveguide which is provided in a region far from the region corresponding to the desired pattern, each of the first waveguide and the second waveguide may be made of a translucent material having a thickness and a gap equal to or less than a wavelength of the exposure light beam, and a phase plane of an exposure light beam that is transmitted through the second waveguide may be configured to advance toward the exposure object compared to a phase plane of an exposure light beam that is transmitted through the first waveguide.

Thus, the phases of the exposure light beams that are transmitted through the first waveguide and the phases of the exposure light beams that are transmitted through the second waveguide match at a position corresponding to the desired pattern on the exposure object spaced a predetermined distance apart from the photomask, and enhance each other. Consequently, it is possible to form an image of a high contrast.

In this case, each of the first waveguide and the second waveguide may be composed of a plurality of narrow carved portions provided to the transparent substrate, a width of each of the narrow carved portions may be equal to the wavelength of the exposure light beam or less, and an interval between adjacent ones of the narrow carved portions may be equal to the wavelength of the exposure light beam or less.

Thus, it is possible to form phase shifters which generate various phases by carving the transparent substrate and, consequently, reduce man-hours for making the photomask.

In this case, an interval between adjacent ones of the narrow carve portions in the second waveguide may be shorter than an interval between adjacent ones of the narrow carved portions of the first waveguide.

Thus, it is possible to reliably advance the phases of the exposure light beams that are transmitted through the second waveguide compared to the phases of the exposure light beams that are transmitted through the first waveguide.

Further, in this case, a width of each of the narrow carved portions of the second waveguide may be wider than a width of each of the narrow carved portions of the first waveguide.

Thus, it is possible to reliably advance the phases of the exposure light beams that are transmitted through the second waveguide compared to the phases of the exposure light beams that are transmitted through the first waveguide.

Further, in this case, a depth of each of the narrow carved portions of the first waveguide may be the same as a width of each of the narrow carved portions of the second waveguide.

Thus, it is possible to form a plurality of phase shifters with use of one type of carving depth, and reduce man-hours for making the photomask.

Further, in this case, a depth of each of the narrow carved portions of the second waveguide may be deeper than a depth of each of the narrow carved portions of the first waveguide.

Thus, it is possible to form waveguides which allow more types of phases to be transmitted while limiting a range of a processing dimension of the waveguides.

Further, in this case, a carved portion having a width equal to or more than the wavelength of the exposure light beam may be provided to at least one of a region between the first waveguide and the second waveguide, and a region which is farther from the region corresponding to the desired pattern than the second waveguide and is adjacent to the second waveguide.

Thus, a range is maximized within which a phase of exposure light beams can be changed in one carved portion.

Further, in this case, light shields may be each provided on a surface of a region between adjacent ones of the narrow carved portions in the transparent substrate.

Thus, each waveguide can adjust not only phases of exposure light beams but also an effective transmittance.

In this case, the light shields may be each provided to a center portion of the surface.

Thus, the effective transmittance of each waveguide with respect to exposure light beams is hardly influenced by a manufacturing error caused when the photomask is made.

Further, in this case, the light shields may be each provided to expose a center portion of the surface.

Thus, the effective transmittance of each waveguide with respect to exposure light beams is hardly influenced by a manufacturing error caused when the photomask is made.

In this case, the light shields may be cyclically repeatedly arranged in at least one of the first waveguide and the second waveguide.

Thus, the effective transmittance of each waveguide with respect to exposure light beams is hardly influenced by a manufacturing error caused when the photomask is made.

Further, in this case, a rate of an exposed portion of the surface between the narrow carved portions of the second waveguide with respect to the light shield may be lower than a rate of an exposed portion of the surface between the narrow carved portions of the first waveguide with respect to the light shield.

Thus, it is possible to reliably lower the effective transmittance of the second waveguide with respect to the exposure light beams compared to the effective transmittance of the first waveguide.

Further, in this case, the narrow carved portions, the light shields and exposed portions on surfaces between the narrow carved portions are cyclically repeatedly arranged in at least one of the first waveguide and the second waveguide.

Thus, it is possible to individually adjust phases and the transmittances of exposure light beams that are transmitted through each waveguide.

In this case, an arrangement cycle at which the narrow carved portions, the light shields and the exposed portions are repeatedly arranged may be 1.5-fold of the wavelength of the exposure light beam or less.

Thus, it is possible to reliably adjust phases and the transmittances of exposure light beams that are transmitted through each waveguide.

In this case, a rate of the narrow carved portions of the second waveguide may be higher than a rate of the narrow carved portions of the first waveguide.

Thus, it is possible to reliably advance the phases of the exposure light beams that are transmitted through the second waveguide compared to the phases of the exposure light beams that are transmitted through the first waveguide.

Further, in this case, a rate of the light shields in the second waveguide may be higher than a rate of the light shields in the first waveguide.

Thus, it is possible to reliably lower the effective transmittance of the second waveguide with respect to the exposure light beams compared to the effective transmittance of the first waveguide with respect to the exposure light beams.

Further, in this case, a rate of the exposed portions in the second waveguide may be lower than a rate of the exposed portions in the first waveguide.

Thus, it is possible to reliably lower the effective transmittance of the second waveguide with respect to the exposure light beams compared to the effective transmittance of the first waveguide with respect to the exposure light beams.

When the photomask according to the present disclosure includes the first and second carved portions or the first and second waveguides, a main pattern at which a surface of the transparent substrate is exposed may be provided in the region corresponding to the desired pattern.

Thus, the intensities of light beams that are transmitted through the region corresponding to the desired pattern are made strong. Consequently, it is possible to form a clearer image of a desired pattern independently of the dimension of the desired pattern.

When the photomask according to the present disclosure includes the first and second carved portions, the first carved portion and the second carved portion may be formed by carving the transparent substrate.

Thus, by processing a simple mask structure formed by the transparent substrate including normal light shields provided in a circumference, it is possible to realize the photomask according to the present disclosure.

Further, when the photomask according to the present disclosure includes the first and second carved portions, the photomask may further include a semi-transparent film which is provided between the transparent substrate and the light shield, and the first carved portion and the second carved portion may be formed by carving the semi-transparent film.

Thus, it is possible to easily change transmittances of light beams in the plurality of translucent regions in the mask pattern opening.

Further, when the photomask according to the present disclosure includes the first and second carved portions, the photomask may further include a semi-transparent film and a transparent film which are provided between the transparent substrate and the light shield while the semi-transparent film is provided at the transparent substrate and the transparent film is provided at the light shield, and the first carved portion and the second carved portion may be formed by carving the transparent film.

Thus, it is possible to easily change transmittances of light beams in the plurality of translucent regions in the mask pattern opening. In addition, the transparent film is carved, and etching process in carving process does not change the transmittance of the transparent film. Consequently, it is possible to independently adjust the phases and the transmittances.

When the photomask according to the present disclosure includes the first and second waveguides, and the waveguides are composed of the narrow carved portions, the plurality of narrow carved portions may be formed by carving the transparent substrate.

Thus, by processing a simple mask structure composed only of the transparent substrate including normal light shields provided in a circumference, it is possible to realize the photomask according to the present disclosure.

Further, when the photomask according to the present disclosure includes the first and second waveguides, and the waveguides are composed of the narrow carved portions, the photomask may further include a semi-transparent film which is provided between the transparent substrate and the light shield, and the plurality of narrow carved portions may be formed by carving the semi-transparent film.

Thus, it is possible to easily change transmittances of light beams in the plurality of translucent regions in the mask pattern opening.

Further, when the photomask according to the present disclosure includes the first and second waveguides, and the waveguides are composed of the narrow carved portions, the photomask may further include a semi-transparent film and a transparent film which are provided between the transparent substrate and the light shield while the semi-transparent film is provided at the transparent substrate and the transparent film is provided at the light shield, and the plurality of narrow carved portions may be formed by carving the transparent film.

Thus, it is possible to easily change transmittances of light beams in the plurality of translucent regions in the mask pattern opening. In addition, the transparent film is carved, and an etching process in a carving process or the like does not change the transmittance of the transparent film. Consequently, it is possible to independently adjust the phases and the transmittances.

The photomask according to the present disclosure may further include a semi-transparent film which is provided between the transparent substrate and the light shield, and a main pattern at which the transparent substrate is exposed may be provided in the region corresponding to the desired pattern in the mask pattern opening, a carved portion formed by carving the transparent substrate may be provided adjacently to the main pattern, and a semi-transparent portion at which the semi-transparent film is exposed may be provided on an outer side of the carved portion.

Thus, it is possible to realize a phase distribution and a transmittance distribution which are necessary to condense light beams at a position corresponding to the desired pattern on an exposure target substrate, and form an image without a complicated mask manufacturing process.

In this case, a phase difference between exposure light beams that are transmitted through the main pattern and the carved portions may be 120° or less.

Thus, the exposure light beams are precisely condensed at a desired pattern position. Consequently, it is possible to obtain a desired image.

Further, in this case, a phase difference between exposure light beams that are transmitted through the main pattern and the semi-transparent portion may be 120° or less.

Thus, the exposure light beams are precisely condensed at a desired pattern position. Consequently, it is possible to obtain a desired image.

A pattern forming method which uses the photomask according to the present disclosure includes:

preparing a substrate on which a resist film is formed;

selectively irradiating the resist film with an exposure light beam through the photomask; and developing the resist film irradiated with the exposure light beam, to form a resist pattern.

According to the pattern forming method which uses the photomask according to the present disclosure, it is possible to form a fine pattern by condensing light beams that are transmitted through the photomask according to the present disclosure.

According to the photomask according to the present disclosure and the pattern forming method which uses the photomask, it is possible to obtain substantially improved resolution equivalent to that obtained by projection transfer exposure.

BRIEF DESCRIPTION OF DRAWINGS

FIG. 39B1 is a sectional view along line XXXIXb1-XXXIXb1 in FIG. 39A;

FIG. 39B2 is a sectional view along line XXXIXb2-XXXIXb2 in FIG. 39A;

FIG. 39G1 is a sectional view of the order of processes indicating the method of making the waveguides of the photomask corresponding to the layout in FIG. 34E;

FIG. 39G2 is a sectional view of the order of processes indicating the method of making the waveguides of the photomask corresponding to the layout in FIG. 34E;

FIG. 40C is a schematic enlarged plan view illustrating a modified example of a layout for adjusting an effective transmittance of the waveguide of the photomask according to the fifth exemplary embodiment;

FIG. 40D is a schematic enlarged plan view illustrating a modified example of a layout for adjusting an effective transmittance of the waveguide of the photomask according to the fifth exemplary embodiment;

FIG. 40E is a schematic enlarged plan view illustrating a modified example of a layout for adjusting an effective transmittance of the waveguide of the photomask according to the fifth exemplary embodiment;

FIG. 40F is a schematic enlarged plan view illustrating a modified example of a layout for adjusting an effective transmittance of the waveguide of the photomask according to the fifth exemplary embodiment;

FIG. 41A is a plan view illustrating an example of a photomask according to a sixth exemplary embodiment;

FIG. 41B is a sectional view along line XLIb-XLIb in FIG. 41A;

FIG. 42A is a plan view illustrating an example of a photomask according to a seventh exemplary embodiment;

FIG. 42B is a sectional view along line XLIIb-XLIIb in FIG. 42A;

FIG. 43A is a schematic plan view illustrating a method of changing a layout of light shields and micro openings of the photomask according to the seventh exemplary embodiment;

FIG. 43B is a schematic plan view illustrating a method of changing a layout of light shields and micro openings of the photomask according to the seventh exemplary embodiment;

FIG. 44 is a schematic plan view illustrating a method of changing a layout of light shields and micro openings of the photomask according to the seventh exemplary embodiment;

FIG. 45A is a plan view illustrating an example of a photomask according to an eighth exemplary embodiment;

Figure 45A:
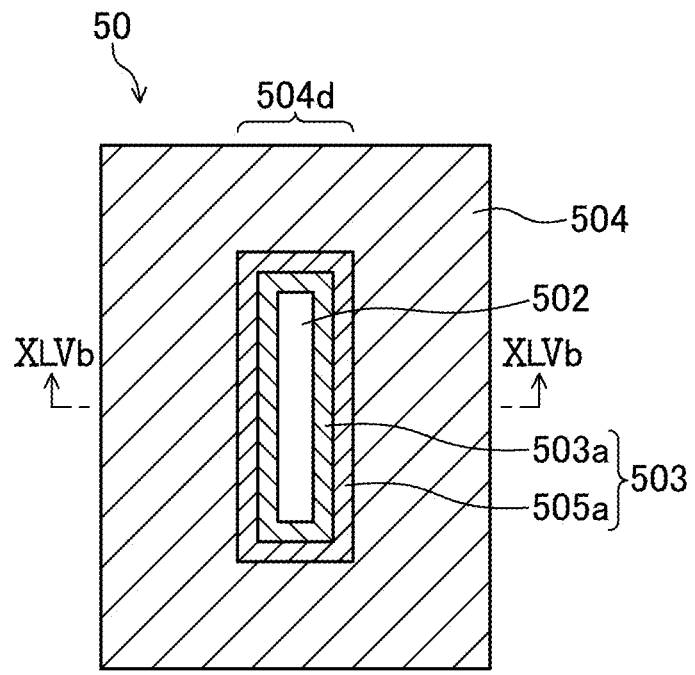
Figure 45B:
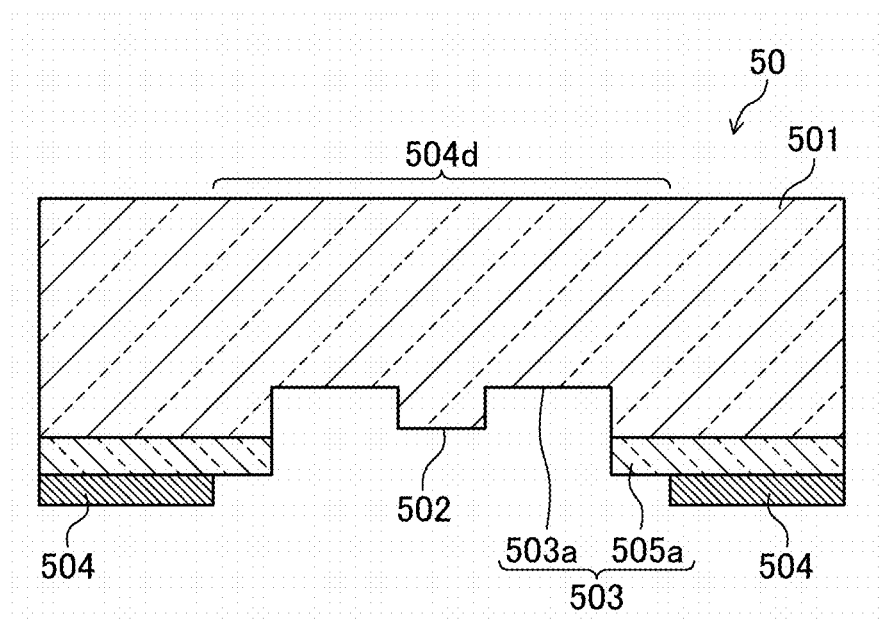
Figure 46A:
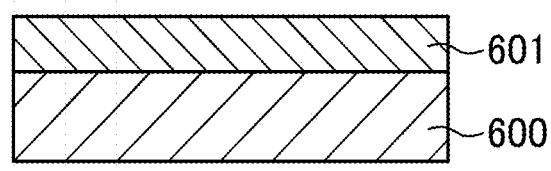
Figure 46B:
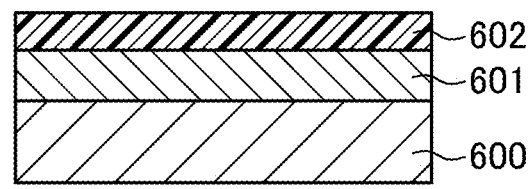
Figure 46C:
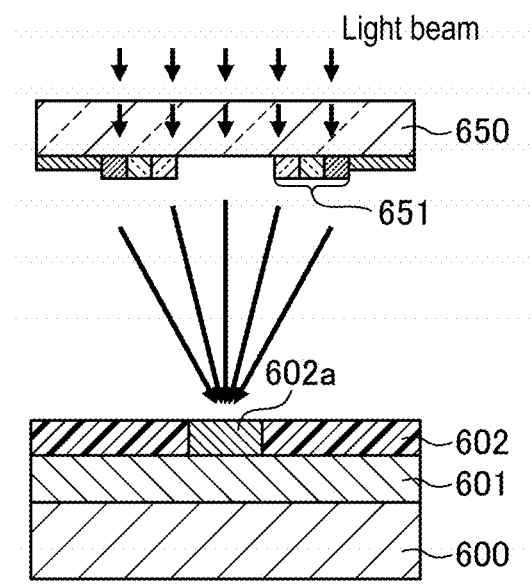
Figure 46D:
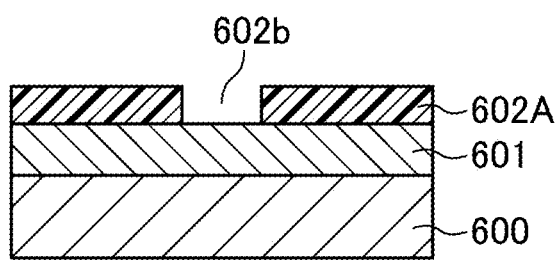
Figure 47A:
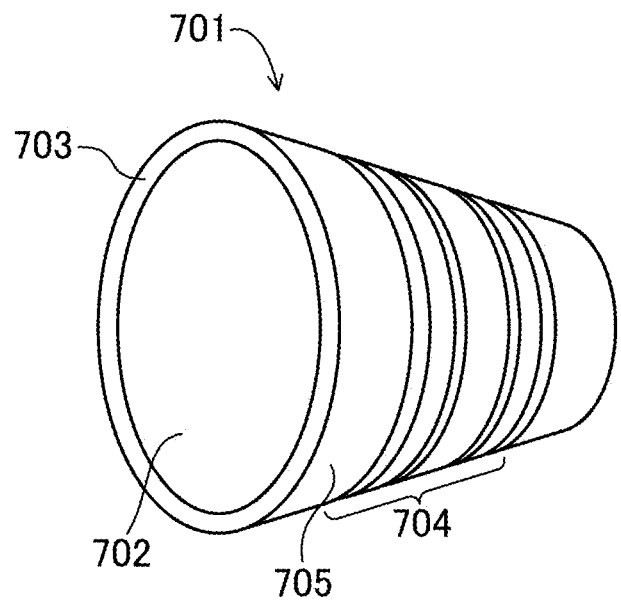
Figure 47B:
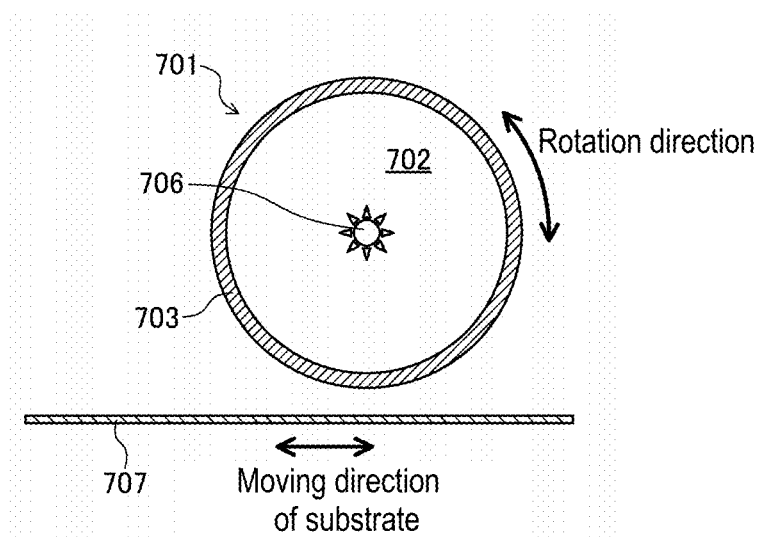
Figure 48:
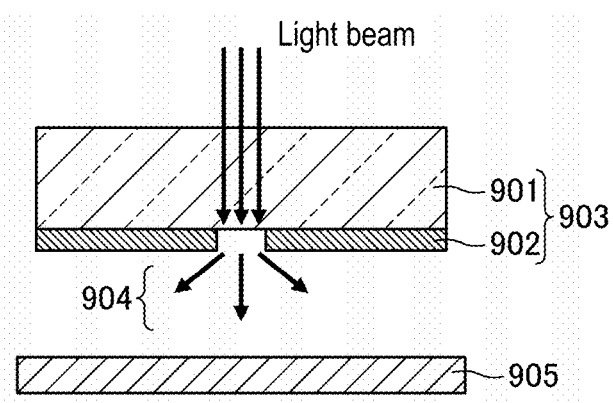
Figure 49:
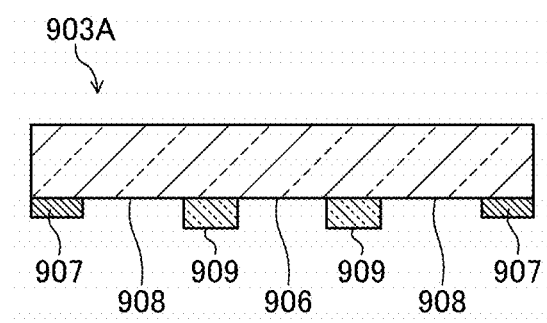

FIG. 45B is a sectional view along line XLVb-XLVb in FIG. 45A;

FIG. 46A is a sectional view of an order of processes indicating a pattern forming method according to a ninth exemplary embodiment;

FIG. 46B is a sectional view of the order of processes indicating the pattern forming method according to the ninth exemplary embodiment;

FIG. 46C is a sectional view of the order of processes indicating the pattern forming method according to the ninth exemplary embodiment;

FIG. 46D is a sectional view of the order of processes indicating the pattern forming method according to the ninth exemplary embodiment;

FIG. 47A is a schematic perspective view illustrating a photomask which is applicable to an exposure device according to a modified example of the ninth exemplary embodiment;

FIG. 47B is a schematic sectional view illustrating an exposure method which uses the photomask which is applicable to an exposure device according to the modified example of the ninth exemplary embodiment;

FIG. 48 is a schematic sectional view for explaining a problem of conventional proximity exposure method or projection transfer exposure of an equal magnification; and FIG. 49 is a sectional view for explaining a conventional proximity exposure mask in which a phase shifter which generates a reverse phase relative to a phase of an auxiliary pattern is provided in a mask opening.

DETAILED DESCRIPTION OF THE PREFERRED EMBODIMENTS

First Exemplary Embodiment

A photomask according to the first exemplary embodiment will be described with reference to the drawings.

Figure 1A:
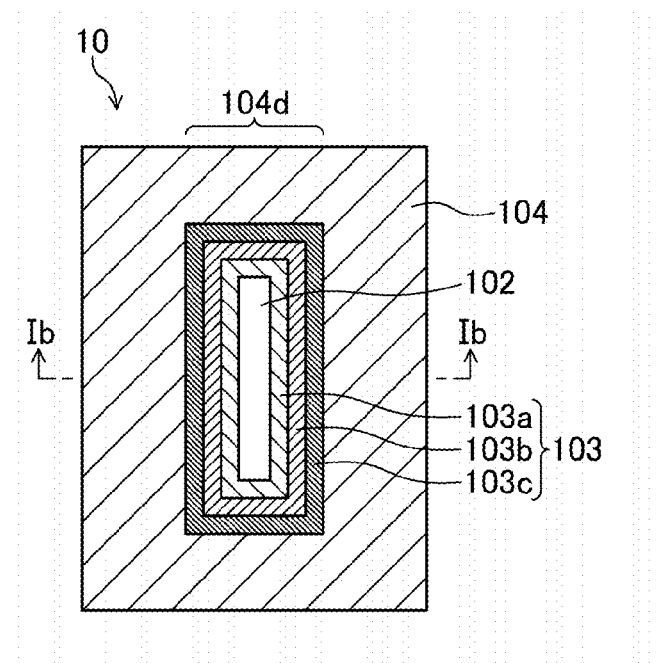
FIG. 1A is a plan view illustrating an example of a photomask according to a first exemplary embodiment.
Figure 1B:
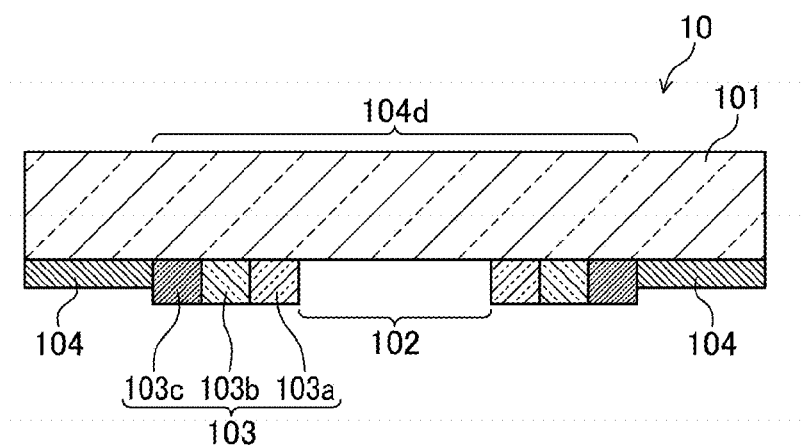
FIG. 1B is a sectional view along line Ib-Ib in FIG. 1A.

FIGS. 1A and 1B illustrate an example of the photomask according to the present exemplary embodiment.

As illustrated in FIG. 1A, photomask 10 according to the present exemplary embodiment includes linear main pattern 102 at a position corresponding to a desired linear transfer pattern. In a periphery of main pattern 102, auxiliary pattern 103 is provided which allows a desired transfer pattern to be formed on an exposure object spaced a predetermined distance apart from photomask 10. Auxiliary pattern 103 has a phase shifter function which can adjust transmission intensities and phases of transmitted light beams. Auxiliary pattern 103 is composed of first phase shifter 103a, second phase shifter 103b and third phase shifter 103c in order from a position closer to main pattern 102. In this regard, advancement of a phase plane of a light beam transmitted through each of phase shifters 103a to 103c increases from first phase shifter 103a to third phase shifter 103c provided at the position spaced apart more from main pattern 102 than first phase shifter 103a. In other words, a phase plane of a light beam transmitted through first phase shifter 103a which is the closest to main pattern 102 is delayed the most. Further, the transmission intensities of phase shifters 103a to 103c become weaker in order from first phase shifter 103a to third phase shifter 103c.

As illustrated in a sectional configuration in FIG. 1B, photomask 10 according to the present exemplary embodiment includes transparent substrate 101 which is made of, for example, glass, quartz or the like and allows exposure light beams to be transmitted, and light shield 104 which is formed on a principal surface of transparent substrate 101 and is formed of a light shielding film made of chrome (Cr) or the like. Light shield 104 is provided with mask pattern opening 104d, and mask pattern opening 104d includes main pattern 102 corresponding to a desired pattern, and auxiliary pattern 103 arranged around main pattern 102.

As described above, auxiliary pattern 103 is formed in mask pattern opening 104d, and includes phase shifters 103a to 103c each formed of a film having optical transmissivity. A surface of photomask 10 provided with light shield 104 will be generally referred to as a principal surface, and a surface opposite to the principal surface will be generally referred to as a back surface. In this regard, a portion of transparent substrate 101 exposed at mask pattern opening 104d composes main pattern 102. In this regard, the transmittance and the phase of a light beam transmitted through each of phase shifters 103a to 103c can be adjusted by optionally adjusting a refractive index and a film thickness of an optically transmissive film which composes each of phase shifters 103a to 103c. In this regard, for the optically transmissive film which composes each of phase shifters 103a to 103c, a resist material or silicon oxide ($SiO_2$) can be used. For example, polymethyl methacrylate (PMMA) can be used for a resist material of high transmissivity. Further, a $SiO_2$ film can be formed by a chemical vapor deposition (CVD) method, a spattering method or a coating method using SOG (spin on glass) or the like. In addition, in each of phase shifters 103a to 103c, a phase of a light beam can be adjusted by changing film thicknesses of phase shifters 103a to 103c. Further, the transmittance of a light beam can be changed by adjusting transparency based on each composition in a case of the resist material, and by doping molybdenum (Mo) in a case of the $SiO_2$ film.

Phase shifters 103a to 103c are composed of three types of films in the present exemplary embodiment, yet may be composed of two types of films, or of four or more types of films. In addition, phase shifters 103a to 103c are formed of three types of individual optically transmissive films in the present exemplary embodiment, yet may be configured in any way as long as phase shifters 103a to 103c have phase shift functions.

Hereinafter, a portion covered by a light shielding material on the principal surface of the photomask will be referred to as a light shield, and a portion which is not covered by the light shielding material will be referred to as a mask pattern opening. In this regard, as to a region where a light shielding material is partially provided and exposure light beams are allowed to be transmitted, the region will be referred to as the mask pattern opening. Further, the transparent substrate will be also referred to simply as glass unless particularly specified. In this regard, the transparent substrate is not limited to glass, and the light shield is not limited to the chrome (Cr) film, either.

Next, an optical image obtained by irradiating a back surface of photomask 10 with light beams will be described with reference to FIGS. 2A and 2B.

Hereinafter, the light beam is assumed to be an exposure light beam which is called an i-ray whose wavelength is 365 nm and which is the most frequently used in lithography. In this regard, some principles related to refraction of light beams are applicable not only to the light beam of the exposure wavelength, but also to an exposure light beam which is called a g-ray whose wavelength is 436 nm, excimer laser beams called krypton fluoride (KrF) and argon fluoride (ArF) whose wavelengths are 248 nm and 193 nm, respectively, and to a light beam whose wavelength is equal to that of the excimer laser beam or less.

Figure 2A:
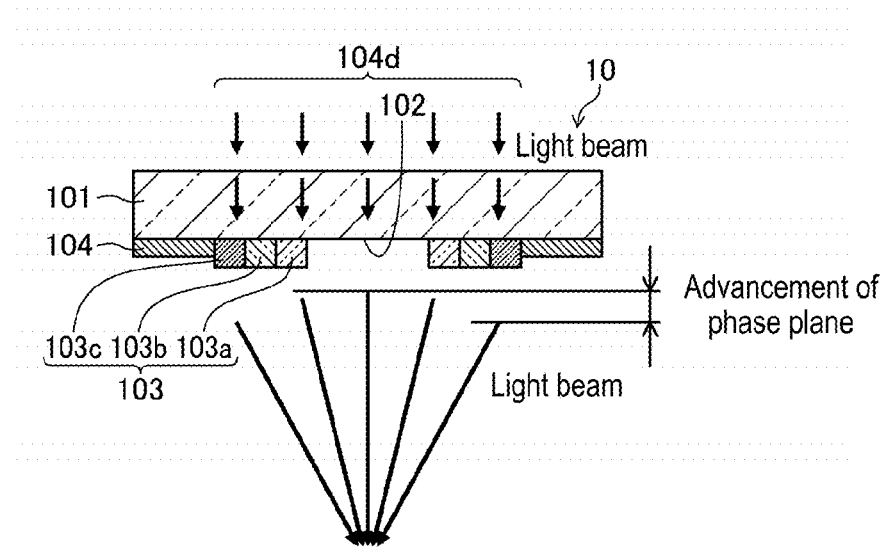
FIG. 2A is a schematic sectional view illustrating how light beams are condensed upon exposure performed with use of the photomask according to the first exemplary embodiment.

First, as illustrated in FIG. 2A, parallel light beams applied on the back surface of photomask 10 according to the present exemplary embodiment toward the surface of a substrate (not illustrated) which is an exposure object are transmitted through an inside of the glass while maintaining the parallel state. However, when the light beams are transmitted through phase shifters 103a to 103c, the phases of the light beams are changed by phase shifters 103a to 103c. As a result, positions of the phase planes of light beams transmitted through phase shifters 103a to 103c are changed with respect to phase planes of light beams transmitted through main pattern 102. In this regard, when the phase planes of light beams transmitted through phase shifters 103a to 103c sequentially advance with increasing distance from main pattern 102, each light beam changes the traveling direction of the phase plane toward a direction of main pattern 102. As a result, at a position spaced a predetermined distance apart from the principal surface of photomask 10, light beams transmitted through photomask 10 form an image of a high contrast having a strong light intensity near the center line of linear main pattern 102.

Figure 2B:
FIG. 2B is a plan view illustrating a pattern formed with the photomask according to the first exemplary embodiment.

As a result, as illustrated in FIG. 2B, when exposure is performed with use of photomask 10, even at a position spaced a predetermined distance apart from the principal surface of photomask 10, an image of an light intensity distribution which can form a linear pattern whose width is 1 µm or less can be clearly formed at a position corresponding to the vicinity of the center line of mask pattern opening 104d of photomask 10.

A reason that the above phenomenon occurs will be described below. A principle by which proximity exposure devised by the inventor of the present invention realizes a resolution equivalent to that obtained by projection transfer exposure will be described with reference to FIGS. 3A and 3B before a specific behavior of a light beam transmitted through the photomask is described.

Figure 3A:
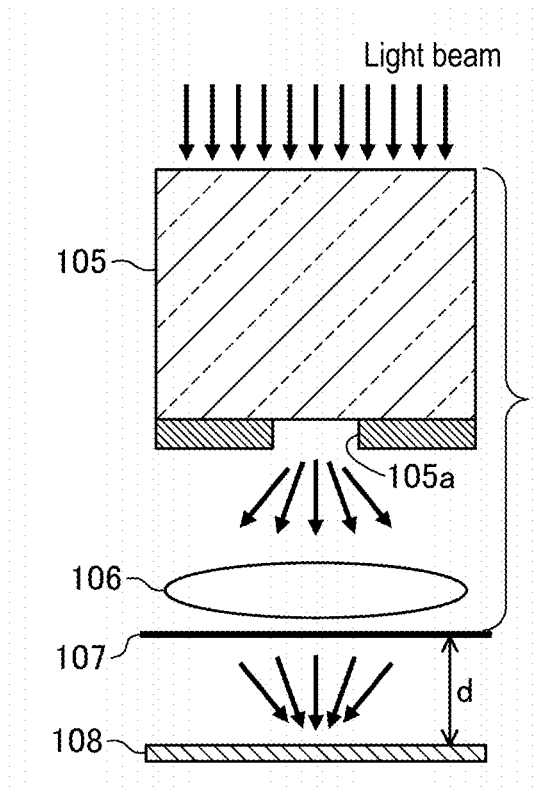
FIG. 3A is a sectional view schematically illustrating a configuration and an operation of a conventional projection transfer exposure method.

FIG. 3A schematically illustrates a configuration and an operation of a projection transfer exposure method. As illustrated in FIG. 3A, the projection transfer exposure method is configured similarly to proximity exposure in that light beams entering the back surface of photomask 105 widen as a result of a diffraction phenomenon when transmitted through the opening of photomask 105. In this regard, lens 106 is provided between exposure object 108 and photomask 105. Therefore, the light beams widened by the diffraction form an image on a projection plane spaced a predetermined distance apart from lens 106. That is, an intensity distribution of light beams transmitted through the opening of a mask surface is reconfigured on an image forming plane by lens 106. In this regard, light beams which are diffracted to such a degree that diffraction angles are large and the light beams cannot be transmitted through lens 106, and evanescent waves do not contribute to this image forming. Therefore, the resolution is almost equal to an exposure wavelength. However, if exposure object 108 is provided on this image forming plane, it is possible to substantially reduce degradation caused by the diffraction, and obtain a very high resolution.

In this regard, a light beam which is transmitted through propagation plane 107 is considered. Propagation plane 107 is provided between lens 106 and the image forming plane on exposure object 108 and at a position spaced a predetermined distance d apart from exposure object 108. The light beam is a wave, and has an amplitude intensity distribution and a phase distribution. On this propagation plane 107, light beams having the same amplitude intensity distribution and phase distribution are supposed to form an image of the same intensity distribution on the same image forming plane, independently of which route the light beam is transmitted through until the light beam reaches propagation plane 107. On the basis of this principle, the inventor of the present invention has found that, as illustrated in FIG. 3B, it is possible to form the same image as that obtained by projection transfer exposure at a position spaced predetermined distance d apart from mask plane 107A by directly providing the same intensity distribution and phase distribution as those of propagation plane 107 to light beams transmitted through photomask 105A.

Figure 3B:
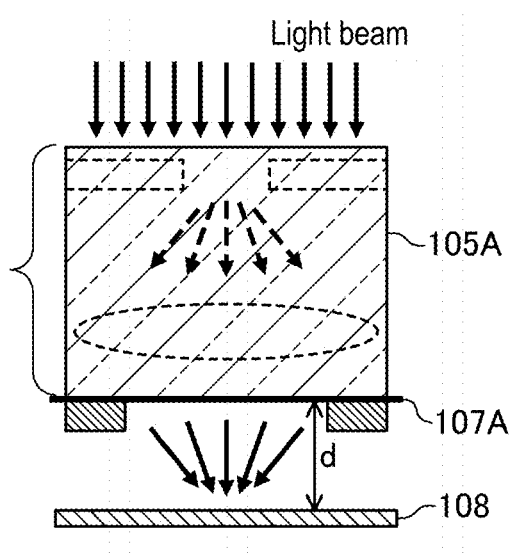
FIG. 3B is a sectional view schematically illustrating an operation principle of the photomask according to the first exemplary embodiment.

FIG. 3B schematically illustrates the above-described principle. In FIG. 3B, photomask 105A is not actually provided with the same opening as that of photomask 105 or same lens 106 illustrated in FIG. 3A. However, it has been devised that the opening of mask plane 107A is largely widened, and the opening is provided with a phase shifter which has such a phase shift function and a transmittance that reproduce, when light beams are transmitted through the opening, an amplitude intensity distribution and a phase distribution of light beams on the propagation plane in FIG. 3A. When the phase shifter according to the present exemplary embodiment is provided as illustrated in FIG. 3B, it is possible to form the same image as a projection image transferred to exposure object 108 by projection transfer exposure in FIG. 3A, on exposure object 108 even by proximity exposure.

The amplitude intensity distribution and the phase distribution of light beams on propagation plane 107 will be described with reference to FIGS. 4A to 4E.

Figure 4A:
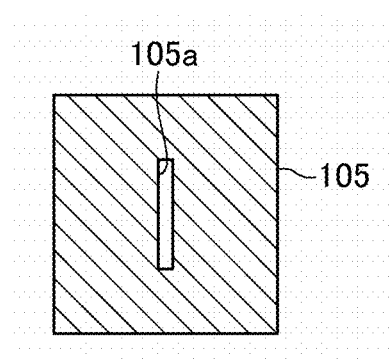
FIG. 4A is a plan view illustrating a conventional photomask for projection transfer exposure.
Figure 4B:
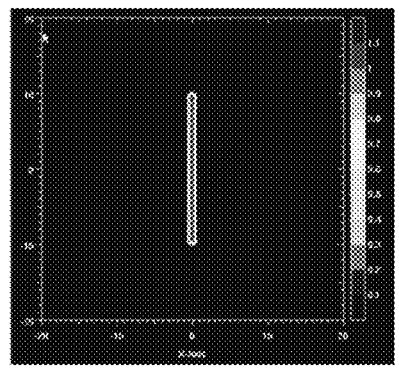
FIG. 4B is a view illustrating a transfer image (light intensity distribution) formed upon simulation with use of the conventional photomask for the projection transfer exposure.

FIG. 4A illustrates photomask 105 for projection transfer exposure, and a linear pattern whose width is 1 µm is drawn as mask opening 105a on photomask 105. An example where exposure is performed with use of this photomask 105 will be described. In this regard, an exposure light beam whose wavelength is 365 nm is used. FIG. 4B illustrates a light intensity distribution which is realized by projection transfer exposure and is a simulation result of a transfer image on exposure object 108. As illustrated, when a linear pattern has a width of 1 µm, it is possible to obtain a sufficient contrast by projection transfer exposure.

Figure 4C:
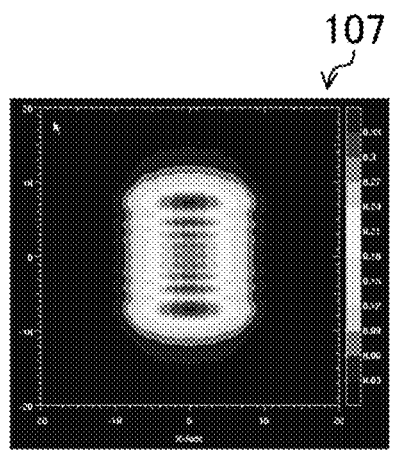
FIG. 4C is a view illustrating a simulation result of a propagation plane between a lens (convex lens) and an exposure object formed with use of the conventional photomask for the projection transfer exposure, and an amplitude intensity distribution of light beams.
Figure 4D:
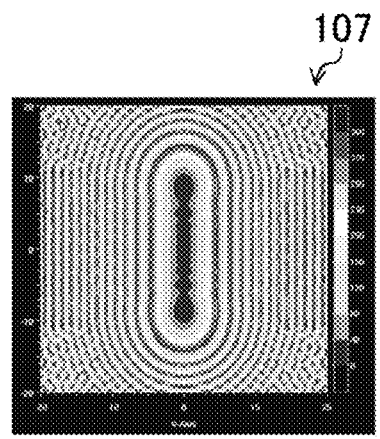
FIG. 4D is a view illustrating a simulation result of the propagation plane between the lens (convex lens) and the exposure object formed by the conventional photomask for the projection transfer exposure, and a phase distribution of light beams.

FIGS. 4C and 4D illustrate an amplitude intensity distribution and a phase distribution of light beams on propagation plane 107, respectively. Propagation plane 107 is provided between lens 106 and exposure object 108 and at a position spaced 30 µm apart from exposure object 108. That is, light beams having these amplitude intensity distribution and phase distribution on propagation plane 107 propagate 30 µm and are condensed into the transfer image illustrated in FIG. 4B and corresponding to mask opening 105a illustrated in FIG. 4A.

Figure 4E:
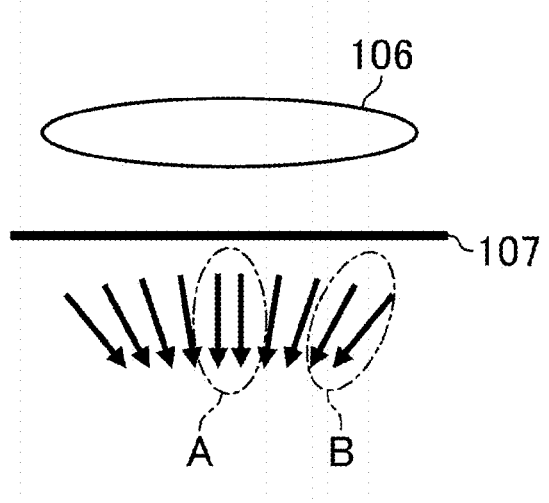
FIG. 4E is a conceptual diagram for realizing the operation principle of the present disclosure.

As described above, it is found that the light beams on propagation plane 107 are distributed in a wider region than a region at photomask 105 and a region corresponding to the transfer image, and are condensed on exposure object 108 while propagating 30 µm. That is, light beams propagating through a position corresponding to mask opening 105a on propagation plane 107 travel straightforward and form an image at a position corresponding to mask opening 105a. Meanwhile, light beams propagating in peripheral regions of the position corresponding to mask opening 105a travel toward a position corresponding to a center portion of mask opening 105a. This means that, as illustrated in FIG. 4E, a phase plane of a wave traveling in region B corresponding to the peripheral region of mask opening 105a advances more compared to a phase plane of a wave traveling in region A corresponding to the center portion of mask opening 105a.

Figure 5A:
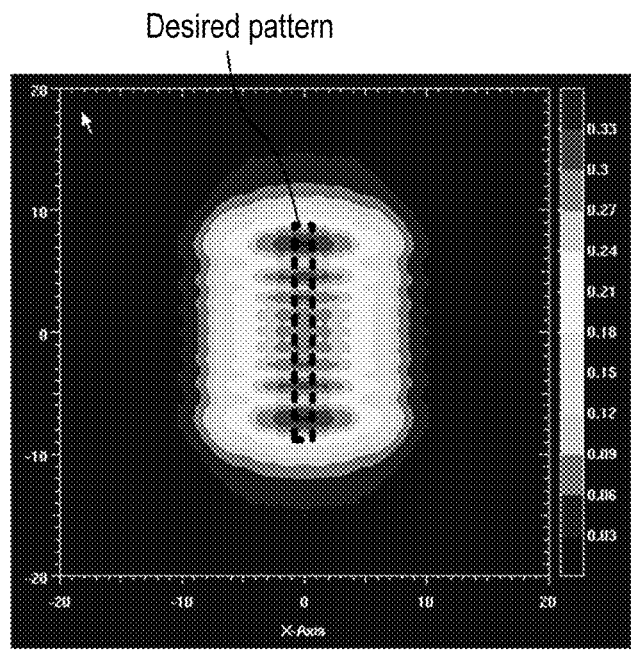
FIG. 5A is a view for explaining a method of realizing the principle of the present disclosure with use of the photomask in detail, and is a view illustrating an amplitude intensity distribution (transmittance distribution) of light beams.
Figure 5B:
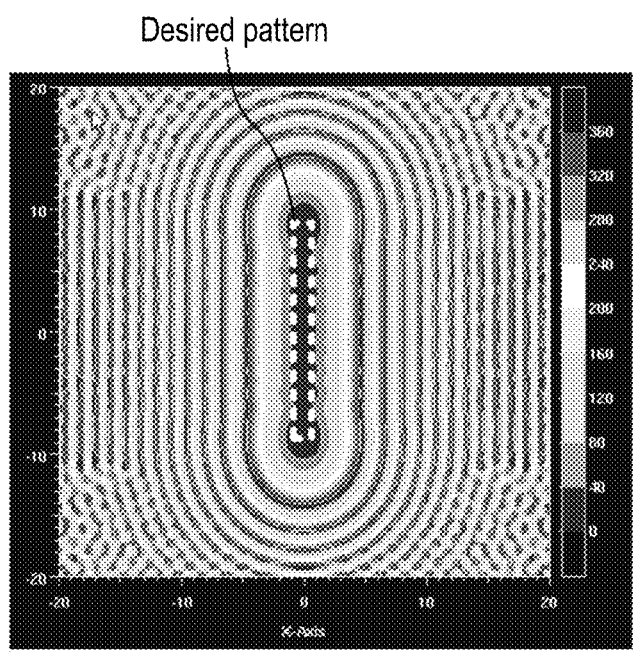
FIG. 5B is a view illustrating a phase distribution of light beams.

The amplitude intensity distribution (transmittance distribution) and the phase distribution of light beams on propagation plane 107 in the above situation will be described in detail with reference to FIGS. 5A and 5B. FIGS. 5A and 5B illustrate the enlarged amplitude intensity distribution and phase distribution of the light beams on propagation plane 107 in FIGS. 4C and 4D.

First, the phase distribution illustrated in FIG. 5B will be focused upon. FIG. 5B illustrates a desired pattern, i.e., a figure corresponding to mask opening 105a. As can be seen from FIG. 5B, compared to a phase of a light beam in the region corresponding to the desired pattern, a value of the phase at a position spaced apart from a center position of the region corresponding to the desired pattern increases, i.e., the phase plane advances more, with increasing distance from the center position. In this regard, the phase has cycles of 360°, and therefore a phase value of a light beam increases from 0° at the region corresponding to the desired pattern toward 360° with increasing distance from the center position. In the illustration, when the distance the center position further increases, the phase value returns to 0° and increases toward 360° again. This second phase value takes the same value as 720°=360°+360°.

As described above, essential points of the present exemplary embodiment will be described again with reference to FIG. 1A. Compared to a phase plane of a light beam transmitted through the region corresponding to the desired pattern, a phase plane of a light beam transmitted through a periphery of the region corresponding to the desired pattern is preferably configured to advance more in the traveling direction with increasing distance from the center of the region corresponding to the desired pattern. Particularly when a desired pattern is linear, phases in phase shifters provided in a periphery of the desired pattern are preferably configured to make a pair of the same phases symmetrically with respect to the center line of the desired pattern line. Thus, light beams are condensed on the center line of the line pattern.

To realize the configuration, linear main pattern 102 is provided in the region corresponding to a desired linear transfer pattern in photomask 10 illustrated in FIG. 1A. A plurality of phase shifters 103a to 103c including linear first phase shifter 103a, second phase shifter 103b and third phase shifter 103c are provided in the periphery of main pattern 102. Phase shifters 103a to 103c include phase shifters which generate different phases with respect to a light beam transmitted through main pattern 102. For example, phase shifters 103a to 103c preferably include phase shifters which generate two types of different phases with respect to a light beam transmitted through main pattern 102. Further, as to first phase shifter 103a provided at a position close to main pattern 102 and second phase shifter 103b provided at a position farther from main pattern 102 than first phase shifter 103a, phases of light beams transmitted through second phase shifter 103b preferably advance more compared to phases of light beams transmitted through first phase shifter 103a.

Furthermore, third phase shifter 103c is preferably provided at a position farther from main pattern 102 than second phase shifter 103b. Preferably, the phase plane of light beams transmitted through each of phase shifters 103a to 103c advances in the traveling direction from a position close to main pattern 102 to a far position in order of first phase shifter 103a, second phase shifter 103b and third phase shifter 103c, to more precisely condense the light beams into a transfer image.

Next, an amplitude intensity distribution of light beams illustrated in FIG. 5A will be described. In this regard, a figure corresponding to a desired pattern overlaps the amplitude intensity distribution in FIG. 5A. As illustrated in FIG. 5A, amplitude intensities are distributed to widely spread to a periphery of the desired pattern. In the periphery of the desired pattern, the intensity tends to lower with increasing distance from the desired pattern. As described above, by lowering transmittances of phase shifters 103a to 103c of photomask 10 illustrated in FIG. 1A from first phase shifter 103a to third phase shifter 103c, i.e., from a position close to main pattern 102 to a far position in order, it is possible to realize an amplitude intensity distribution of light beams on a propagation plane.

In addition, a region which is spaced apart from the desired pattern and whose transmission intensity of a light beam is substantially 0 illustrated in FIG. 5A does not need a phase distribution of the phase distribution illustrated in FIG. 5B in a region corresponding to the region in FIG. 5A.

A case where a desired pattern is a simple line pattern has been described above. However, the above features on the propagation plane are the same even in a case of a general two-dimensional layout.

Figure 6A:
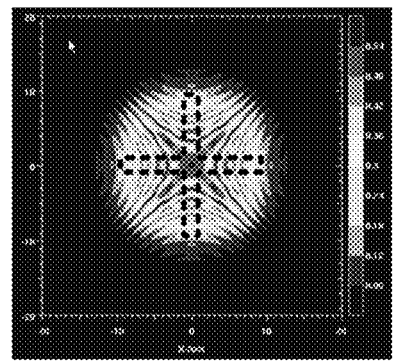
FIG. 6A is a view for explaining with use of an example of a two-dimensional pattern the concept for realizing the principle of the present disclosure with use of the photomask, and is a view illustrating a simulation result of an amplitude intensity distribution (transmittance distribution) of light beams.
Figure 6B:
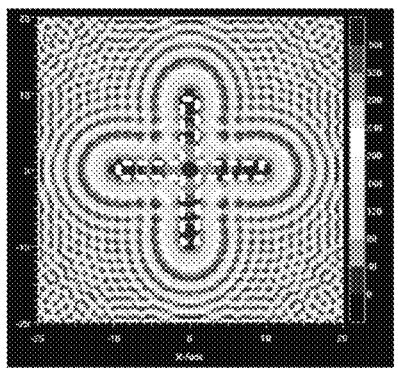
FIG. 6B is a view for explaining with use of an example of a two-dimensional pattern the concept for realizing the principle of the present disclosure with use of the photomask, and is a view illustrating a simulation result of a phase distribution of light beams.
Figure 6C:
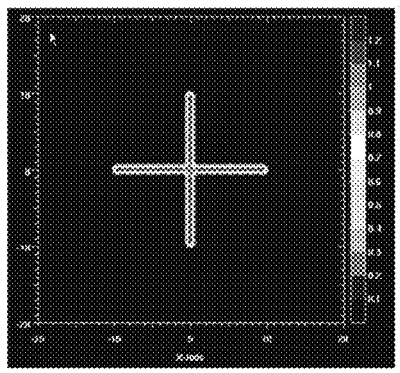
FIG. 6C is a view for explaining with use of an example of a two-dimensional pattern the concept for realizing the principle of the present disclosure with use of the photomask, and is a view illustrating a simulation result of a formed transfer image.

FIGS. 6A and 6B illustrate an amplitude intensity distribution and a phase distribution, respectively, of light beams on a propagation plane when a desired pattern is a cross pattern. FIG. 6C illustrates a transfer image. In this regard, FIGS. 6A and 6B correspond to FIGS. 5A and 5B, respectively. Further, a figure representing a desired cross pattern is overlapped and illustrated in FIGS. 6A and 6B. Also in this case, as can be seen from FIG. 6B, compared to a phase of a light beam in a region corresponding to the desired pattern, a value of the phase increases, i.e., the phase plane advances more with increasing distance from a center position of the region corresponding to the desired pattern. In the periphery of the desired pattern, an amplitude intensity illustrated in FIG. 6A tends to lower with increasing distance from the desired pattern.

Thus, by providing a plurality of phase shifters 103a to 103c which compose auxiliary pattern 103 in a periphery of a region corresponding to a desired pattern in photomask 10 according to the present exemplary embodiment, and directly generating on photomask 10 used for proximity exposure a propagation wave used upon projection transfer exposure, it is possible to form a transfer image on which a fine pattern can be formed, on an exposure object.

In addition, a region whose amplitude intensity is sufficiently low in the amplitude intensity distribution of light beams may be used as a light shield in a mask layout. The propagation wave has a phase distribution even in a region whose amplitude intensity is very low. In this regard, the region whose amplitude intensity is very low does not contribute to a transfer image.

Figure 7A:
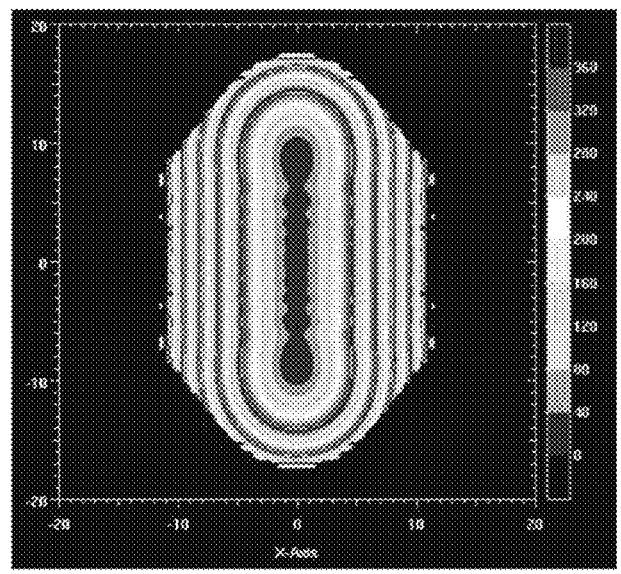
FIG. 7A is a view illustrating an example where the principle of the present disclosure is realized with use of the photomask, and is a view illustrating a simulation result of a one-dimensional pattern obtained by correcting a phase distribution of light beams with reference to an amplitude intensity distribution.
Figure 7B:
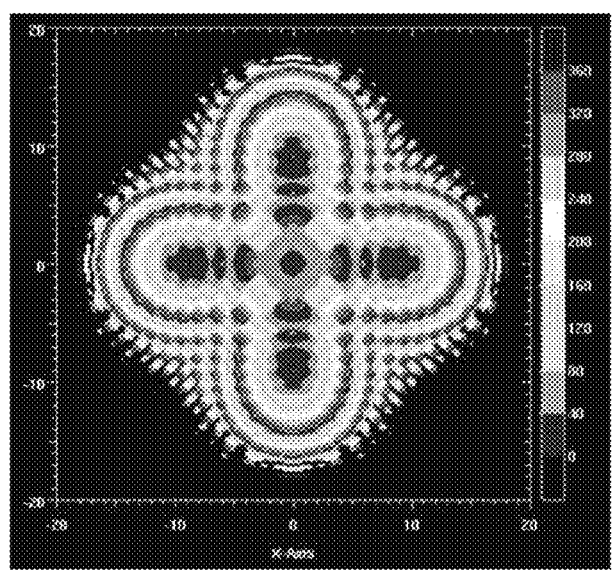
FIG. 7B is a view illustrating a simulation result of a two-dimensional pattern obtained by correcting a phase distribution of light beams with reference to an amplitude intensity distribution.

Hence, FIGS. 7A and 7B illustrate phase distributions obtained by remaking phase distributions of necessary light beams by taking into account intensities in the amplitude intensity distributions of light beams in FIGS. 5A to 6B. FIG. 7A illustrates a significant phase distribution which is deformed for the line pattern in FIG. 5B, and FIG. 7B illustrates a significant phase distribution which is deformed for the cross pattern in FIG. 6B.

Thus, it can be understood that light shield 104 is preferably provided in an outer circumference including main pattern 102 and phase shifters 103a to 103c, too, in the configuration according to the present exemplary embodiment.

By the way, to reproduce phase distributions on the propagation plane of light beams illustrated in FIGS. 5B and 6B with use of the photomask, ideally speaking, phase shifters which continuously change phase planes of light beams are preferably provided. However, these phases may be approximated to some discrete values, and phase shifters that generate phase planes corresponding to the respective discrete values may be provided. Discretization is performed by, for example, setting the phase of the main pattern to 0°, and setting phases of light beams in the phase shifters as indicated in [Table 1].

TABLE 1

| Phase in propagation plane | Phase of phase shifter |
| --- | --- |
| 0° or more and less than 90° | 0° ± 360° × n |
| 90° or more and less than 270° | 180° ± 360° × n |
| 270° or more and less than 360° | 0° ± 360° × n |

In this regard, "phase of phase shifter" refers to a value indicating how much a phase plane of an exposure light beam transmitted through the phase shifter advances more compared to a phase plane of an exposure light beam transmitted through the main pattern. There is a phase shifter which has the same phase as that of the main pattern among the phase shifters. A phase of a light beam has cycles of 360°, and therefore phases having a difference of any integer multiple of 360° can be regarded as the same phase. Hence, "±360°×n" (n is any integer including 0) is added to indications of phases of the phase shifter.

TABLE 2

| Phase in propagation plane | Phase of phase shifter |
|---|---|
| 0° or more and less than 60° | 0° ± 360° × n |
| 60° or more and less than 180° | 120° ± 360° × n |
| 180° or more and less than 300° | 240° ± 360° × n |
| 300° or more and less than 360° | 0° ± 360° × n |

That is, in an example of [Table 2], three types of phase shifters of 0°, 120° and 240° may be cyclically provided in order of 0°, 120°, 240°, 0°, 120° and 240° sequentially from the phase shifter close to the main pattern. In this case, the phase shifter of 0° is positioned farther from the main pattern than the phase shifter of 240°. Therefore, the phase of the phase shifter positioned farther from the main pattern appears to be delayed. However, there is formed a phase distribution equivalent to a phase distribution of a case where types of the phase shifters are set to 0°, 120°, 240°, 360°, 480° and 600° in which the phase increases in order from the phase shifter closer to the main pattern, that is, in order of 0°, 120°, 240°, 360°, 480° and 600°.

TABLE 3

| Phase in propagation plane | Phase of phase shifter |
|---|---|
| 0° or more and less than 45° | 0° ± 360° × n |
| 45° or more and less than 135° | 90° ± 360° × n |
| 135° or more and less than 225° | 180° ± 360° × n |
| 225° or more and less than 315° | 270° ± 360° × n |
| 315° or more and less than 360° | 0° ± 360° × n |

That is, in an example of [Table 3], four types of phase shifters of 0°, 90°, 180° and 270° may be cyclically provided in order of 0°, 90°, 180°, 270°, 0°, 90°, 180° and 270° sequentially from the phase shifter closer to the main pattern.

As in this example, light waves of greater kinds of phases are preferably condensed to form a pattern image of a higher resolution. As described above, when phase shifters which correspond to phase cycles are provided, two or more types of auxiliary patterns of the same phase are preferably provided on each side of the periphery of the main pattern.

Figure 8A:
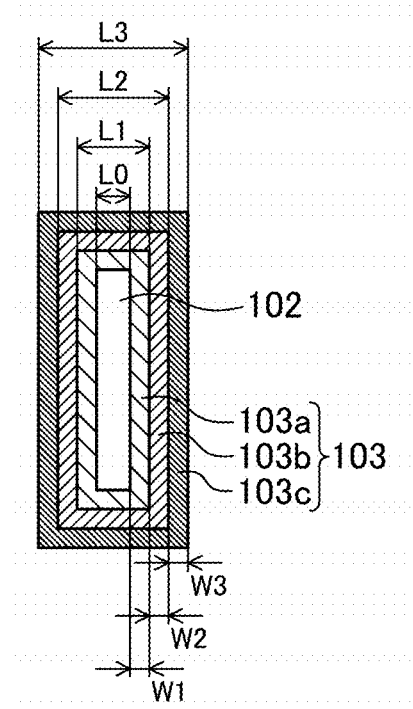
FIG. 8A is a plan view illustrating a result obtained by simulating an influence which discretization of phase shifters has on an image of an exposure object, and defining a dimension of each portion in a mask pattern opening in the photomask.

FIGS. 8A to 8E illustrate results obtained by simulating influences which discretization of phase shifters has on an image on an exposure object. More specifically, as illustrated in FIG. 8A, a line width of main pattern 102 is L0, and entire (outer) widths of linear phase shifters 103a to 103c including main pattern 102 are L1, L2 and L3, respectively, from the inner side. Further, widths (also referred to single widths) of phase shifters 103a to 103c are W1, W2 and W3, respectively.

With phase of main pattern 102 set to 0°, a comparison will be made among four cases regarding a number of phases provided in addition to the phase of main pattern 102, that is, four cases where (1) one type of reverse phase of 180° is used, (2) two types of 120° and 240° are used, (3) three types of 90°, 180° and 270° are used, and (4) continuously distributed phases are used.

[Table 4] to [Table 6] listed below indicate width L0 of the main pattern, phases of respective phase shifters and outer widths and single widths of respective phase shifters in the cases of (1) to (3). In all cases, the outer width of the phase shifter provided at an outermost circumference is uniformly 20 μm. For example, in [Table 4], the outer width in lowermost field of "L4" is set to 20 μm. Phases of light beams are discretized to equalize the difference between the respective phases including the phase of the main pattern. It goes without saying that this discretization performed to provide the equal difference is preferable. However, discretization does not necessarily need to be performed to produce an equal difference.

TABLE 4

| Outer width | Phase [°] | Outer width [μm] | Single width [μm] |
|---|---|---|---|
| L0 | 0 | 5.31 | 5.31 |
| L1 | 180 | 10.31 | 2.5 |
| L2 | 0 | 14.69 | 2.19 |
| L3 | 180 | 19.06 | 2.185 |
| L4 | 0 | 20 | — |

TABLE 5

| Outer width | Phase [°] | Outer width [μm] | Single width [μm] |
|---|---|---|---|
| L0 | 0 | 3.44 | 3.44 |
| L1 | 120 | 7.81 | 2.185 |
| L2 | 240 | 10.94 | 1.565 |
| L3 | 0 | 14.06 | 1.56 |
| L4 | 120 | 16.56 | 1.25 |
| L5 | 240 | 19.06 | 1.25 |
| L6 | 0 | 20 | 0.47 |

TABLE 6

| Outer width | Phase [°] | Outer width [μm] | Single width [μm] |
|---|---|---|---|
| L0 | 0 | 2.81 | 2.81 |
| L1 | 90 | 6.56 | 1.875 |
| L2 | 180 | 9.06 | 1.25 |
| L3 | 270 | 11.56 | 1.25 |
| L4 | 0 | 14.06 | 1.25 |
| L5 | 90 | 15.31 | 0.625 |
| L6 | 180 | 17.81 | 1.25 |
| L7 | 270 | 19.06 | 0.625 |
| L8 | 0 | 20 | — |

TABLE 7

| Discretization factor | Peak value of light intensity |
|---|---|
| 0, 180° | 5.1 |
| 0, 120, 240° | 1.02 |
| 0, 90, 180, 270° | 11.8 |
| Continuous | 13.0 |

Figure 8B:
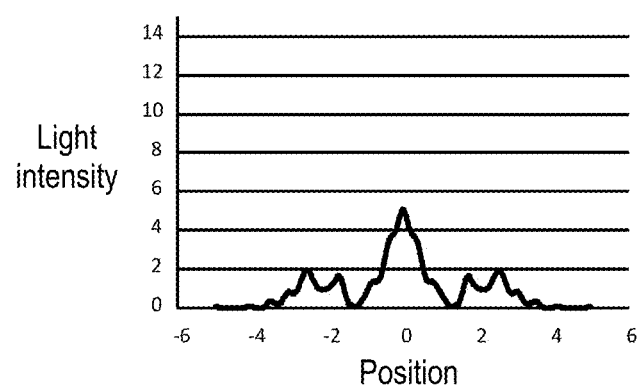
FIG. 8B is a view illustrating a result obtained by simulating an influence which discretization of the phase shifters has on an image of an exposure object, and illustrating a result obtained by binarizing the phase shifters.
Figure 8C:
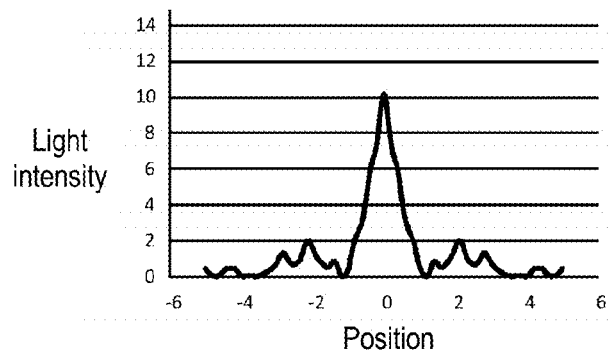
FIG. 8C is a view illustrating a result obtained by simulating an influence which discretization of the phase shifters has on an image of an exposure object, and illustrating a result obtained by ternarizing the phase shifters.
Figure 8D:
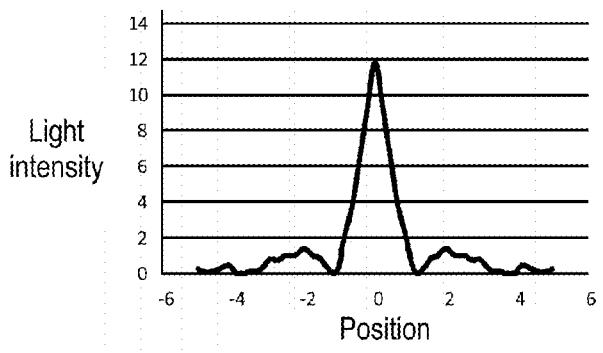
FIG. 8D is a view illustrating a result obtained by simulating an influence which discretization of the phase shifters has on an image of an exposure object, and illustrating a result obtained by quaternarizing the phase shifters.
Figure 8E:
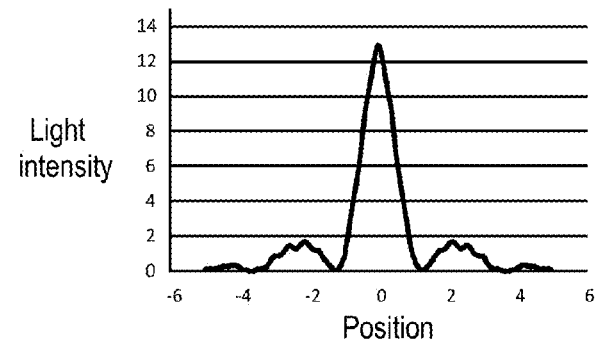
FIG. 8E is a view illustrating a result obtained by simulating an influence which discretization of the phase shifters has on an image of an exposure object, and illustrating a result obtained by continuously changing the phase shifters.

FIGS. 8B and 8E illustrate light intensity profiles obtained by discretizing phases by the phase shifters and a profile of light intensity distribution in a case where it is assumed that phase shifters which reproduce phase distributions on the propagation plane can continuously produce changes in phases. FIGS. 8B to 8D correspond to [Table 4] to [Table 6]. Further, a peak value of the profile of the light intensity distribution upon each discretization is indicated in [Table 7]. As illustrated in FIG. 8B, a peak of a light intensity obtained by discretizing phases to two types of phases of 0° and 180° does not reach even half of a peak value obtained when phases are continuously distributed as illustrated in FIG. 8E. However, as illustrated in FIG. 8C, when phases are discretized to three types of phases and a discretization range is reduced to 120°, a peak of the light intensity reaches almost 80%. Further, as illustrated in FIG. 8D, when phases are discretized to four types of phases and a discretization range is reduced to 90°, a peak of the light intensity reaches 90% or more.

As described above, the phase difference between adjacent phase shifters is desirably reduced to 120° by discretization to obtain a substantial effect, and is more preferably reduced to 90° to sufficiently obtain an ideal effect. That is, it is preferable to provide an auxiliary pattern which realizes phase shift into two phases different from the phase of the main pattern, i.e., an auxiliary pattern with which phases are discretized into three phases. Naturally, it is more preferable to provide an auxiliary pattern which realizes phase shift into three or more phases different from the phase of the main pattern.

Further, the feature of a phase distribution on a propagation plane of a light beam is that not only a phase plane advances more but also a distance of a cycle of 360° becomes short with increasing distance from the main pattern. It is assumed in terms of the principle that a period length of a phase cycle of an n-th phase from a desired pattern can be approximately expressed as $\sqrt{(2 \times n \times G \times \lambda)} - \sqrt{(2 \times (n-1) \times G \times \lambda)}$, when a distance from a desired pattern is represented as r, a distance between a propagation plane and an image forming plane is represented as G and a dimension of an exposure wavelength is represented as λ. This is estimated based on the same idea as that of the principle which takes into account a period distribution of a phase distribution of light beams passing through a pinhole. Hence, when discretized phase shifters are provided, a width (single width) of a phase shifter provided at a position far from the main pattern is preferably smaller than a width (single width) of a phase shifter provided at a position close to the main pattern. In particular, in a case of phase shifters of the same phase, the width of a phase shifter provided at a position far from the main pattern is narrower than the width of a phase shifter provided at a position close to the main pattern. In the case of the phase shifters of the same phase, the width of a phase shifter provided at an n-th position from the main pattern is preferably $\sqrt{((n-1)/n)}$ of the width of a phase shifter provided at a (n−1)th position adjacent to an inner side of the n-th phase shifter. More specifically, a second or subsequent auxiliary pattern from the main pattern preferably includes a phase shifter having a $1/\sqrt{2}$-fold width or less, i.e., an about 0.71-fold width or less of the width of the auxiliary pattern provided the most closely to the main pattern.

In a case of the specific configuration illustrated in FIG. 1A, the width (single width) of second phase shifter 103b is preferably smaller than the width (single width) of first phase shifter 103a. Such a relationship between widths (singles widths) of phase shifters is applicable not only between phase shifters which generate the same phase by discretization, but also between phase shifters which generate different phases. This is obvious in view of [Table 4] to [Table 6] even though there is an exception. Further, as is clear from [Table 4] to [Table 6], the width of the phase shifter corresponding to the discretized phase is wider than at least the width of an exposure wavelength. Normally, a desired pattern is not formed at the auxiliary pattern formation position and therefore, a pattern of a smaller dimension than that of the exposure wavelength is used as the auxiliary pattern. In this regard, the auxiliary pattern according to the present exemplary embodiment is preferably an auxiliary pattern which includes a translucent portion larger than an exposure wavelength to form a predetermined phase distribution.

Figure 9:
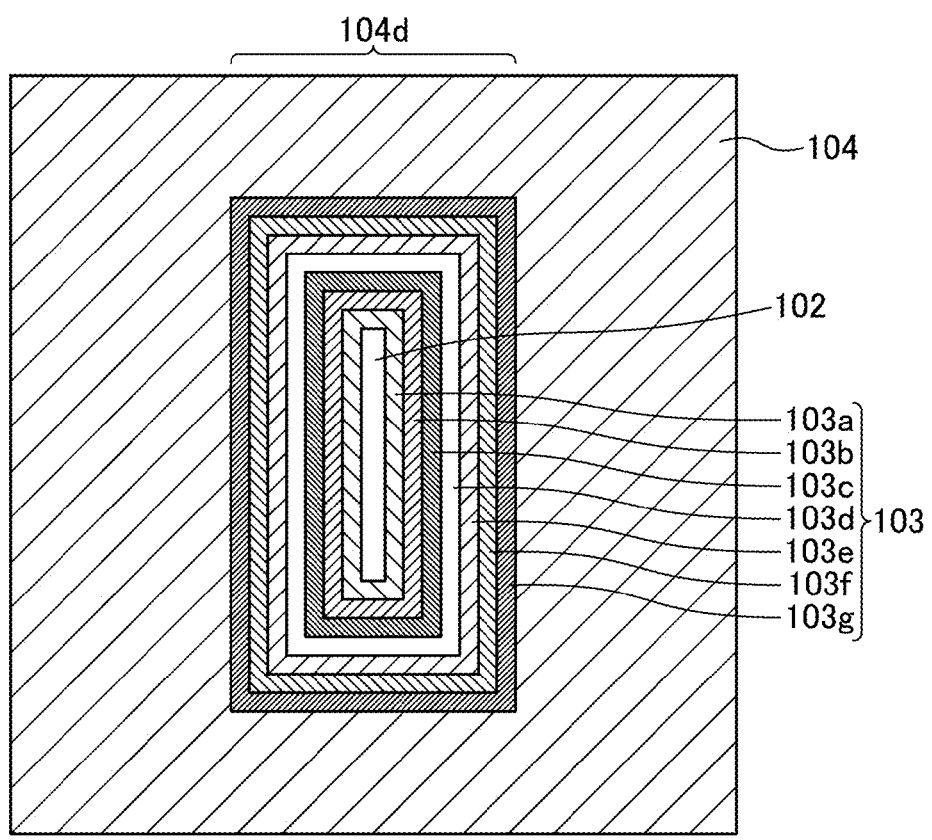
FIG. 9 is a plan view illustrating another example of the photomask according to the first exemplary embodiment.

FIG. 9 illustrates an example of a mask layout which corresponds to above [Table 6] and is used to discretize phases to 0°, 90°, 180° and 270°. The phase of main pattern 102 is 0°, and phase shifters which compose auxiliary pattern 103 are first phase shifter 103a, second phase shifter 103b, third phase shifter 103c, fourth phase shifter 103d, fifth phase shifter 103e, sixth phase shifter 103f and seventh phase shifter 103g in order from a phase shifter close to main pattern 102. The phase plane of a light beam transmitted through each of phase shifters 103a to 103g is configured to advance to 90°, 180°, 270°, 0°, 90°, 180° and 270° in order from first phase shifter 103a compared to the phase plane of a light beam transmitted through main pattern 102.

The layout configuration to reproduce a phase distribution on a propagation plane of a light beam has been described as the feature of the mask layout according to the first exemplary embodiment. Meanwhile, the feature of the amplitude intensity distribution can be reproduced by changing the transmittance of each phase shifter. Further, the feature of the amplitude intensity distribution can be realized by not only changing the transmittance of each phase shifter but also changing the mask layout configuration.

An exemplary embodiment where a configuration of this mask layout is changed will be described below as modified example 1.

Modified Example 1 of First Exemplary Embodiment

A photomask according to modified example 1 of the first exemplary embodiment will be described with reference to FIGS. 10A and 10B.

Figure 10A:
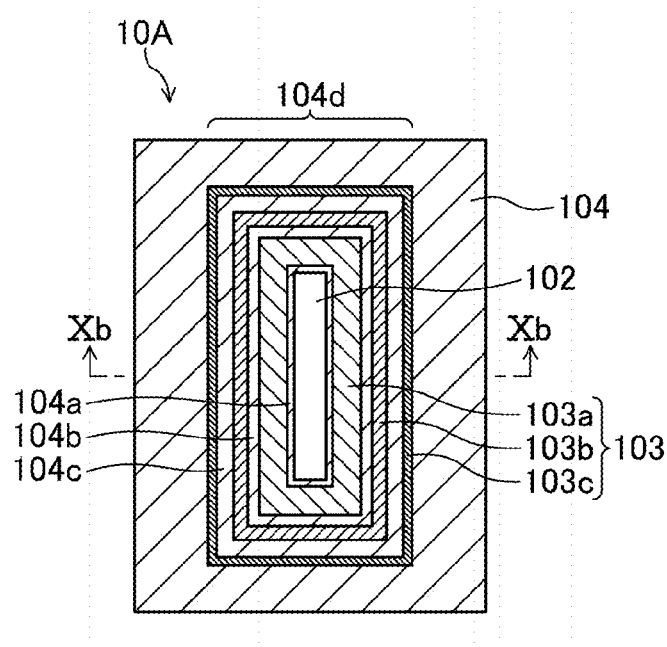
FIG. 10A is a plan view illustrating a photomask according to modified example 1 of the first exemplary embodiment.
Figure 10B:
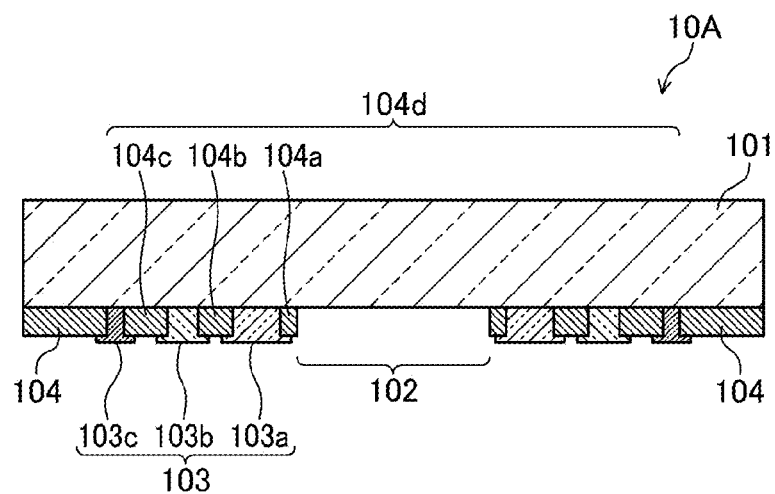
FIG. 10B is a sectional view along line Xb-Xb in FIG. 10A.

As illustrated in FIG. 10A, photomask 10A according to the present modified example includes linear main pattern 102 at a center portion of mask pattern opening 104d and at a position corresponding to a desired transfer pattern. Similarly to the first exemplary embodiment, auxiliary pattern 103 which is a phase shifter which forms a desired transfer pattern on an exposure object spaced a predetermined distance apart from photomask 10A is provided in a periphery of main pattern 102.

In the present modified example, to obtain a photomask which can reproduce by proximity exposure an amplitude intensity distribution and a phase distribution of light beams on a propagation plane between a lens and an exposure object used for projection transfer exposure, light shields 104a to 104c are provided to auxiliary pattern 103, i.e., on respective sides of phase shifters 103a to 103c. More specifically, by providing light shields 104a to 104c to auxiliary pattern 103, necessary phases corresponding to a distance from main pattern 102 are set to phases in phase shifters 103a to 103c. In addition, with increasing distance from main pattern 102, the intensity of a transmitted light beam can be lowered by sequentially widening widths of light shields 104a to 104c on respective sides of phase shifters 103a to 103c by reduced amounts of line widths (single widths) of phase shifters 103a to 103c. That is, by reducing the line widths of phase shifters 103a to 103c with increasing distance from main pattern 102, it is possible to reproduce an amplitude intensity distribution of light beams on the propagation plane even when transmittances of phase shifters 103a to 103c cannot be individually changed.

A layout of photomask 10A illustrated in FIG. 10A will be described in more detail.

Photomask 10A according to the present modified example includes main pattern 102 provided in a region corresponding to a desired transfer pattern in mask pattern opening 104d. A periphery of main pattern 102 is provided with auxiliary pattern 103 including linear first phase shifter 103a, second phase shifter 103b and third phase shifter 103c in order from a main pattern 102 side. Auxiliary pattern 103 includes phase shifters which generate different phases with respect to light beams transmitted through main pattern 102. Further, similarly to the first exemplary embodiment, phase shifters which generate at least two different types of phases with respect to light beams transmitted through main pattern 102 are preferably included.

Furthermore, similarly to the first exemplary embodiment, as to first phase shifter 103a provided at a position close to main pattern 102 and second phase shifter 103b provided at a position farther from main pattern 102 than first phase shifter 103a, phases of light beams transmitted through second phase shifter 103b preferably advance more compared to phases of light beams transmitted through first phase shifter 103a. Light shield 104b is provided between first phase shifter 103a and second phase shifter 103b, and a width of second phase shifter 103b is preferably narrower than a width of first phase shifter 103a. Further, third phase shifter 103c is provided at a position farther from main pattern 102 than second phase shifter 103b. Phase planes of light beams transmitted through phase shifters 103a to 103c advance more in order of third phase shifter 103c, second phase shifter 103b and first phase shifter 103a. It goes without saying that light shield 104c is provided between second phase shifter 103b and third phase shifter 103c, too, and a width of third phase shifter 103c is preferably narrower than the width of second phase shifter 103b to precisely form a desired image.

As illustrated next in FIG. 10B which illustrates an example of a sectional structure, a pattern which composes light shields 104 and 104a to 104c of light shielding films made of chrome (Cr) or the like is drawn on a principal surface of transparent substrate 101 made of, for example, glass, quartz or the like in photomask 10A according to the present modified example. At portions of mask pattern opening 104d which correspond to auxiliary pattern 103 and are not covered by a light shielding film, phase shifters 103a to 103c are formed to cover exposed portions at which transparent substrate 101 is exposed.

In addition, phase shifters 103a to 103c are formed to cover part of surfaces of light shields 104 and 104a to 104c. Further, phase shifters 103a to 103c can adjust the intensities of light beams transmitted through phase shifters 103a to 103c based on opening widths of light shields 104 and 104a to 104c. Only phase shift of light beams needs to be taken into account for phase shifters 103a to 103c and a balance between the transmittance and the phase shift amount does not need to be kept. Consequently, selection conditions of phase shifters 103a to 103c are relaxed, so that it is possible to easily make photomask 10A. Further, the widths of light shields 104 and 104a to 104c serve as tolerances of a dimension error of processing dimensions of phase shifters 103a to 103c produced upon formation of films which compose phase shifters 103a to 103c. Consequently, it is possible to easily process the films.

Modified Example 2 of First Exemplary Embodiment

A more preferable mask layout configuration where isolated phase shifters are provided to light shields will be described below as modified example 2 with reference to FIG. 11A.

Figure 11A:
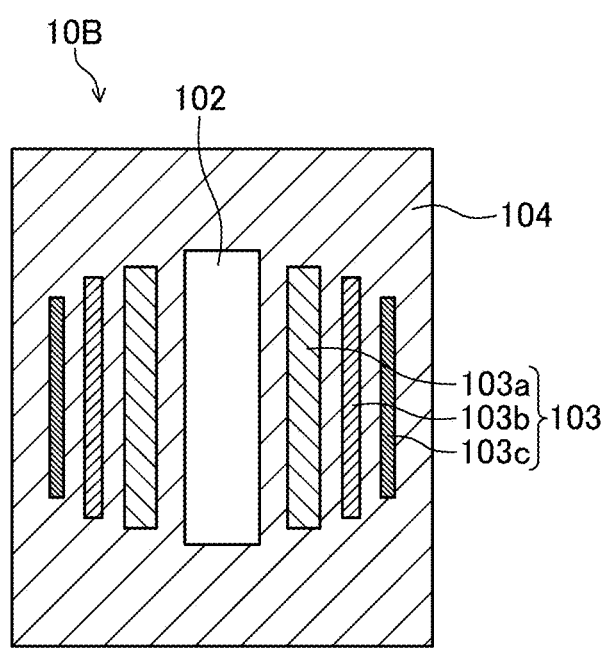
FIG. 11A is a plan view illustrating a photomask according to modified example 2 of the first exemplary embodiment.

FIG. 11A illustrates an example where linear patterns are formed. As illustrated in FIG. 11A, photomask 10B according to the present modified example includes light shield 104, linear main pattern 102 which is formed on light shield 104, and phase shifters 103a to 103c. Phase shifters 103a to 103c are formed in regions on both sides of main pattern 102 and in parallel to main pattern 102, and compose auxiliary pattern 103. A relationship concerning phases and line widths among first phase shifter 103a, second phase shifter 103b and third phase shifter 103c is the same as the relationship among first phase shifter 103a, second phase shifter 103b and third phase shifter 103c according to modified example 1 illustrated in FIGS. 10A and 10B. Strictly speaking, there is a phase distribution in a periphery of short sides of the linear rectangular pattern on a propagation plane of light beams, too. However, the phase distribution is short in length, and does not contribute much to actual image forming. Hence, as illustrated in FIG. 11A, by providing auxiliary pattern 103 only in a periphery of long sides, it is possible to obtain a linear image forming pattern while reducing a load upon formation of auxiliary pattern 103 when photomask 10B is made.

By the way, taking into account the amplitude distribution illustrated in FIG. 5A in view of the ideal phase distribution illustrated in FIG. 7A, a linear phase distribution provided in parallel to a line portion becomes shorter with increasing distance from the line portion. This is because, when all auxiliary patterns 103 having the same lengths as the line portion are provided, light beams condense at ends of the line too much. Hence, in a case of phase shifters 103a to 103c which compose auxiliary pattern 103 provided in parallel to main pattern 102 which is the line portion, the length of second phase shifter 103b provided at a position far from main pattern 102 is preferably shorter than the length of first phase shifter 103a provided at a position close to main pattern 102. In other words, a distance between an extension line extended from a short side of main pattern 102 and an end of first phase shifter 103a in a stretching direction (line direction) is preferably shorter than a distance between the extension line and the end of second phase shifter 103b in the extension direction (line direction).

Modified Example 3 of First Exemplary Embodiment

Figure 11B:
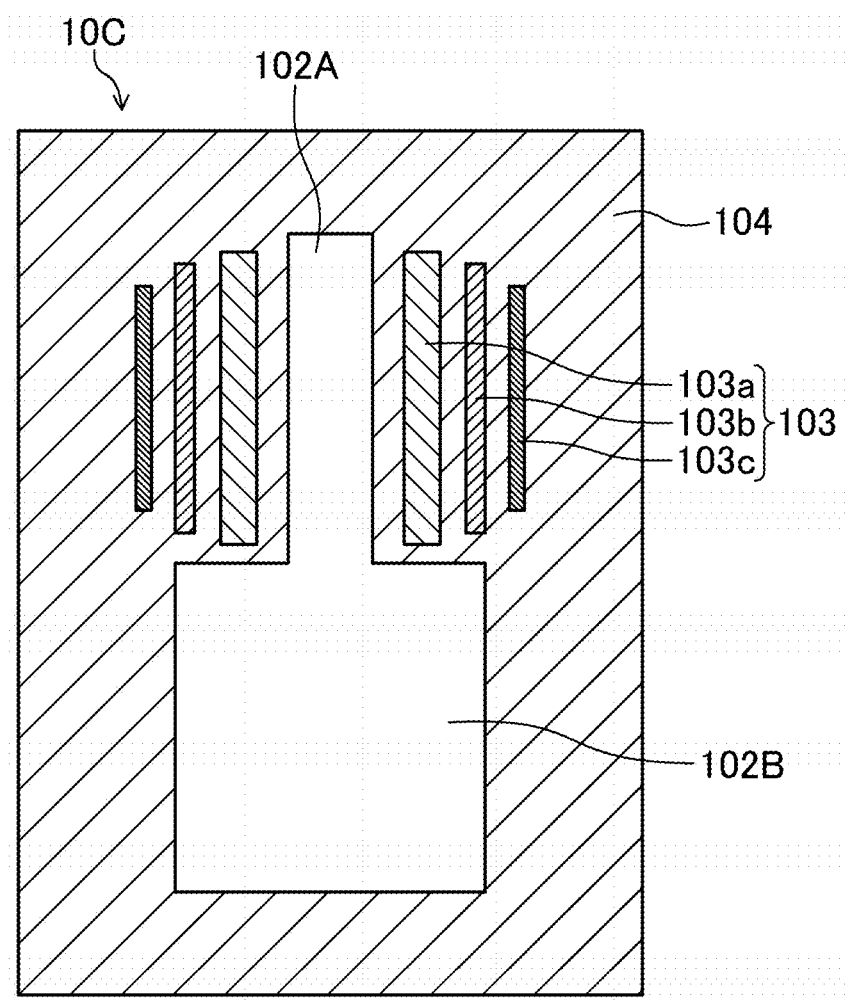
FIG. 11B is a plan view illustrating a photomask according to modified example 3 of the first exemplary embodiment.

FIG. 11B illustrates modified example 3. An example where two linear patterns of different widths are formed will be described in the present modified example.

An example of a desired pattern is that, for example, 365 nm which is an exposure wavelength and 50 μm which is an interval (gap length) between a photomask and an exposure object are assumed as dimensions which are difficult to form for a normal photomask, and there are a line width less than 5 μm and a line width sufficiently wider than the former line width.

The pattern dimension which can be formed for the normal photomask can be estimated as about $\sqrt{(2\times G\times\lambda)}$ when $\lambda$ represents an exposure wavelength and a gap length G between the photomask and an exposure object is used. In this regard, first main pattern 102A of photomask 10C according to the present modified example is a portion corresponding to the line width less than 5 μm, and second main pattern 102B is a portion corresponding to the line width sufficiently wider than 5 μm. In this case, auxiliary pattern 103 is preferably provided in parallel to and in a periphery of a line portion of first main pattern 102A. By providing auxiliary pattern 103 in a region substantially needing auxiliary pattern 103 instead of providing auxiliary pattern 103 to surround an entire periphery of main patterns 102A and 102B, it is possible to reduce a load upon making of photomask 10C.

Modified Example 4 of First Exemplary Embodiment

Figure 12:
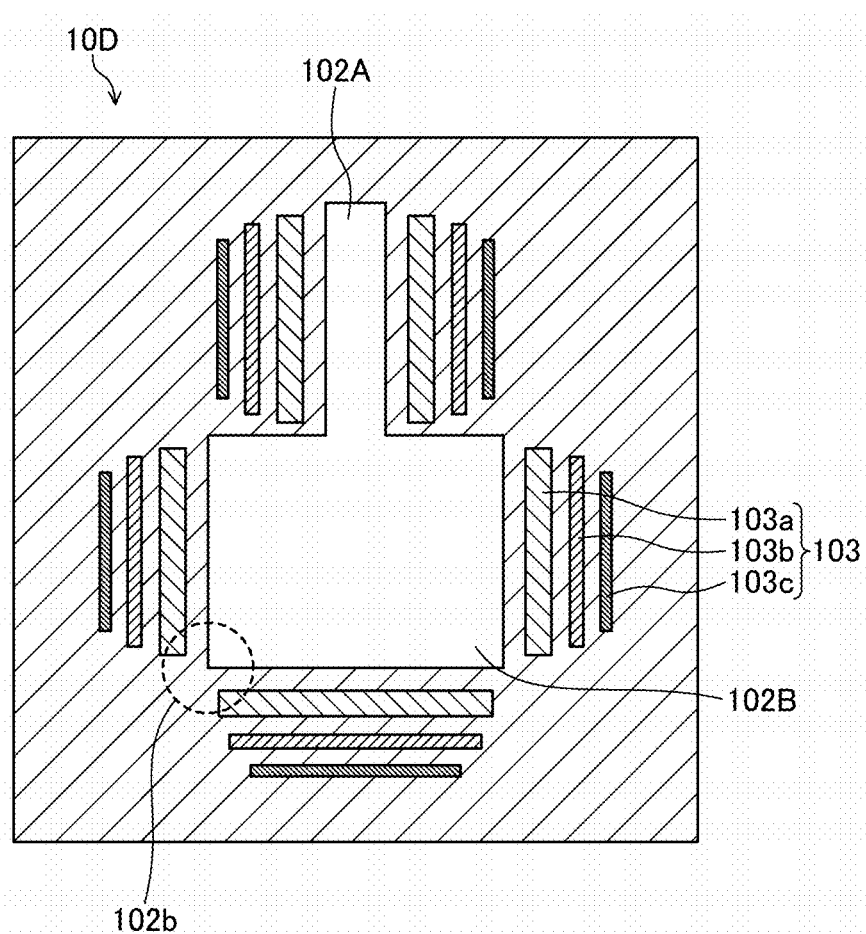
FIG. 12 is a plan view illustrating a photomask according to modified example 4 of the first exemplary embodiment.

FIG. 12 illustrates modified example 4. Another example where two linear patterns of different widths are formed will be described in the present modified example.

In the present modified example, 365 nm which is a wavelength and 50 μm which is a gap length are assumed, and there are a line width less than 5 μm and a line width sufficiently wider than 5 μm. First main pattern 102A is a portion corresponding to the line width less than 5 μm, and second main pattern 102B is a portion which corresponds to the line width sufficiently wider than 5 μm.

Photomask 10D according to modified example 4 differs from the photomask of modified example 3 in that auxiliary patterns 103 are provided in a periphery of second main pattern 102B. As described above, in terms of a resolution, auxiliary patterns 103 do not necessarily need to be provided in the periphery of second main pattern 102B. However, to form a pattern shape in a desired shape, auxiliary patterns 103 are preferably provided in a periphery of a sufficiently large pattern, too.

In this case, to form the pattern shape in the desired shape, auxiliary pattern 103 is not provided in the periphery of protruding corners 102b which are corner portions of second main pattern 102B. This is because, as described with reference to FIG. 11A, also in the case of a linear pattern, auxiliary patterns 103 which are provided in the periphery of ends of a line preferably become less toward the ends of the line. That is, it is configured not to condense light beams are at protruding corners 102b of second main pattern 102B too much. Thus, it is desirable to employ a configuration where auxiliary pattern 103 is not provided in the periphery of protruding corners 102b of second main pattern 102B, and a configuration where a number of phase shifters 103a to 103c which compose auxiliary patterns 103 becomes smaller toward protruding corners 102b with respect to a center of a stretching direction of a line portion.

Modified Example 5 of First Exemplary Embodiment

Figure 13:
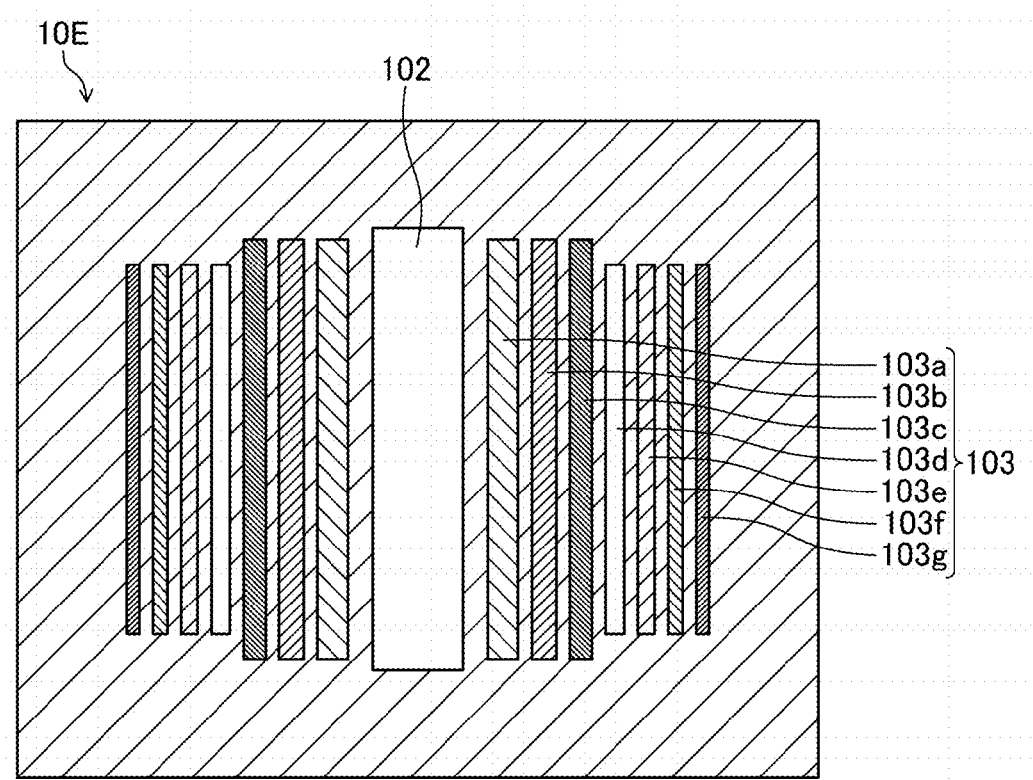
FIG. 13 is a plan view illustrating a photomask according to modified example 5 of the first exemplary embodiment.

FIG. 13 illustrates modified example 5. The present modified example is another example where linear patterns are formed similarly to FIG. 11A.

As illustrated in FIG. 13, a difference from modified example 2 illustrated in FIG. 11A is that phase shifters of the same phase are provided as auxiliary patterns 103 in regions on each side of main pattern 102. That is, phase planes of light beams in phase shifters 103a to 103g advance more with increasing distance from main pattern 102. Further, in the configuration example, phases of exposure light beams are shifted such that a traveling direction of phase planes of light beams face toward a transfer image of main pattern 102, and the phases of phase shifters 103a to 103g have a cycle of 360°.

In this regard, in a case of light beams in phase shifters 103a to 103g which compose auxiliary pattern 103, first phase shifter 103a and fifth phase shifter 103e cause the same phase shift on the phases of exposure light beams. Similarly, second phase shifter 103b and sixth phase shifter 103f cause the same phase shift, and third phase shifter 103c and seventh phase shifter 103g cause the same phase shift. Fourth phase shifter 103d allows exposure light beams to be transmitted at the same phase as that in main pattern 102. Further, a relationship among phases in first phase shifter 103a, second phase shifter 103b and third phase shifter 103c is the same as the relationship in the example in FIG. 11A.

In this regard, features of photomask 10E according to the present modified example are different from features of the configuration according to modified example 2 illustrated in FIG. 11A in that two linear phase shifters of the same phase (e.g. first phase shifter 103a and fifth phase shifter 103e) are provided nearly in parallel to the line portion on each side of linear main pattern 102 and at different distances from main pattern 102, and a length of the phase shifter provided at a position far from main pattern 102 is shorter than a length of the phase shifter provided at a position close to main pattern 102. In other words, a distance between an extension line extended from a short side of main pattern 102 and an end of first phase shifter 103a in a stretching direction (line direction) is shorter than a distance from the extension line and an end of fifth phase shifter 103e in the stretching direction (line direction). According to this configuration, as to a linear pattern that condenses more light beams for image formation, it is possible to prevent light beams from being condensed too much on the end of the linear pattern, and prevent an image shape from being distorted.

Various modified examples of the mask layouts have been described as characteristic configurations of the mask layouts. Hereinafter, an example where an accurate mask layout has been actually calculated will be described.

FIGS. 14 to 18D illustrate a design pattern which is a desired pattern according to the above modified examples, mask layout diagrams and simulation results of transfer images obtained when these mask layouts are used.

Figure 14:
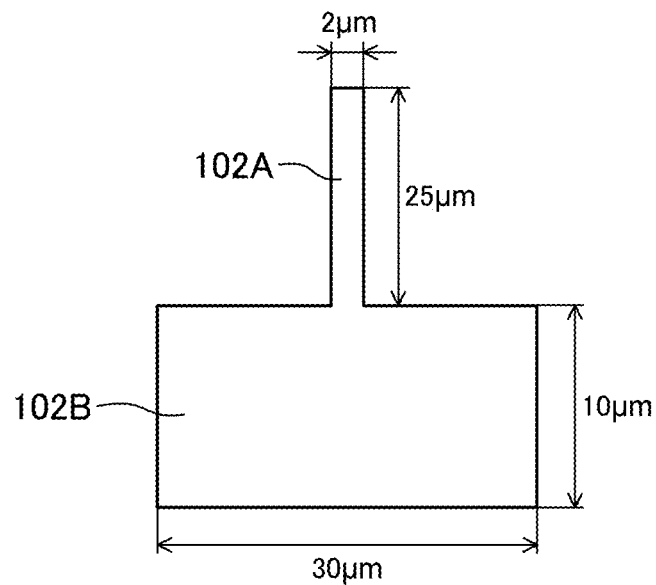
FIG. 14 is a plan view illustrating a design pattern corresponding to modified example 4 of the first exemplary embodiment.
Figure 15:
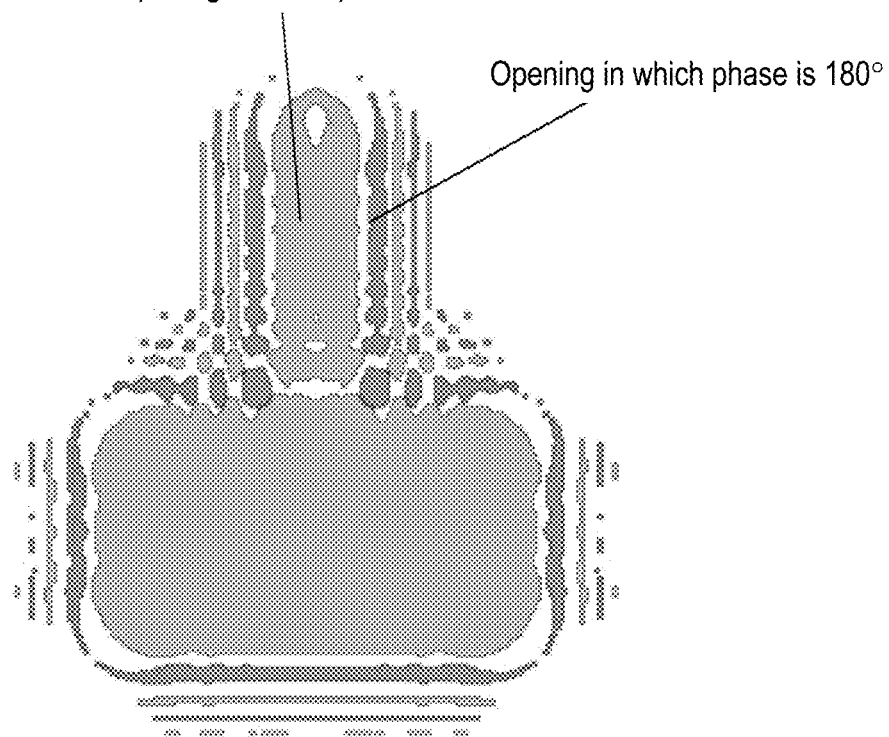
FIG. 15 is a plan view illustrating a mask layout pattern obtained by binarizing phase shifters of the photomask corresponding to modified example 4 of the first exemplary embodiment.
Figure 16:
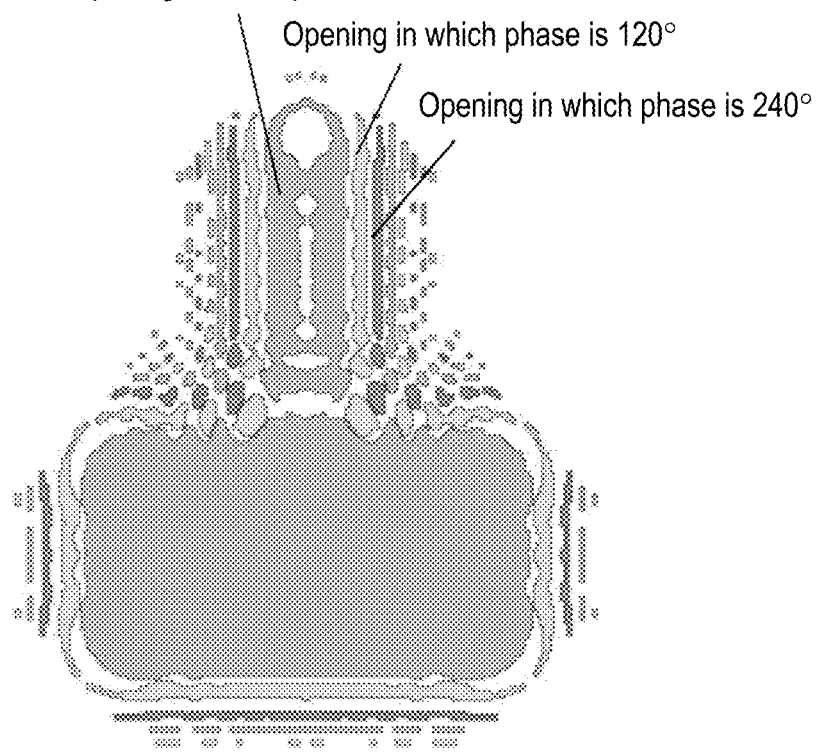
FIG. 16 is a plan view illustrating a mask layout pattern obtained by ternarizing phase shifters of the photomask corresponding to modified example 4 of the first exemplary embodiment.
Figure 17:
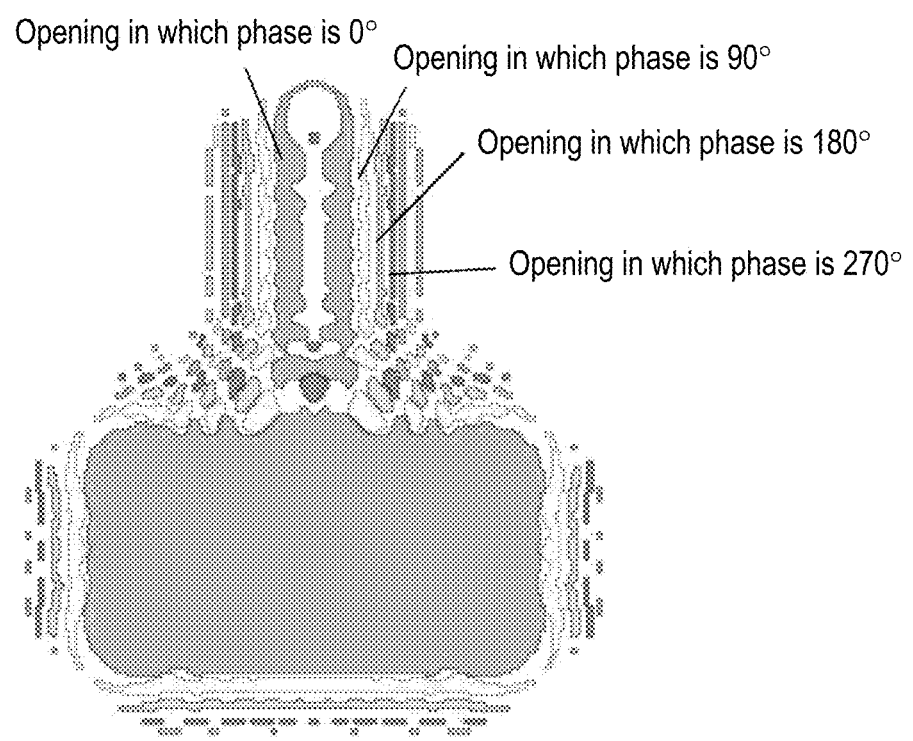
FIG. 17 is a plan view illustrating a mask layout pattern obtained by quaternarizing phase shifters of the photomask corresponding to modified example 4 of the first exemplary embodiment.

FIG. 14 illustrates the desired pattern, which is the design pattern used to calculate the mask layout diagram. FIGS. 15 to 17 are mask layout diagrams calculated from the design pattern. In this regard, FIG. 15 illustrates an example where the mask layout has been made with phases of 0° and 180°. FIG. 16 illustrates an example where the mask layout has been made with phases of 0°, 120° and 270°. FIG. 17 illustrates an example where the mask layout has been made with phases of 0°, 90°, 180° and 270°. In this regard, phases illustrated in each auxiliary pattern in FIGS. 15 to 17 indicate values by which phase planes of exposure light beams transmitted through respective auxiliary patterns advance.

FIGS. 18A to 18D illustrate results obtained by performing optical simulation when a gap length between a photomask and an exposure object is 50 μm, an exposure wavelength is 365 nm and a collimation angle of an exposure light beam source is 1.5°.

Figure 18A:
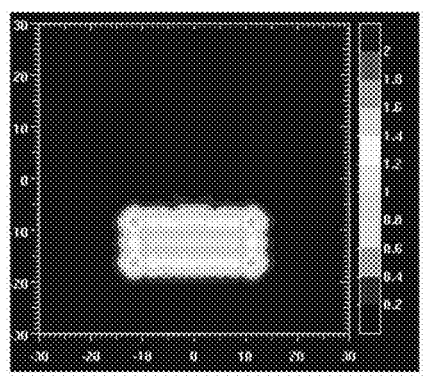
FIG. 18A illustrates a comparative example, and is a view illustrating a simulation result obtained in a case where a design pattern has been exposed as an opening of a mask layout.

FIG. 18A illustrates a comparative example, and illustrates a simulation result obtained in a case where exposure has been performed with use of a normal mask, i.e., the design pattern as an opening of a mask layout as is. As illustrated in FIG. 18A, in a case of the normal photomask, a transfer image of first main pattern 102A whose design pattern width is 2 µm is not formed at all. Meanwhile, a transfer image of second main pattern 102B whose pattern width is sufficiently wide can be formed. This shows that an auxiliary pattern needs to be provided to at least first main pattern 102A.

Figure 18B:
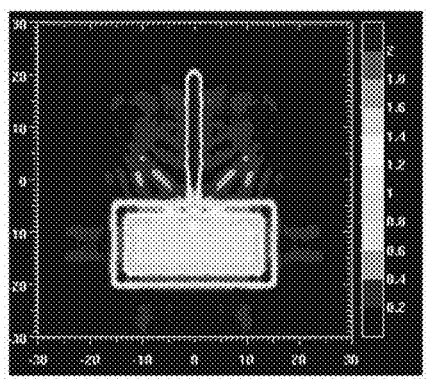
FIG. 18B is a view illustrating a simulation result obtained in a case where the photomask illustrated in FIG. 15 has been exposed.
Figure 18C:
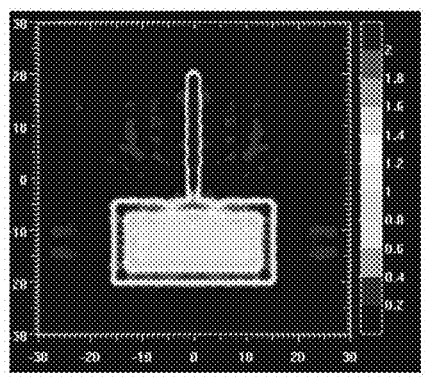
FIG. 18C is a view illustrating a simulation result obtained in a case where the photomask illustrated in FIG. 16 has been exposed.
Figure 18D:
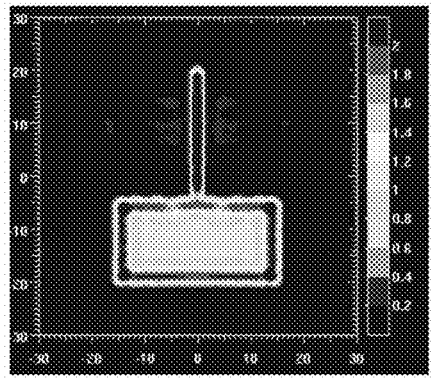
FIG. 18D is a view illustrating a simulation result obtained in a case where the photomask illustrated in FIG. 17 has been exposed.

FIG. 18B illustrates a simulation result obtained in a case where the photomask illustrated in FIG. 15 has been exposed. FIG. 18C illustrates a simulation result obtained in a case where the photomask illustrated in FIG. 16 has been exposed. FIG. 18D illustrates a simulation result obtained in a case where the photomask illustrated in FIG. 17 has been exposed. These results show that, by providing the auxiliary pattern to first main pattern 102A, a clear transfer image is formed on first main pattern 102A. Further, even when the auxiliary pattern is not provided on second main pattern 102B, a transfer image itself is formed. Meanwhile, as illustrated in FIGS. 15 to 17, by providing the auxiliary pattern to second main pattern 102B, a clear pattern image is realized on an outline of a desired pattern shape, and it is possible to obtain a transfer image which is distorted little compared to the desired pattern shape.

Further, it is also found that, when three phases of 0°, 120° and 240° are used as in the configuration illustrated in FIG. 16 instead of two phases of 0° and 180° as in the configuration illustrated in FIG. 15, and when four phases of 0°, 90°, 180° and 270° are used as in the configuration illustrated in FIG. 17, a more clear outline can be obtained. In this regard, it is found that, in all examples where the auxiliary patterns are provided, the auxiliary pattern is not provided or a line width is narrower than a line width of the auxiliary pattern provided along a linear portion, in peripheral regions of protruding corners of second main pattern 102B. Further, it is also found that a length of a nearly linear auxiliary pattern provided along the linear portion in the design pattern becomes shorter with increasing distance from the design pattern. Furthermore, it is also found that the linear auxiliary pattern is more segmented with increasing distance from the design pattern.

By satisfying these requirements, it is possible to obtain a mask layout which can more accurately realize a design pattern, i.e., a desired pattern.

Further, as can be seen from the mask layout diagrams illustrated in FIGS. 15 and 16, the auxiliary patterns provided at recessed corner portions formed at a connection portion between first main pattern 102A and second main pattern 102B are preferably isolated patterns. This is because, since phase distributions overlap and intersect to form an image of a desired pattern with two linear sides, a necessary phase distribution cannot be obtained with linear patterns. In this case, too, as is clear from FIGS. 15 and 16, it is configured that a phase plane advances more with increasing distance from the desired pattern in a perpendicular direction. Further, these isolated auxiliary patterns are configured to have smaller areas instead of narrower line widths with increasing distance from the desired pattern.

Further, as illustrated in the examples in FIGS. 16 and 17, the configuration is not necessarily limited to a configuration where openings which are main patterns are arranged inside the desired pattern. That is, even when a position corresponding to first main pattern 102A in the design pattern is not at the mask pattern opening but at a light shield in the mask layout, it is possible to form a good pattern image.

The main pattern preferably has a nearly similar figure of a desired pattern yet is not limited to this. In an extreme case, there is not a pattern at a desired pattern position, and only auxiliary patterns are provided in some cases. Hence, more precisely speaking, distinction between main patterns and auxiliary patterns is not essential, and the photomask according to the present exemplary embodiment is adequately defined as follows.

The photomask according to the present exemplary embodiment employs a configuration where, when a desired pattern is a linear pattern, phase transmission regions which allow a plurality of phases to be transmitted are provided in a desired linear pattern and a periphery of the desired linear pattern, and phase planes in the plurality of phase transmission regions sequentially advance with increasing distance from the center line of the desired linear pattern.

More specifically, a first pattern is set as a linear region which allows exposure light beams of nearly same phases to be transmitted, the linear region provided at the closest position to the center line of the desired linear pattern, the linear region in a position of the desired linear pattern or in a peripheral region including the position. A second pattern is set as a linear region whose phase is different from that of the first pattern and which allows exposure light beams of nearly same phases to be transmitted, the linear region provided at a position across the first pattern as seen from the center line. A third pattern is set as a linear region whose phase is different from those of the first pattern and the second pattern, the linear region which allows exposure light beams of nearly same phases to be transmitted, the linear region provided at a position across the second pattern as seen from the center line. Phase planes of exposure light beams transmitted through the three patterns which generate these three different phases preferably advance more with increasing distance from the center line of the desired pattern.

That is, the phase planes of light beams are preferably configured to advance more in order of the third pattern, the second pattern and the first pattern. Further, the widths of these line portions preferably become narrower with increasing distance from the center line of the desired pattern. Furthermore, the configuration is preferably symmetrically provided with respect to the center line of the desired linear pattern. Still further, as described above, it goes without saying that a translucent portion is preferably provided at a portion corresponding to a position of the desired pattern. However, a light shield may be provided at a portion corresponding to the position of the desired pattern.

The above definition is a definition in a case of a configuration of the linear main pattern. However, when a desired pattern includes recessed corner portions such as a connection portion between first main pattern 102A and second main pattern 102B, auxiliary patterns provided in a periphery of the desired pattern are preferably isolated instead of linear shapes. In this case, a first pattern is set as a phase transmission region which allows light beams of nearly same phases to be transmitted among a first pattern group provided in a vicinity of the desired pattern including the desired pattern and a periphery of the desired pattern. A second pattern is set as a phase transmission region which allows light beams of nearly same phases to be transmitted and allows phases different from those of the first pattern to be transmitted among a second pattern group which appears near the desired pattern across the first pattern group in a direction toward an outer circumference of the desired pattern. Further, a third pattern is set as a phase transmission region which allows light beams of nearly same phases to be transmitted and allows phases different from those of the first pattern and the second pattern to be transmitted among a third pattern group which appears near the desired pattern across the second pattern group.

In this regard, when the first pattern, the second pattern and the third pattern are provided on a line traveling from the inside of the desired pattern to the outer circumference of the desired pattern, and phase planes of the first pattern, the second pattern and the third pattern are configured to advance more in order of the third pattern, the second pattern and the first pattern, light beams are condensed at a position of the desired pattern. In this case, opening areas of the first pattern, the second pattern and the third pattern are preferably configured to decrease in order of the first pattern, the second pattern and the third pattern. A plurality of same configurations as those of the first pattern to the third pattern are preferably provided toward an outside of the desired pattern.

Second Exemplary Embodiment

An example of a photomask according to the second exemplary embodiment will be described below with reference to FIGS. 19A and 19B. Similarly to the first exemplary embodiment, a photomask is realized which reproduces by proximity exposure an amplitude intensity distribution and a phase distribution of light beams on a propagation plane positioned between a lens and an exposure object used for projection transfer exposure. In the present exemplary embodiment, a configuration where carved portions are provided to a transparent substrate of a photomask is employed to realize a phase distribution of light beams.

Figure 19A:
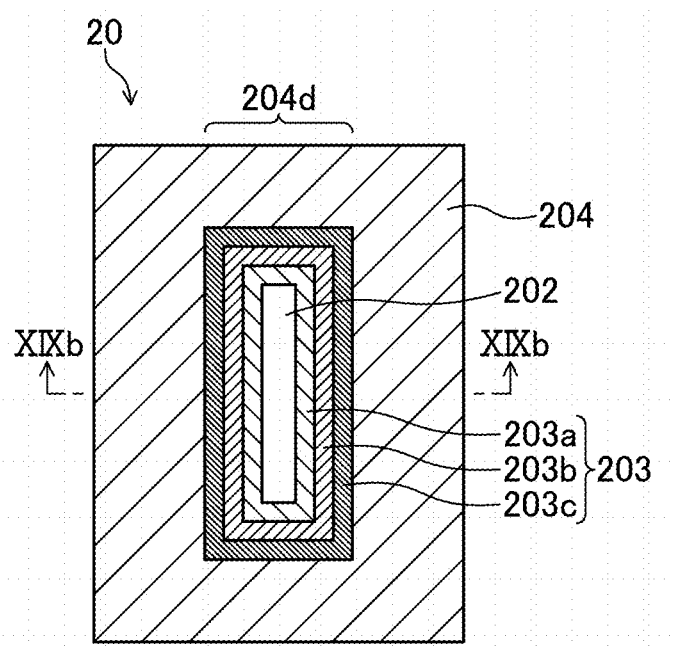
FIG. 19A is a plan view illustrating an example of a photomask according to a second exemplary embodiment.
Figure 19B:
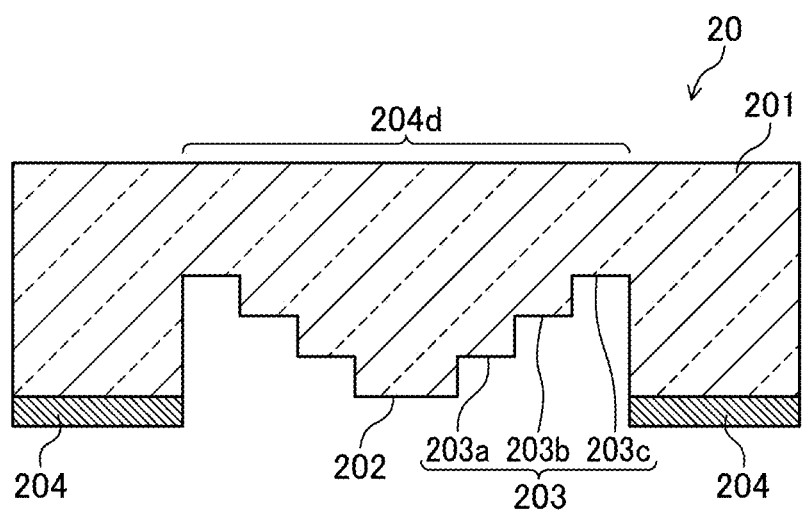
FIG. 19B is a sectional view along line XIXb-XIXb in FIG. 19A.

As illustrated in FIGS. 19A and 19B, photomask 20 according to the second exemplary embodiment includes transparent substrate 201 which is made of, for example, glass or quartz, and light shield 204 which is provided on a principal surface of transparent substrate 201 and is formed of a light shielding film made of chrome (Cr) or the like. Linear mask pattern opening 204$d$ surrounded by light shield 204 is provided in a center portion of light shield 204. Linear main pattern 202 is provided at the center portion of mask pattern opening 204$d$ and in a region corresponding to a desired transfer pattern. Main pattern 202 is composed of an exposed surface portion at which the principal surface of transparent substrate 201 is not carved. A plurality of carved portions 203$a$ to 203$c$ formed by carving the principal surface of transparent substrate 201 are provided in a periphery of main pattern 202. Thus, it is possible to form a desired transfer pattern on an exposure object (not illustrated) spaced a predetermined distance apart from photomask 20. When carving depths of carved portions 203$a$ to 203$c$ are deeper with respect to transmitted light beams, phase planes of the light beams transmitted through carved portions 203$a$ to 203$c$ advance more. This is because carved portions 203$a$ to 203$c$ are filled with air, air has a lower refractive index than that of any material used for transparent substrate 201, and therefore advancing speeds of the phase planes become fast.

In the present exemplary embodiment, first carved portion 203$a$, second carved portion 203$b$ and third carved portion 203$c$ are provided in order from a position closer to main pattern 202 corresponding to a desired transfer pattern. Further, the depths of carved portions 203$a$ to 203$c$ increase in order of first carved portion 203$a$, second carved portion 203$b$ and third carved portion 203$c$. In other words, as to the depths of carved portions 203$a$ to 203$c$, third carved portion 203$c$ is the deepest, and first carved portion 203$a$ is the shallowest. According to this configuration, as to how much phase planes of light beams transmitted through carved portions 203$a$ to 203$c$ advance, a phase plane advances the most in third carved portion 203$c$, the second most in second carved portion 203$b$ compared to the case of third carved portion 203$c$, and the third most in first carved portion 203$a$ compared to the case of second carved portion 203$b$. That is, the phase plane of first carved portion 203$a$ which is close to a region corresponding to the transfer pattern is delayed the most among carved portions 203$a$ to 203$c$.

In addition, in the present exemplary embodiment, a phase shifter which is auxiliary pattern 203 for main pattern 202 is composed of three carved portions 203$a$ to 203$c$. However, a number of carved portions may be two or four or more.

In the present exemplary embodiment, too, main pattern 202 which is an exposed surface portion at which the surface of transparent substrate 201 is exposed, and a plurality of carved portions 203$a$ to 203$c$ compose photomask 20 to form a phase distribution on the propagation plane between the lens and the exposure object used for projection transfer exposure. Consequently, it is possible to realize a high resolution when proximity exposure is performed with use of photomask 20.

More specifically, that the following phase difference is produced relative to a region at which the principal surface of transparent substrate 201 is exposed is used. The phase difference is produced by performing carving at depth d to adjust phases of light beams based on respective carving depths of a plurality of carved portions 203$a$ to 203$c$.

Phase Difference [rad]=$d/\lambda \times (n1-n0)$

In this regard, $\lambda$ represents an exposure wavelength, n1 represents a refractive index of the transparent substrate and n0 represents an air refractive index. In addition, a state where a phase plane advances in a direction toward an exposure object is a positive state. Hence, a phase difference between carved portions having depth d1 and depth 2d is expressed by the following equation.

Phase Difference [rad]=$(d2-d1)/\lambda \times (n1-n0)$

Hence, when the carving depths of a plurality of carved portions 203$a$ to 203$c$ provided in a periphery of main pattern 202 which is a desired pattern on photomask 20 are sequentially made deeper with increasing distance from the region corresponding to the desired pattern, it is possible to form a phase distribution of light beams on a propagation plane. In this regard, values having a difference of 360° in phases of light beams are regarded as the same values. Hence, a carved portion of carved portions 203$a$ to 203$c$ which produces a phase difference of 360° or more relative to main pattern 202 of transparent substrate 201 may be made shallow by 360°, or may be made deep by 360°.

Modified Example 1 of Second Exemplary Embodiment

Figure 20A:
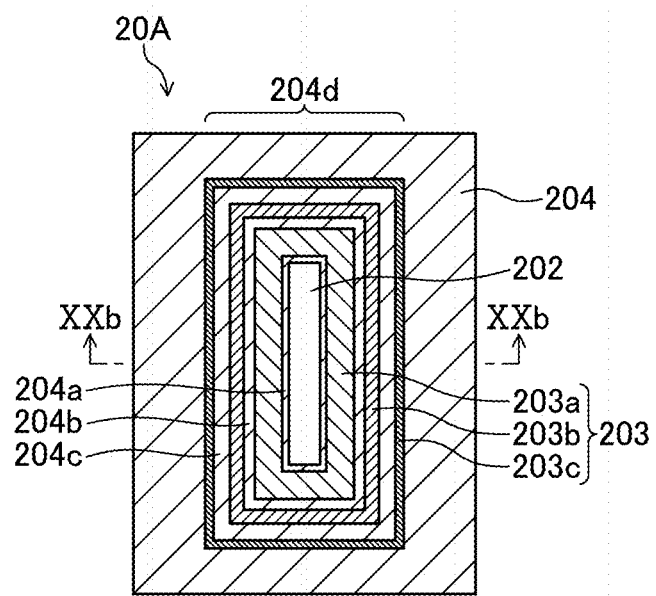
FIG. 20A is a plan view illustrating a photomask according to modified example 1 of the second exemplary embodiment.
Figure 20B:
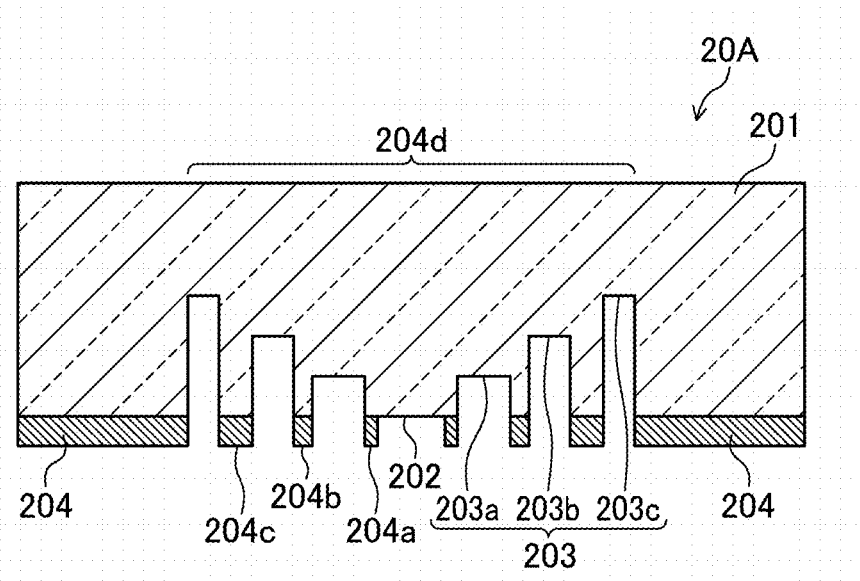
FIG. 20B is a sectional view along line XXb-XXb in FIG. 20A.

FIGS. 20A and 20B illustrate modified example 1 of the second exemplary embodiment.

As illustrated in FIGS. 20A and 20B, photomask 20A according to the present modified example includes light shields provided between carved portions 203$a$ to 203$c$ on a principal surface of transparent substrate 201 on a mask layout according to the second exemplary embodiment. This configuration corresponds to a configuration according to modified example 1 of the first exemplary embodiment. That is, the mask layout configuration corresponds to the configuration in FIG. 10A according to modified example 1 of the first exemplary embodiment where a plurality of phase shifters 103a to 103c are read as a plurality of carved portions 203a to 203c. That is, it is configured such that phase planes advance more with increasing depth of the carved portions as the carved portions become farther from main pattern 202. More specifically, there are contents that, as to first phase shifter 103a provided at a position close to main pattern 102 and second phase shifter 103b provided at a position farther from the main pattern than first phase shifter 103a, phases of light beams transmitted through second phase shifter 103b advance more compared to phases of light beams transmitted through first phase shifter 103a. These contents only need to be interpreted that, as to first carved portion 203a provided at a position close to main pattern 202 and second carved portion 203b provided at a position farther from main pattern 202 than first carved portion 203a, second carved portions 203b is formed by carving transparent substrate 201 deeper than first carved portions 203a.

Further, the phase shifters can be read as carved portions also in modified example 2 to modified example 5 of the mask layouts illustrated in FIGS. 11A to 13.

Modified Example 2 of Second Exemplary Embodiment

Figure 21:
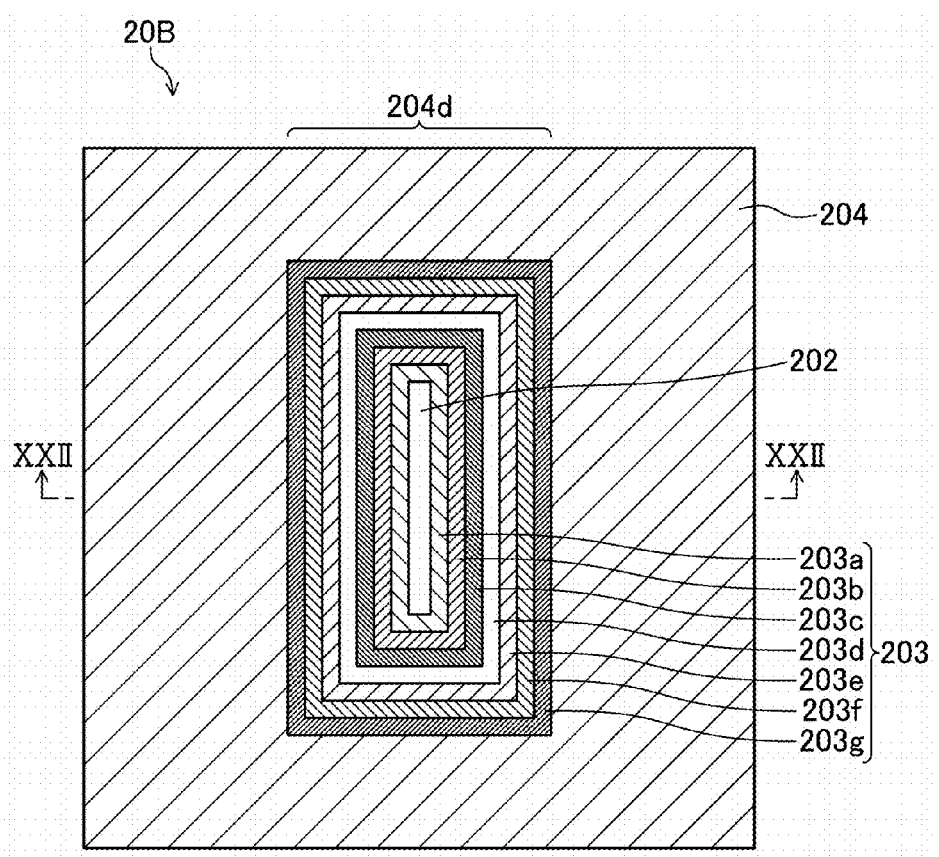
FIG. 21 is a plan view illustrating a photomask according to modified example 2 of the second exemplary embodiment.
Figure 22:
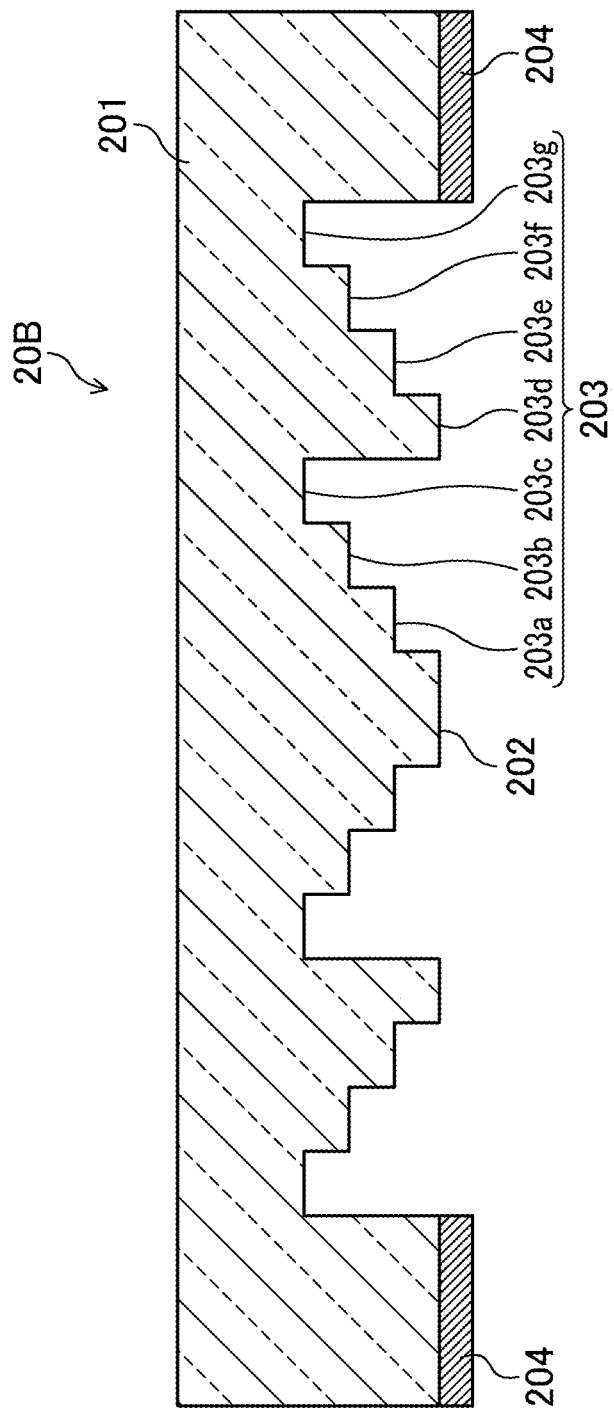
FIG. 22 is a sectional view along line XXIIb-XXIIb in FIG. 21.

FIGS. 21 and 22 illustrate modified example 2 of the second exemplary embodiment.

As illustrated in FIGS. 21 and 22, photomask 20B according to the present modified example includes a plurality of carved portions 203a to 203g which compose auxiliary pattern 203 and are provided to have phase cycles of traveling light beams.

For example, carved portions are assumed to be provided in order of first carved portion 203a, second carved portion 203b, third carved portion 203c, fourth carved portion 203d, fifth carved portion 203e, sixth carved portion 203f and seventh carved portion 203g, from a position closer to a region corresponding to a desired transfer pattern. In this case, the depths of carved portions 203a to 203g increase in order of first carved portion 203a, second carved portion 203b and third carved portion 203c. Further, fourth carved portion 203d is shallower than at least third carved portion 203c. That is, fourth carved portion 203d to seventh carved portion 203g are provided shallower by 360° compared to natural depths of the carved portions. Hence, an assumption that fourth carved portion 203d to seventh carved portion 203g are further carved by 360° is equivalent to a state that carving depths increase with increasing distance from the region corresponding to the desired pattern as in the case of the second exemplary embodiment.

In addition, in the configuration of the present modified example where the carved portions are made shallow by 360°, a carved portion whose carving amount is substantially 0 and where a principal surface of transparent substrate 201 is merely exposed such as fourth carved portion 203d illustrated in FIG. 22 may be a carved portion provided in a peripheral region of main pattern 202. More specifically, first carved portion 203a, second carved portions 203b and third carved portion 203c only need to produce phase differences of 90°, 180° and 270° of light beams with respect to a region at which the principal surface of transparent substrate 201 is exposed.

In this case, fourth carved portion 203d, fifth carved portion 203e, sixth carved portion 203f and seventh carved portion 203g may have depths which produce phase differences of 0°, 90°, 180° and 270°, respectively. That is, fourth carved portion 203d is merely in the state where the principal surface of transparent substrate 201 is exposed but can be used equivalently to a carved portion carved by 360°, as to phase planes produced by light beams transmitted through photomask 20B. Hence, it can be configured such that, with increasing distance from the region corresponding to a desired pattern, carved portions are made deeper in order, and then, from the carved portion which is made shallow by 360°, the carved portions which are far from the region corresponding to the desired pattern are made deeper again in order.

When carving depths are cyclically provided, it is possible to form a phase distribution in a wider region by providing carved portions having the depths corresponding to 90°, 180° and 270° and cyclically arranging the carved portions as illustrated in FIG. 22 compared to a case where carved portions having depths corresponding to 90°, 180°, 270°, 360°, 450°, 540° and 630° are provided. As a result, it is possible to reduce types of carving depths and easily make photomask 20B providing a higher resolution. That is, it is possible to reduce time and effort in process of making a plurality of carved portions having different carving depths when a photomask is actually made.

Modified Example 3 of Second Exemplary Embodiment

Figure 23:
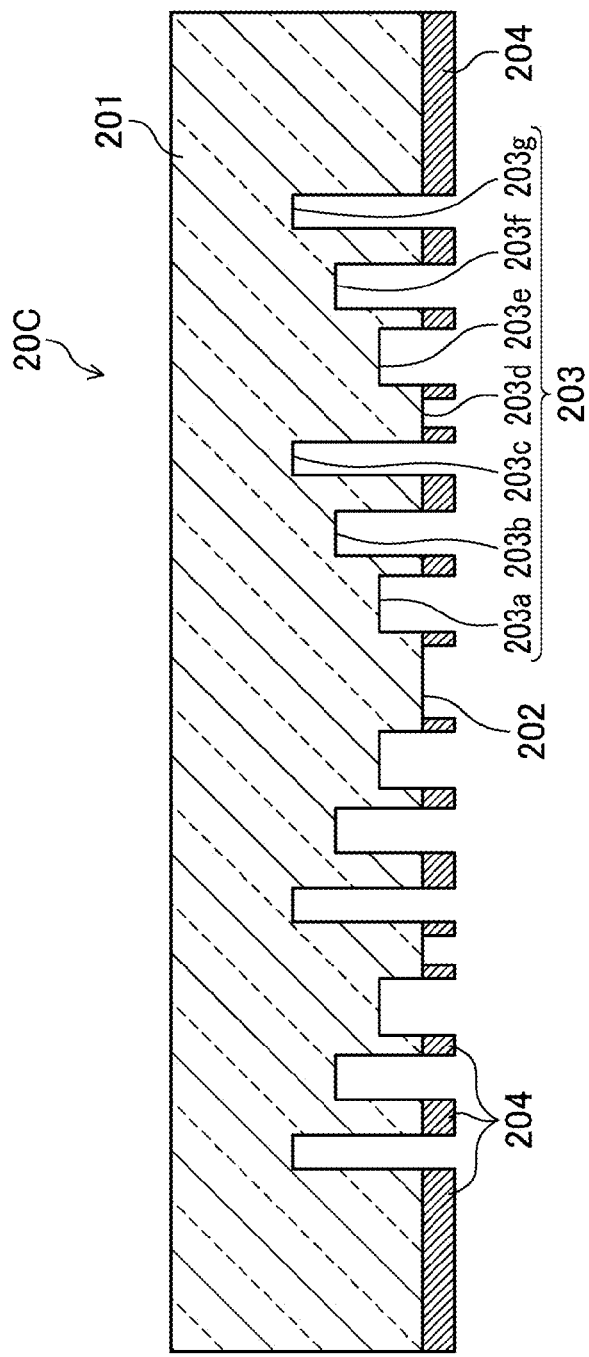
FIG. 23 is a sectional view illustrating a photomask according to modified example 3 of the second exemplary embodiment.

FIG. 23 illustrates photomask 20C according to modified example 3.

As illustrated in FIG. 23, light shields 204 may be provided between carved portions 203a to 203g which are phase shifters which compose auxiliary pattern 203 similarly to modified example 1. In this case, carved portions having same carving depths are configured to have smaller pattern widths with increasing distance from a region corresponding to the desired pattern.

Configurations where a plurality of carved portions are provided to a transparent substrate have been described in the second exemplary embodiment to modified example 3 of the second exemplary embodiment. However, a configuration where a transmissive film is provided to a transparent substrate and carved portions are provided to this film may be employed.

Modified Example 4 of Second Exemplary Embodiment

Photomask 20D according to modified example 4 will be described below with reference to FIG. 24.

Figure 24:
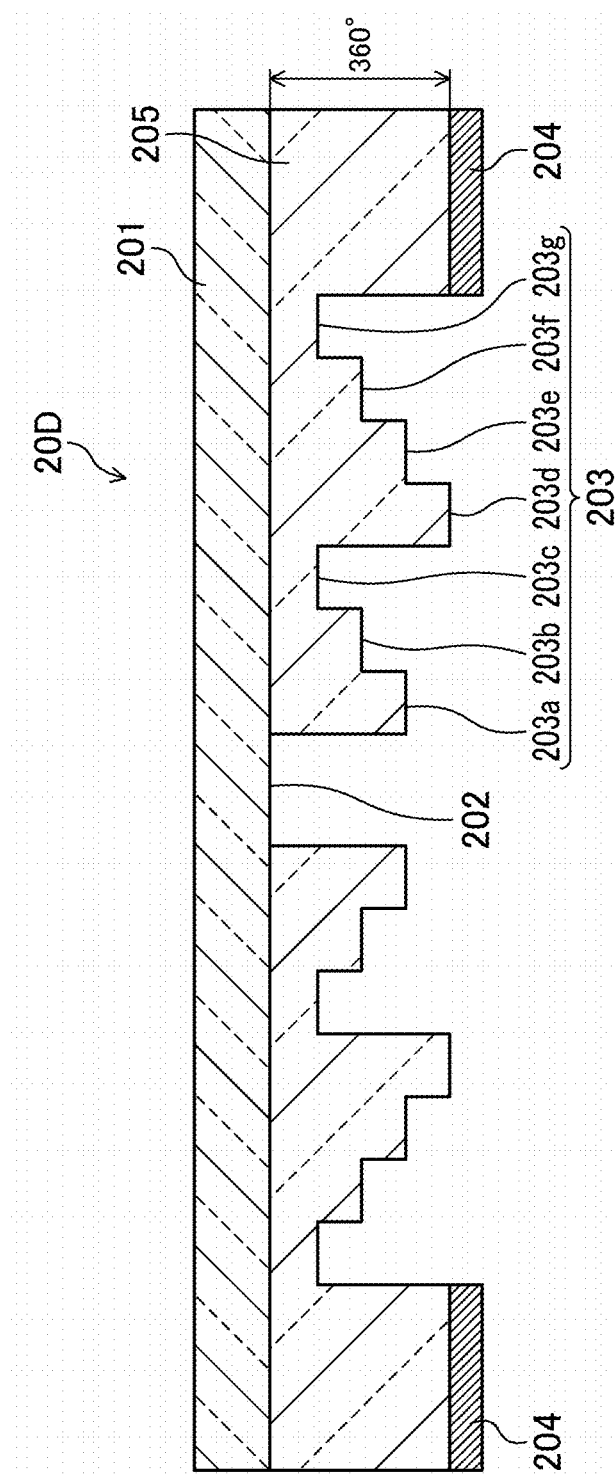
FIG. 24 is a sectional view illustrating a photomask according to modified example 4 of the second exemplary embodiment.

As illustrated in FIG. 24, photomask 20D according to the present modified example includes semi-transparent film 205 which has translucency and is provided on a principal surface of transparent substrate 201 made of glass, quartz or the like. Further, linear main pattern 202 which is an exposed surface portion at which the principal surface of transparent substrate 201 is exposed is provided in a region corresponding to a desired pattern. A plurality of carved portions 203a to 203g which compose auxiliary pattern 203 employing the same configuration as that in modified example 2 are provided to semi-transparent film 205 on both sides of main patterns 202. In addition, a layout of photomask 20D according to the present modified example is the same as that in FIG. 21.

According to the above configuration, it is possible to provide a difference in transmittance between main pattern 202 and each of carved portions 203a to 203g. Further, by lowering the transmittance of semi-transparent film 205, it is possible to lower the transmittances of carved portions 203a to 203g provided at a periphery of main pattern 202 compared to main pattern 202 provided in the region corresponding to the desired pattern.

In addition, a material whose transmittance is lower than 1 and larger than 0 can be used for semi-transparent film 205 provided with carved portions 203a to 203g. The material has a light transmittance of preferably 3% or more and 60% or less to effectively use characteristics that is neither in a light shielding state nor in a transparent state taking into account an influence related to substantial exposure of a resist irradiated with exposure light beams transmitted through photomask 20D. For such a material, a PMMA film whose composition is adjusted or a $SiO_2$ film doped with Mo or the like can be used as described earlier.

Photomask 20D according to the present modified example can more reliably reproduce a situation that, as to an amplitude intensity of light beams on a propagation plane, an amplitude intensity at a position spaced apart from the region corresponding to a desired pattern is weak compared to an amplitude intensity at the region corresponding to the desired pattern as illustrated in FIG. 5A.

Actually, a resolution limit depends on a phase distribution for effectively condensing light beams. However, according to the above configuration which is important to form a light intensity distribution of a desired shape, a transmittance distribution is effective to generate a light intensity distribution for forming a pattern in which there are figures of different dimensions and figures of different shapes.

Modified Example 5 of Second Exemplary Embodiment

An example where a single-layer film is used for a semi-transparent film provided to a transparent substrate has been described in modified example 4. However, a configuration where a semi-transparent film which adjusts transmittances of light beams and a transparent film which adjusts phases of light beams are sequentially stacked on a transparent substrate may be used.

Photomask 20E according to modified example 5 will be described below with reference to FIG. 25.

Figure 25:
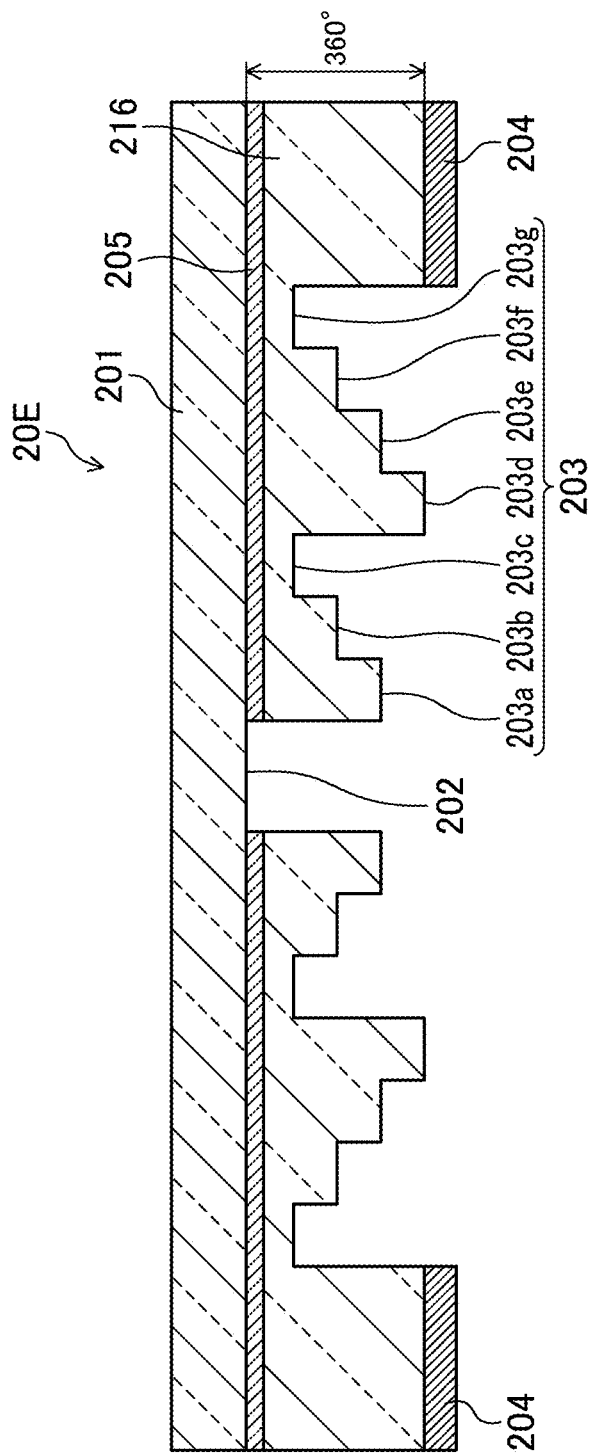
FIG. 25 is a sectional view illustrating a photomask according to modified example 5 of the second exemplary embodiment.

As illustrated in FIG. 25, photomask 20E according to the present modified example includes semi-transparent film 205 and transparent film 216 on semi-transparent film 205. Semi-transparent film 205 has translucency and is provided on a principal surface of transparent substrate 201 made of glass, quartz or the like. Further, linear main pattern 202 which is an exposed surface portion at which the principal surface of transparent substrate 201 is exposed is provided in a region corresponding to a desired pattern. A plurality of carved portions 203a to 203g which compose auxiliary patterns 203 employing the same configuration as that in modified example 2 are provided to transparent film 216 on both sides of main pattern 202. In addition, a layout of photomask 20E according to the present modified example is the same as that in FIG. 21.

According to modified example 5, by lowering transmittances of light beams transmitted through semi-transparent film 205 provided between transparent substrate 201 on which main pattern 202 has been formed, and transparent film 216 in which a plurality of carved portions 203a to 203g which compose auxiliary patterns 203 have been formed, it is possible to lower the transmittances of carved portions 203a to 203g provided at a periphery of main pattern 202 compared to main pattern 202 provided in a region corresponding to a desired pattern similarly to modified example 4.

In the present modified example, carved portions 203a to 203g are provided to transparent film 216. Hence, these transmittances do not change depending on carving depths of carved portions 203a to 203g. Consequently, it is possible to employ a configuration where values of transmittances and phases can be individually set to realize desired transmittances and desired phases.

Thus, photomask 20E according to the present modified example can independently adjust transmittances and phases, and can realize a more preferable configuration to form a light intensity distribution when there are figures of different dimensions.

As described above, the carved portions according to the second exemplary embodiment and modified example 1 to modified example 5 of the second exemplary embodiment correspond to phase shifters according to the first exemplary embodiment. Hence, similarly to the first exemplary embodiment, in the second exemplary embodiment and the modified examples of the second exemplary embodiment, too, widths of the carved portions provided at positions far from a region corresponding to a desired pattern are preferably smaller than widths of the carved portions provided close to the region corresponding to the desired pattern.

As described in modified example 2 to modified example 5 in particular, when one carved portion and another carved portion that have the same depth are cyclically provided with increasing distance from the region corresponding to the desired pattern, similarly to the first exemplary embodiment, the carved portions having the same phase difference, i.e., the same depth are preferably provided such that a width of the other carved portion provided far from the region corresponding to the desired pattern is narrower than a width of the one carved portion provided close to the region corresponding to the desired pattern.

Further, when a main pattern is a linear pattern, depths of carved portions provided at positions sandwiching the main pattern are preferably symmetrical with respect to a center line of the main pattern in a stretching direction such that the carved portions of the same depth form a pair, similarly to the first exemplary embodiment.

Furthermore, similarly to the first exemplary embodiment, a light shield is preferably provided around a mask pattern opening including the main pattern provided to meet the position of the desired pattern, and the carved portions provided at a periphery of the main pattern.

Still further, similarly to the first exemplary embodiment, a difference between carving depths of adjacent carved portions is preferably set to 120° or less in terms of a phase difference between exposure light beams to substantially improve a resolution. Moreover, the phase difference is more preferably reduced to 90° or less to sufficiently obtain an ideal effect.

Further, in the present exemplary embodiment and in each modified example, a main pattern is provided at an exposed surface portion at which a transparent substrate is wholly exposed in the region corresponding to a desired pattern. This configuration is preferable to enhance light intensities in the region corresponding to the desired pattern, yet is not indispensable. As described in the first exemplary embodiment, light beams transmitted through a translucent region which is much wider than a transfer image are condensed on the transfer image. Therefore, even when there are light shields in the region corresponding to the desired pattern, if multiple carved portions which allow the light beams to be transmitted are provided in the periphery of the light shields, a sufficient transfer image is formed.

As described above, according to the present exemplary embodiment, a phase distribution on a propagation plane between a lens and an exposure object used for projection transfer exposure can be realized by carving a transparent substrate which composes the photomask or carving a semi-transparent film or transparent film formed on the transparent substrate. Further, only by changing carving depths of the carved portions, it is possible to form a desired phase distribution. Consequently, it is not necessary to prepare different films (phase shifters) for each necessary phase, and it is possible to easily make the photomask.

Consequently, similarly to the first exemplary embodiment, it is possible to easily obtain a resolution equal to that of the projection transfer exposure even when proximity exposure is performed.

Third Exemplary Embodiment

The third exemplary embodiment will be described below with reference to FIGS. 26A and 26B. Similarly to the first exemplary embodiment and the second exemplary embodiment, in the third exemplary embodiment, too, a photomask is realized which reproduces by proximity exposure an amplitude distribution and a phase distribution on a propagation plane positioned between a lens and an exposure object used for projection transfer exposure. In the present exemplary embodiment, to realize a phase distribution, a photomask employs the following configuration. A transparent substrate is provided with waveguides through which light beams propagate along gaps (narrow carved portions) of a size almost equal to an exposure wavelength or less, to form the phase distribution.

Figure 26A:
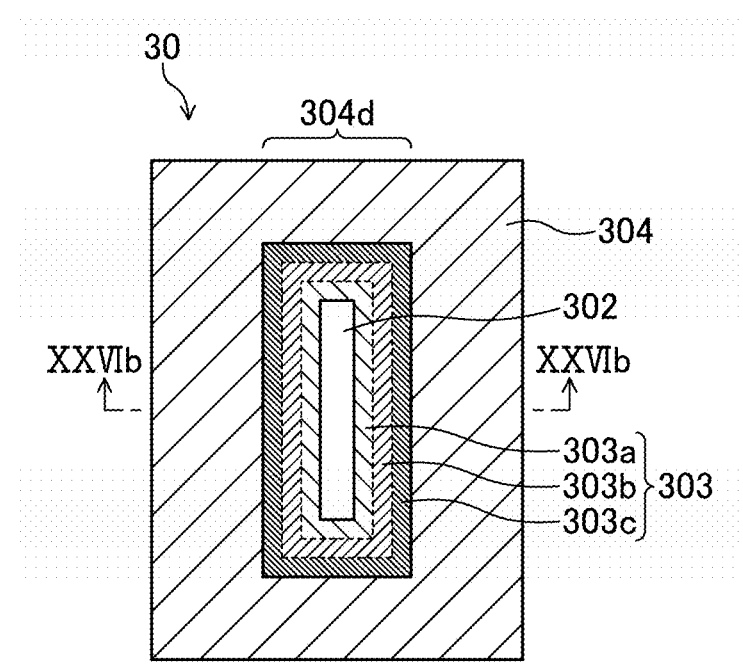
FIG. 26A is a plan view illustrating an example of a photomask according to a third exemplary embodiment.
Figure 26B:
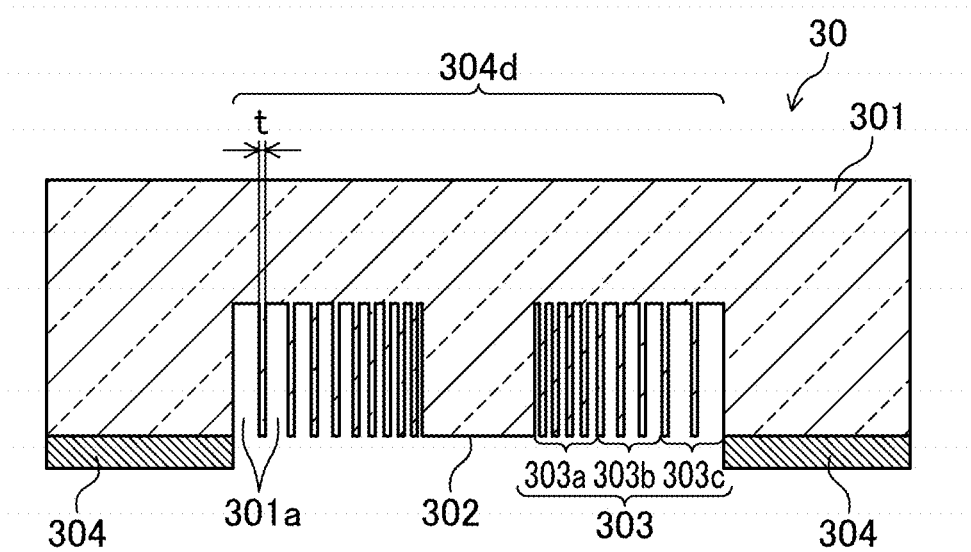
FIG. 26B is a sectional view along line XXVIb-XXVIb in FIG. 26A.

As illustrated in FIGS. 26A and 26B, photomask 30 according to the third exemplary embodiment includes transparent substrate 301 which is made of, for example, glass or quartz, and light shield 304 which is provided on a principal surface of transparent substrate 301, and is formed of a light shielding film made of chrome (Cr) or the like. Linear mask pattern opening 304d surrounded by light shield 304 is provided in a center portion of light shield 304. Linear main pattern 302 is provided at the center portion of mask pattern opening 304d and in a region corresponding to a desired transfer pattern. Main pattern 302 is composed of an exposed surface portion at which the principal surface of transparent substrate 301 is not carved. A plurality of waveguides 303a to 303c formed by carving the principal surface of transparent substrate 301 are provided in a periphery of main pattern 302. Thus, it is possible to form a desired transfer pattern on an exposure object (not illustrated) spaced a predetermined distance apart from photomask 30.

Waveguides 303a to 303c which are provided on the principal surface of transparent substrate 301 and compose auxiliary pattern 303 are configured to change phases of light beams transmitted through waveguides 303a to 303c by lowering width dimensions d and gaps of materials of different refractive indices to a wavelength or less. This principle will be described in detail later.

In the present exemplary embodiment, first waveguide 303a, second waveguide 303b and third waveguide 303c are provided in order from a position closer to main pattern 302 corresponding to a desired transfer pattern. In this case, it is configured such that phase planes of light beams advance the most in third waveguide 303c, the second most in second waveguide 303b compared to the case of third waveguide 303c and the third most in first waveguide 303a compared to the case of second waveguide 303b. That is, it is configured such that the phase plane in first waveguide 303a close to a region corresponding to the transfer pattern is delayed the most among waveguides 303a to 303c. According to this configuration, advancement of phase planes of light beams transmitted through narrow carved portion 301a increases from first waveguide 303a toward third waveguide 303c.

Next, components which are defined as waveguides 303a to 303c provided to transparent substrate 301 will be described in detail in the present exemplary embodiment.

Figure 27A:
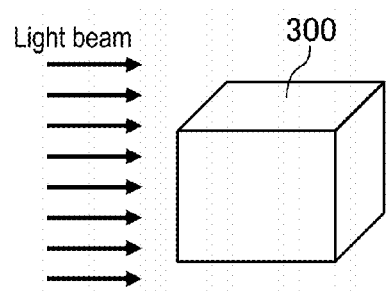
FIG. 27A is a schematic perspective view for explaining an influence which waveguides of the photomask according to the third exemplary embodiment have on phases of light beams.
Figure 27B:
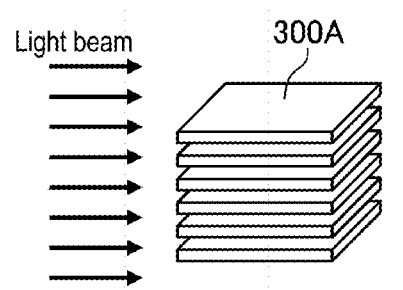
FIG. 27B is a schematic perspective view for explaining an influence which the waveguides of the photomask according to the third exemplary embodiment have on phases of light beams.
Figure 27C:
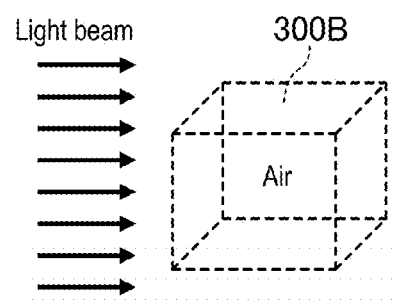
FIG. 27C is a schematic perspective view for explaining an influence which the waveguides of the photomask according to the third exemplary embodiment have on phases of light beams.

FIG. 27A illustrates glass 300 as a medium through which light beams are transmitted. FIG. 27B illustrates structure 300A formed by overlaying a plurality of glass plates formed as thin layers while sandwiching air layers between the thin layers. FIG. 27C illustrates air 300B as a medium. As indicated by arrows in each of FIGS. 27A, 27B and 27C, glass 300, structure 300A and air 300B are irradiated with light beams. In FIG. 27B, light beams are applied in parallel to principal surfaces of the glass plates. In FIGS. 27A and 27C, the media do not have directionality. Therefore, a light beam irradiation direction is not particularly important.

In this regard, when an interval between the glass plates, i.e., a thickness of an air layer between the glass plates is smaller than a wavelength of a light beam, i.e., when the dimension and gaps of a material through which light beam propagates are sufficiently narrow, structure 300A illustrated in FIG. 27B is referred to as a waveguide.

Propagation of light beams having applied on structure 300A illustrated in FIG. 27B is supposed to exhibit an intermediate behavior of propagation of the light beams having applied on glass 300 illustrated in FIG. 27A and on air 300B illustrated in FIG. 27C. That is, a phase change which occurs while light beams are transmitted through structure 300A is supposed to take an intermediate value between values in a case of a phase change which occurs while light beams are transmitted through a material filled with glass 300 in a given region and in a case of a phase change which occurs while light beams are transmitted through a material filled with air 300B in the same region as the given region.

Figure 28A:
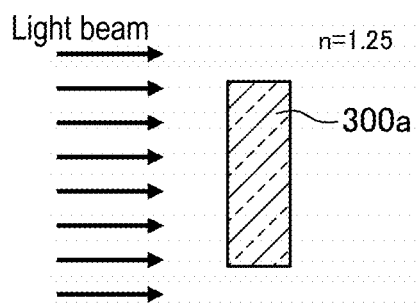
FIG. 28A is a view illustrating a simulation result of phase planes of light beams transmitted through a material of a different refractive index.
Figure 28B:
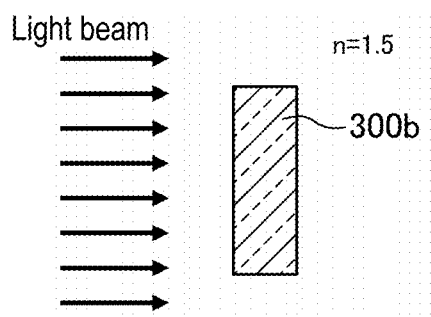
FIG. 28B is a view illustrating a simulation result of phase planes of light beams transmitted through a material of a different refractive index.

Results obtained by confirming the above contents by simulation will be described with reference to FIGS. 28A to 28D, 29A and 29B. FIGS. 28A and 28B schematically illustrate glass 300a which is a transparent material whose refractive index is 1.25 and glass 300b which is a transparent material whose refractive index is 1.5, respectively, in which glass 300a and glass 300b are put in air, and are irradiated with light beams.

Figure 28C:
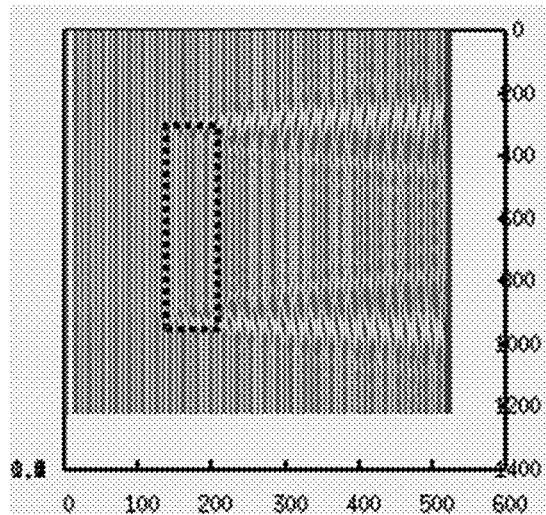
FIG. 28C is a view illustrating a simulation result of phase planes of light beams transmitted through a material of a different refractive index.
Figure 28D:
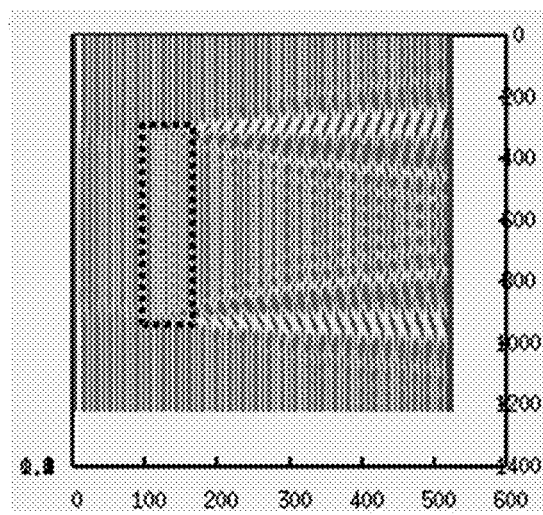
FIG. 28D is a view illustrating a simulation result of phase planes of light beams transmitted through a material of a different refractive index.

FIGS. 28C and 28D illustrate the simulation results of propagation of light beams in FIGS. 28A and 28B. Phase planes of the light beams transmitted through glasses 300a and 300b are delayed more when the light beams are transmitted through materials of higher refractive indices. Normally, air has the lowest refractive index among transparent materials. Therefore, phase planes of light beams transmitted through air advance more and phase planes of light beams transmitted through a material of a high refractive index are delayed. The results in FIGS. 28C and 28D show that the phase planes of the light beams transmitted through the material of the high refractive index are delayed compared to the phase planes of the light beams transmitted through air.

Next, a simulation result obtained when structure 300A is irradiated with light beams of wavelength $\lambda$ will be described. In structure 300A, a thickness of a transparent material (glass plate) whose refractive index is 1.5 and a gap of air between the glass plates are each $\lambda/2$ or less.

Figure 29A:
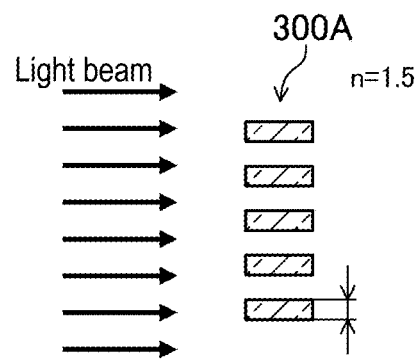
FIG. 29A is a view illustrating a simulation result of phase planes of light beams transmitted through a structure equivalent to the waveguide of the photomask according to the third exemplary embodiment.
Figure 29B:
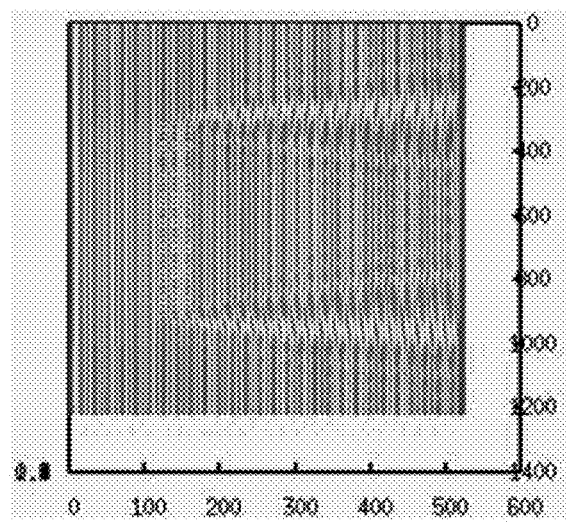
FIG. 29B is a view illustrating a simulation result of phase planes of light beams transmitted through a structure equivalent to the waveguide of the photomask according to the third exemplary embodiment.

FIG. 29A schematically illustrates a state that the thickness of the glass plate and the gap between the glass plates have the same dimension, and the glass plates are irradiated with light beams in a direction parallel to the planar surfaces of the glass plates. FIG. 29B illustrates a simulation result of propagation of a light beam in this state.

A result of propagation of light beams transmitted through structure 300A illustrated in FIG. 29B is the same as the result of propagation of light beams transmitted through glass 300b whose refractive index is uniformly 1.25 as illustrated in FIG. 28C. That is, the refractive index of air is 1.0, and therefore the light beams transmitted through structure 300A illustrated in FIG. 29A exhibit the same behavior as that exhibited when light beams are transmitted through a material having an average refractive index of constituent materials of structure 300A. In this regard, structure 300A is composed of glass whose refractive index is 1.5 and air whose refractive index is 1.0. Therefore, the light beams exhibited a behavior as in a case of a material whose refractive index is 1.25, i.e., an average value of the refractive indices of glass whose refractive index is 1.5 and air whose refractive index is 1.0.

As described above, even when a plurality of materials of different refractive indices are not prepared, if structures each formed by stacking transparent materials as layers are made and waveguides formed by providing air gaps between these layers are used, the structures can be used as materials having different refractive indices by changing a dimension ratio between the materials which compose the structure and the gaps (air) between the materials. In other words, by irradiating with light beams the layered structure formed by providing the air layers between the transparent materials in parallel to these layers, phases of light beams which change while the light beams are transmitted through the structure can be adjusted based on a value of a composition ratio between the transparent materials and the gaps between the transparent materials. That is, phase shifters which generate various phases can be configured. Hereinafter, unless particularly specified, a waveguide refers to a structure in which a translucent material and a material (e.g. air) of a different refractive index from that of the translucent material are alternately stacked each having a thickness equal to or less than an exposure wavelength, the structure having a function of changing phases of exposure light beams. In this regard, it is known that optical path lengths which light beams are transmitted are preferably equal to wavelengths of light beams or more to sufficiently enable phase shifter functions.

A sectional configuration of photomask 30 according to the present exemplary embodiment will be described with reference to FIG. 26B. In photomask 30, waveguides which can adjust phases of light beams are applied as described above.

As illustrated in FIG. 26B, in a region of the principal surface of transparent substrate 301 which is not covered by light shield 304, main pattern 302 at which the principal surface of transparent substrate 301 is exposed and a plurality of narrow carved portions 301a are formed. Hereinafter, carved portions which compose waveguides 303a to 303c according to the present exemplary embodiment and have width dimensions almost equal to or less than wavelengths λ of light beams will be referred to as narrow carved portions 301a to be distinguished from carved portion 203a and the like according to the second exemplary embodiment. In this regard, narrow carved portions 301a are carved to basically same depths. Meanwhile, the width dimension of narrow carved portion 301a is equal to an exposure wavelength or less. Further, thickness t of transparent substrate 301 between narrow carved portions 301a is also equal to the exposure wavelength or less.

According to the above configuration, waveguides 303a to 303c which function as the above phase shifters are provided. In this regard, when photomask 30 is seen in a plan view, a plurality of narrow carved portions 301a are formed in a linear shape parallel to main pattern 302. Hence, a value of a composition ratio between a transparent material (transparent substrate 301) which constitutes each of waveguides 303a to 303c and air is expressed as a ratio between thickness t of transparent substrate 301 between narrow carved portions 301a and the width of narrow carved portion 301a.

When first waveguide 303a, second waveguide 303b and third waveguide 303c are provided in order from a position closer main pattern 302, the thickness of the transparent material and the width of narrow carved portion 301a are preferably configured to satisfy a relationship of at least one of following (1) and (2) to provide a configuration where, as to phase planes of light beams transmitted through waveguides 303a to 303c, the phase plane advances the most in third waveguide 303c provided at the farthest position from main pattern 302, advances the second most in second waveguide 303b and advances the third most in first waveguide 303a compared to the case of second waveguide 303b.

(1) The thickness of the region between narrow carved portions 301a in transparent substrate 301 is the thickest in first waveguide 303a provided at the closest position to main pattern 302, and becomes thinner in order of second waveguide 303b and third waveguide 303c with increasing distance from main pattern 302. That is, an interval between narrow carved portions 301a is the longest in first waveguide 303a, and becomes shorter in order of second waveguide 303b and third waveguide 303c.

(2) The width of narrow carved portion 301a is the narrowest in first waveguide 303a, and becomes wider in order of second waveguide 303b and third waveguide 303c.

A configuration where narrow carved portions 301a provided to waveguides 303a to 303c are linear has been assumed above. However, narrow carved portions 301a may be configured to be isolated. For example, a planar shape of narrow carved portion 301a may take a rectangular shape or other polygonal shapes. This is because, when the materials of different refractive indices are alternately provided each having a dimension equal to or less than a wavelength of light beams, phase shift functions of the waveguides are determined based on a value of a composition ratio between the materials independently of shapes of the materials.

Figure 30A:
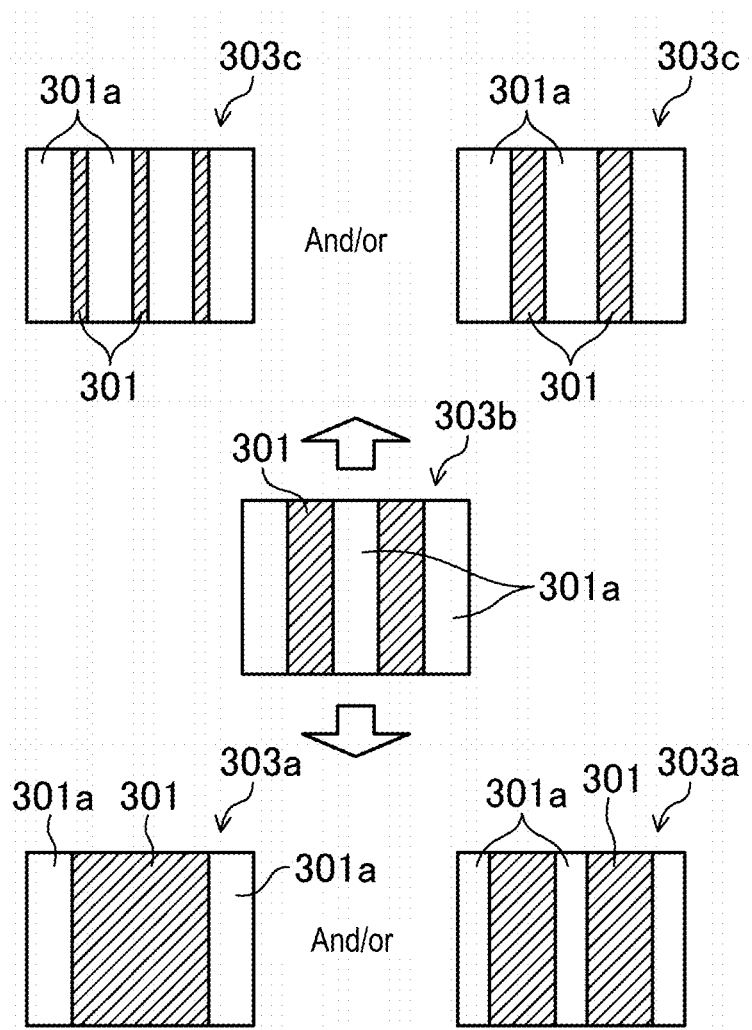
FIG. 30A is a schematic plan view illustrating a method of changing a layout for adjusting phases in the waveguide of the photomask according to the third exemplary embodiment.
Figure 30B:
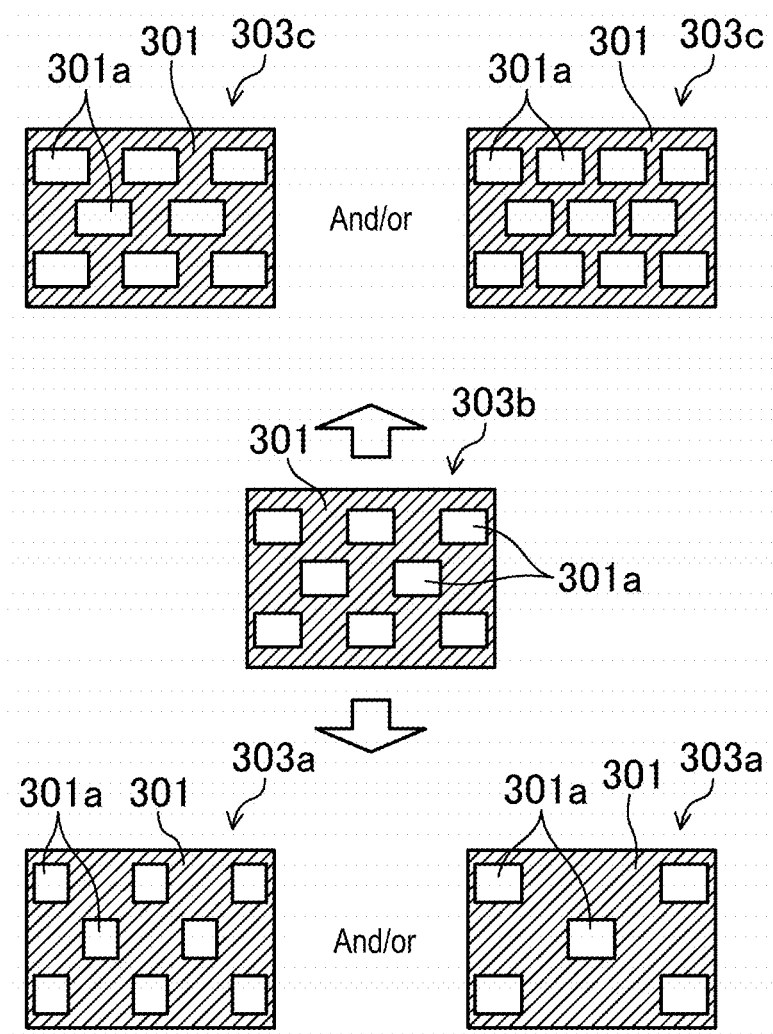
FIG. 30B is a schematic plan view illustrating the method of changing the layout for adjusting phases in the waveguide of the photomask according to the third exemplary embodiment.

FIG. 30A schematically illustrates a relationship between (1) and (2) when narrow carved portions 301a are linear patterns. FIG. 30B schematically illustrates a relationship between (1) and (2) when narrow carved portions 301a are isolated patterns. FIG. 30B illustrates an example where the patterns of narrow carved portions 301a are rectangular shapes when seen in a plan view.

Narrow carved portions 301a are cyclically arranged in waveguides 303a to 303b. To configure a plurality of narrow carved portions 301a as waveguides having phase shifter functions, an interval between adjacent narrow carved portions 301a is preferably shorter than an exposure wavelength. Further, short sides of narrow carved portion 301a are preferably shorter than the exposure wavelength. In this case, preferably, an area ratio which narrow carved portion 301a occupies in a predetermined region is preferably the highest in first waveguide 303a and becomes higher in order of second waveguide 303b and third waveguide 303c. When individual shapes of narrow carved portions 301a are formed in similar shapes, individual areas of and intervals between narrow carved portions 301a are preferably configured to satisfy a relationship of at least one of following (1) and (2).

(1) The interval between narrow carved portions 301a is the widest in first waveguide 303a, and becomes shorter in order of second waveguide 303b and third waveguide 303c.

(2) The area ratio of narrow carved portion 301a is the lowest in first waveguide 303a, and becomes higher in order of second waveguide 303b and third waveguide 303c.

In the present exemplary embodiment, a plurality of waveguides are composed of three waveguides 303a to 303c. However, a plurality of waveguides may be composed of two waveguides or four or more waveguides. Further, carving depths of narrow carved portions 301a are preferably equal to the exposure wavelength or more to cause the waveguides to sufficiently function as the phase shifter functions.

As described above, photomask 30 according to the present exemplary embodiment includes narrow carved portions 301a whose width dimensions are equal to the exposure wavelength or less, and waveguides 303a to 303c which are composed of regions between narrow carved portions 301a. Consequently, even when there is one type of carving depth of narrow carved portions 301a, phase shifters which can generate any phase can be configured.

Hence, by configuring photomask 30 according to the present exemplary embodiment to form a phase distribution on a propagation plane between a lens and an exposure object used for projection transfer exposure, it is possible to realize a high resolution in proximity exposure which uses photomask 30 similarly to the first exemplary embodiment and the second exemplary embodiment.

Further, according to the present exemplary embodiment, in a process of making narrow carved portions 301a in transparent substrate 301, the carving depths of narrow carved portions 301a may be all the same. Consequently, it is not necessary to perform a process of forming narrow carved portions a plurality of times unlike a case that a plurality of types of carving depths are used. Consequently, it is possible to substantially reduce time and effort required to make photomask 30.

A configuration where waveguides 303a to 303c are provided in transparent substrate 301 has been described above. However, a configuration where a transmissive film is provided to transparent substrate 301 and waveguides 303a to 303c are provided in the provided transmissive film may be employed.

Further, in respective waveguides, each region which generates the same phase is defined as one waveguide. That is, each region having the same interval and the same narrow carving width of narrow carved portion 301a is defined as one waveguide. Thus, the width of the waveguide provided far from main pattern 302 is preferably narrower than the width of the waveguide provided close to main pattern 302 similarly to the first exemplary embodiment and the second exemplary embodiment.

Further, similarly to modified example 2 of the second exemplary embodiment, a configuration where waveguides which generate a plurality of phases are cyclically provided with increasing distance from the main pattern is preferably employed to realize a high resolution. In this case, in waveguides which generate the same phase, i.e., waveguides which have the same interval and the same carving width of the narrow carved portions, the width of a waveguide positioned farther from the main pattern is narrower similarly to modified example 2 of the second exemplary embodiment.

Further, similarly to modified example 4 of the second exemplary embodiment, a plurality of waveguides may be configured by providing a semi-transparent film on a principal surface of a transparent substrate, providing an exposed surface portion as a main pattern at which the surface of the transparent substrate is exposed and forming narrow carved portions in the semi-transparent film. By so doing, it is possible to enhance amplitude intensities of light beams transmitted through the main pattern compared to amplitude intensities of light beams transmitted through a plurality of waveguides provided in a periphery of the main pattern. As a result, similarly to modified example 4 of the second exemplary embodiment, when there are figures of different dimensions, a light intensity distribution is effectively formed.

Further, similarly to modified example 5 of the second exemplary embodiment, a configuration may be employed where a semi-transparent film which adjusts transmittances of light beams and a transparent film which adjusts phases of light beams are sequentially stacked on the transparent substrate, an exposed surface portion at which the surface of the transparent substrate is exposed is provided at a position corresponding to the main pattern, and waveguides are provided to the transparent film in the periphery of the main pattern, with the semi-transparent film sandwiched between the transparent substrate and the transparent film. Thus, similarly to modified example 5 of the second exemplary embodiment, it is possible to easily obtain a structure which can realize desired transmittances and desired phases.

Particularly when the main pattern is a linear pattern, waveguides provided at positions sandwiching the linear pattern from both sides are preferably configured such that waveguides having the same phase shifter function make a pair symmetrically with respect to a center line of the linear pattern. This is the same as the first exemplary embodiment and the second exemplary embodiment.

Further, a light shield is preferably provided around a mask pattern opening including the main pattern and waveguides in the periphery of the main pattern similarly to the first exemplary embodiment and the second exemplary embodiment.

Furthermore, in the present exemplary embodiment and in each modified example, too, the main pattern in a region corresponding to a desired pattern is provided at an exposed surface portion at which the transparent substrate is exposed. This configuration is preferable to enhance light intensities in the main pattern, yet is not indispensable, similarly to the first exemplary embodiment and the second exemplary embodiment.

Fourth Exemplary Embodiment

The fourth exemplary embodiment will be described below with reference to FIGS. 31A and 31B.

Figure 31A:
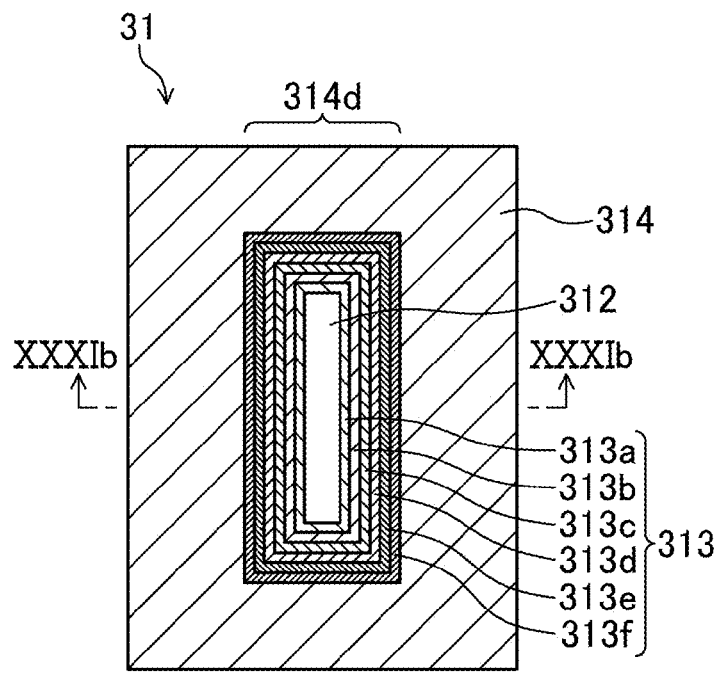
FIG. 31A is a plan view illustrating an example of a photomask according to a fourth exemplary embodiment.
Figure 31B:
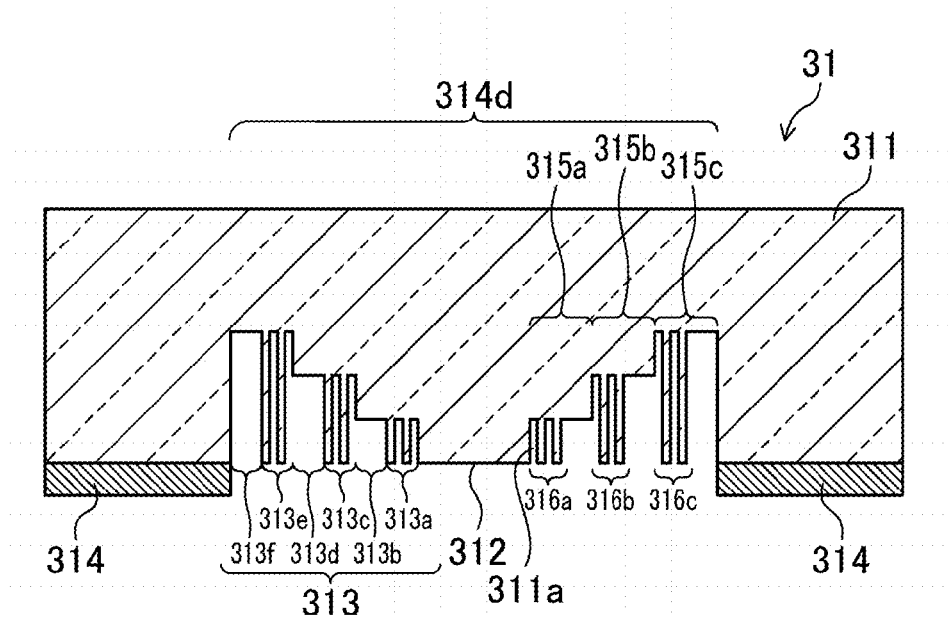
FIG. 31B is a sectional view along line XXXIb-XXXIb in FIG. 31A.

As illustrated in FIGS. 31A and 31B, photomask 31 according to the fourth exemplary embodiment includes a plurality of carved portions 315a, 315b and 315c in a periphery of main pattern 312 similarly to the second exemplary embodiment. Carving depths of carved portions 315a to 315c sequentially become deeper with increasing distance from main pattern 312.

Further, similarly to the third exemplary embodiment, waveguides 316a, 316b and 316c are provided on a main pattern 312 side of carved portions 315a to 315c. More specifically, first waveguide 316a is formed on the main pattern 312 side in first carved portion 315a adjacent to main pattern 312 to compose first phase shifter 313a. An outer side portion in first carved portion 315a is a normal carved portion and composes second phase shifter 313b.

Similarly, second waveguide 316b is formed on the main pattern 312 side in second carved portion 315b to compose third phase shifter 313c. An outer side portion in second carved portion 315b is a normal carved portion and composes fourth phase shifter 313d. Further, third waveguide 316c is formed on the main pattern 312 side in third carved portion 315c to compose fifth phase shifter 313e. An outer side portion in third carved portion 315c is a normal carved portion and composes sixth phase shifter 313f. According to this configuration, phase planes of exposure light beams sequentially advance in a plurality of phase shifters 313a to 313f with increasing distance from main pattern 312.

That is, in the present exemplary embodiment, it is possible to provide a phase shifter function which generates a plurality of phase changes, to each of carved portions 315a to 315c. In examples illustrated in FIGS. 31A and 31B, first waveguide 316a which generates one phase change is provided to a ½ region of first carved portion 315a on a side close to main pattern 312. The same applies to second carved portion 315b and third carved portion 315c. According to this configuration, phases of light beams are delayed in first waveguide 316a of first carved portion 315a compared to the rest of simple carved portion 315a. The same applies to second carved portion 315b and third carved portion 315c.

In addition, a width of each of simple carved portions 315a to 315c is preferably equal to an exposure wavelength or more. By employing such a configuration, for example, upon comparison between the ½ region on the side close to main pattern 312 and the rest region on a far side in first carved portion 315a, phase planes of exposure light beams advance more in the region on the far side.

Hence, by providing second waveguide 316b and third waveguide 316c to second carved portion 315b and third carved portion 315c likewise, a plurality of phases are produced in each of carved portions 315a to 315c. In addition, phase planes of exposure light beams transmitted through phase shifters 313a to 313f can advance more with increasing distance from main pattern 312.

An example where one type of a waveguide is provided to one carved portion has been described in the present exemplary embodiment. However, a plurality of types of waveguides may be provided to one carved portion. Further, a width dimension of narrow carved portion 311a which composes each waveguide, and a thickness of a region between narrow carved portions 311a in transparent substrate 311 are preferably equal to the exposure wavelength or less similarly to the third exemplary embodiment.

Furthermore, similarly to the third exemplary embodiment, a plurality of waveguides provided to one carved portion are preferably configured to satisfy a relationship of at least one of following (1) and (2).

(1) The interval between narrow carved portions 311a is longer near the main pattern, and sequentially becomes shorter with increasing distance from the main pattern.

(2) The width between narrow carved portions 311a is narrower near the main pattern, and sequentially becomes wider with increasing distance from the main pattern.

A configuration where carved portions each including a waveguide are provided to the transparent substrate has been described above. However, a configuration where different transmissive films are provided to the transparent substrate and carved portions each including a waveguide are provided to the provided transmissive films may be employed.

Particularly when the main pattern is a linear pattern, carved portions which are provided at positions sandwiching the linear pattern from both sides and include waveguides are preferably configured such that carved portions having the same depth or waveguides adopting the same structure form a pair symmetrically with respect to a center line of the linear pattern. The same applies to the second exemplary embodiment and the third exemplary embodiment.

Further, light shield 314 is preferably provided around mask pattern opening 314d including main pattern 312 and phase shifters 313a to 313f in the periphery of main pattern 312 similarly to the second exemplary embodiment and the third exemplary embodiment.

Furthermore, in the present exemplary embodiment and in the modified examples, too, main pattern 312 is provided with an exposed surface portion at which transparent substrate 311 is exposed. This configuration is preferable to enhance light intensities in main pattern 312, yet is not indispensable, similarly to the second exemplary embodiment and the third exemplary embodiment.

Further, similarly to modified example 4 of the second exemplary embodiment, in the fourth exemplary embodiment, too, a plurality of phase shifters may be configured by providing a semi-transparent film on a principal surface of a transparent substrate, providing an exposed surface portion as a main pattern at which the surface of the transparent substrate is exposed and forming carved portions including waveguides on the semi-transparent film. By so doing, it is possible to enhance amplitude intensities of light beams transmitted through the main pattern compared to amplitude intensities of light beams transmitted through a plurality of carved portions which are provided in a periphery of the main pattern and include the waveguides. As a result, similarly to modified example 4 of the second exemplary embodiment, when there are figures of different dimensions, a light intensity distribution is effectively formed.

Further, similarly to modified example 5 of the second exemplary embodiment, in the fourth exemplary embodiment, too, a configuration may be employed where a semi-transparent film which adjusts transmittances of light beams and a transparent film which adjusts phases of light beams are sequentially stacked on the transparent substrate, an exposed surface portion at which the surface of the transparent substrate is exposed is provided at a position corresponding to the main pattern, and carved portions including waveguides are provided in the transparent film in the periphery of the main pattern, with the semi-transparent film sandwiched between the transparent substrate and the transparent film. Thus, similarly to modified example 5 of the second exemplary embodiment, it is possible to easily obtain a structure which can realize desired transmittances and desired phases.

Fifth Exemplary Embodiment

The fifth exemplary embodiment will be described below with reference to FIGS. 32A and 32B.

Figure 32A:
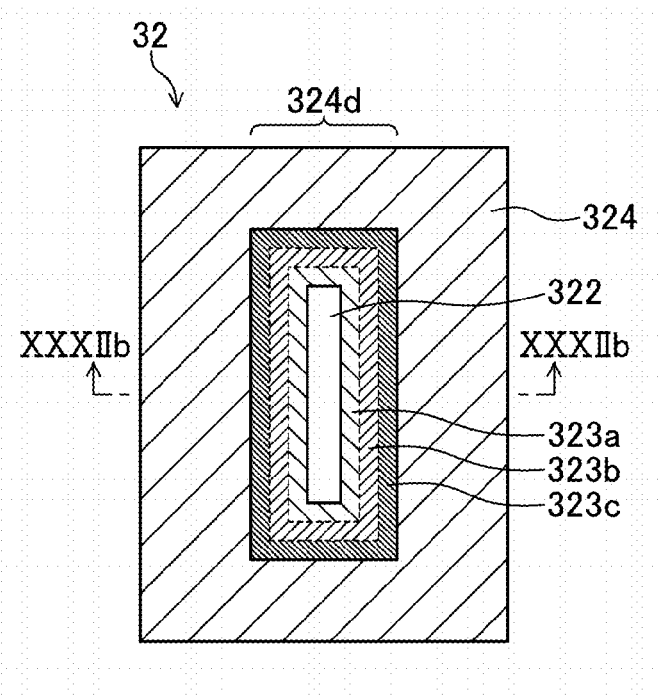
FIG. 32A is a plan view illustrating an example of a photomask according to a fifth exemplary embodiment.
Figure 32B:
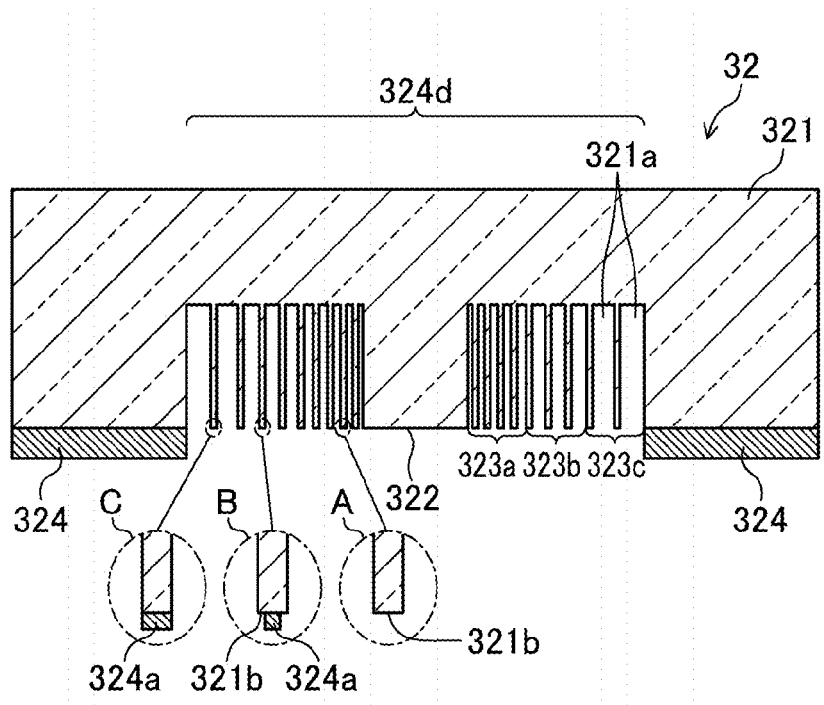
FIG. 32B is a sectional view along line XXXIIb-XXXIIb in FIG. 32A.

As illustrated in FIGS. 32A and 32B, photomask 32 according to the fifth exemplary embodiment includes a plurality waveguides 323a to 323c in a periphery of main pattern 322 corresponding to a desired pattern similarly to the third exemplary embodiment. Each of waveguides 323a to 323c adopts such a structure that phase planes of exposure light beams sequentially advance with increasing distance from main pattern 322.

Photomask 32 according to the fifth exemplary embodiment differs from photomask 30 according to the third exemplary embodiment in that light shields 324a formed of light shielding films are selectively provided in mask pattern opening 324d and on surfaces (exposed portions 321b) in a region between narrow carved portions 321a which compose each of waveguides 323a to 323c on transparent substrate 321 made of glass or quartz.

In the present exemplary embodiment, first waveguide 323a positioned close to main pattern 322 which is an exposed surface portion is not provided with light shield 324a. Light shields 324a are partially provided to exposed portions 321b of second waveguide 323b on an outer side of first waveguide 323a. Further, light shields 324a are provided to entire surfaces of exposed portions 321b of third waveguide 323c on an outer side of second waveguide 323b.

FIG. 32B illustrates an enlarged sectional view of exposed portion 321b of first waveguide 323a as region A, an enlarged sectional view of exposed portion 321b and light shield 324a of second waveguide 323b as region B, and an enlarged sectional view of light shield 324a of third waveguide 323c as region C.

Figure 33:
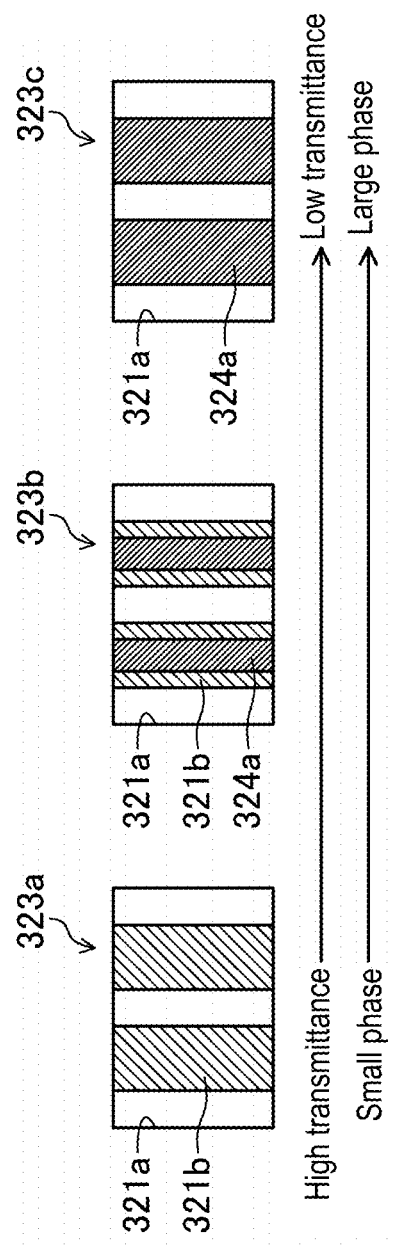
FIG. 33 is a schematic enlarged plan view illustrating the layout of each waveguide of the photomask according to the fifth exemplary embodiment.

FIG. 33 illustrates enlarged layouts of waveguides 323a to 323c. As illustrated in FIG. 33, in first waveguide 323a, narrow carved portions 321a and exposed portions 321b of transparent substrate 321 are alternately aligned. In second waveguide 323b, narrow carved portions 321a and exposed portions 321b of transparent substrate 321 are alternately aligned, and light shields 324a are selectively provided to center portions of exposed portions 321b of transparent substrate 321. In third waveguide 323c, narrow carved portions 321a and light shields 324a are alternately aligned.

Thus, according to photomask 32 according to the present exemplary embodiment, a rate of light shields 324a in waveguides 323a to 323c is increased with increasing distance from a main pattern which is a desired pattern. Thus, it is possible to lower amplitude intensities, i.e., effective transmittances of light beams transmitted through waveguides 323a to 323c with increasing distance from main pattern 322.

More specifically, as illustrated in FIG. 33, the effective transmittances of light beams of waveguides 323a to 323c lower in order of first waveguide 323a, second waveguide 323b and third waveguide 323c, i.e., from first waveguide 323a provided at a position close to the main pattern to far third waveguide 323c.

In addition, an example where the entire surface of transparent substrate 321 is exposed in first waveguides 323a, and entire transparent substrate 321 in third waveguide 323c is covered by light shield 324 has been described. However, the present disclosure is not limited to this. For example, a configuration where, similarly to second waveguide 323b, light shields 324 are partially provided to center portions of exposed portions 321b of transparent substrate 321 in all waveguides 323a to 323c may be employed. In this case, the width of light shields 324a partially provided to the center portions of exposed portions 321b which compose waveguides 323a to 323c in transparent substrate 321 is the narrowest in first waveguide 323a, and becomes wider in order of second waveguide 323b and third waveguide 323c. Thus, effective transmittances of light beams of waveguides 323a to 323c lower with increasing distance from main pattern 322.

In the third exemplary embodiment and the fourth exemplary embodiment, a function which adjusts phases of light beams based on a value of a composition ratio between air filled in a narrow carved portion and a transparent substrate is introduced to a waveguide. In the present exemplary embodiment, a function which adjusts transmittances of light beams based on a value of a composition ratio among exposed portion 321b of transparent substrate 321 on the principal surface of photomask 32, narrow carved portion 321a and light shield 324a is further introduced.

In this regard, variations of layouts of narrow carved portion 321a, light shield 324a and exposed portion 321b of transparent substrate 321 in a case where light shield 324a is configured to cover part of exposed portion 321b in a region between narrow carved portions 321a in transparent substrate 321 as in the sectional structure illustrated in FIG. 32B will be described with reference to FIGS. 34A to 39I.

Effective phases and transmittances of light beams in waveguides 323a to 323c can be approximated as follows. In this regard, d represents a depth of narrow carved portion 321a, λ represents an exposure wavelength, n0 represents an air refractive index and n1 represents a refractive index of transparent substrate 321. AT represents an area of narrow carved portion 321a, AS represents an area of exposed portion 321b on the principal surface of transparent substrate 321 and AD represents an area of light shield 324a.

Effective Refractive Index=$(n0 \times AT + n1 \times (AS+AD))/(AT+AS+AD)$

Effective Phase Shift=$d/\lambda \times$(Effective Refractive Index$-n0$)

Effective Transmittance=$(AT+AS)/(AT+AS+AD)$

In this regard, narrow carved portion 321a, exposed portion 321b of the principal surface of transparent substrate 321 and light shield 324a are preferably repeatedly arranged per 1.5-fold dimension of an exposure wavelength. This is because, by so doing, an average dimension of each portion can be made equal to the exposure wavelength or less, and the respective portions can be used as a material having average optical characteristics as a whole instead of optical characteristics of individual members.

FIGS. 34A to 34E illustrate various modified examples in a case where narrow carved portion 321a which composes a waveguide formed in transparent substrate 321 is formed as a linear pattern. Process flows and features of layouts of photomask 32 according to these modified examples will be described.

Figure 34A:
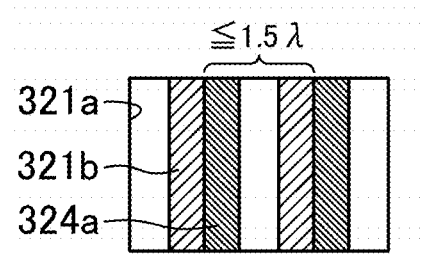
FIG. 34A is a schematic enlarged plan view illustrating a modified example of a layout for adjusting an effective transmittance of the waveguide of the photomask according to the fifth exemplary embodiment.

FIG. 34A illustrates a first layout including a waveguide in which narrow carved portion 321a, exposed portion 321b of transparent substrate 321 and light shield 324a are cyclically provided in order.

A process flow of making photomask 32 having the first layout illustrated in FIG. 34A will be described with reference to FIGS. 35A to 35I.

Figure 35A:
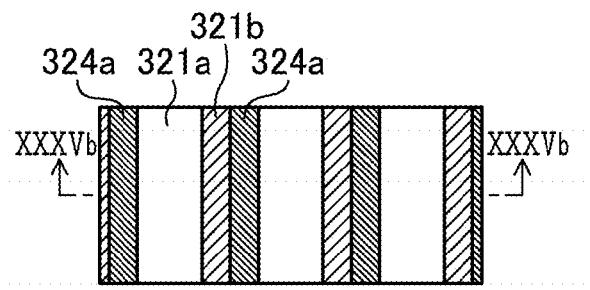
FIG. 35A is a schematic enlarged plan view illustrating the waveguide of the photomask corresponding to the layout in FIG. 34A.
Figure 35B:
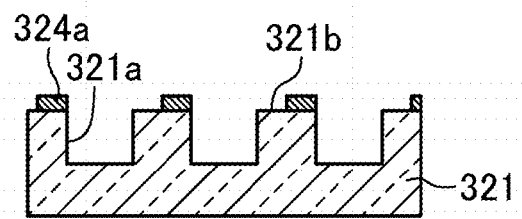
FIG. 35B is a sectional view along line XXXVb-XXXVb in FIG. 35A.

FIGS. 35A and 35B illustrate the first layout in FIG. 34A again. FIG. 35B illustrates a sectional configuration along line XXXVb-XXXVb in FIG. 35A. FIGS. 35C to 35I illustrate the process flow of photomask 32 employing the present configuration. Each sectional view corresponds to a cross section along line XXXVb-XXXVb in FIG. 35A.

Figure 35C:
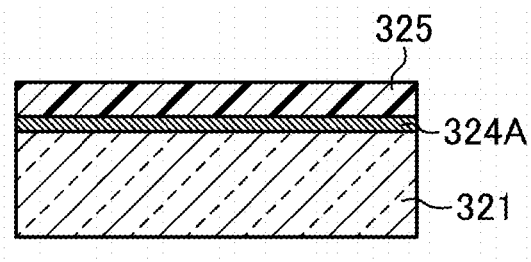
FIG. 35C is a sectional view of an order of processes indicating a method of making the waveguides of the photomask corresponding to the layout in FIG. 34A.

First, as illustrated in FIG. 35C, light shielding film 324A is formed on transparent substrate 321. Subsequently, first resist film 325 is formed by coating on light shielding film 324A.

Figure 35D:
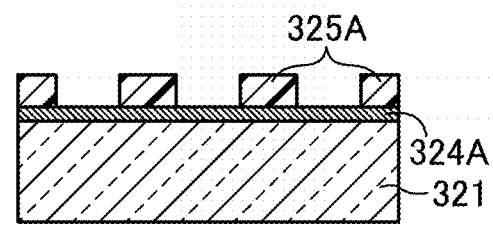
FIG. 35D is a sectional view of the order of the processes indicating the method of making the waveguides of the photomask corresponding to the layout in FIG. 34A.

Next, as illustrated in FIG. 35D, first resist patterns 325A are formed from first resist film 325 by the lithography method with openings provided in formation regions of narrow carved portions 321a. FIG. 35H illustrates a planar layout of first resist pattern 325A in this case.

Figure 35E:
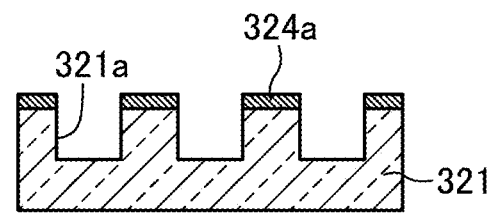
FIG. 35E is a sectional view of the order of the processes indicating the method of making the waveguides of the photomask corresponding to the layout in FIG. 34A.

Next, as illustrated in FIG. 35E, light shielding film 324A and transparent substrate 321 are etched with use of first resist patterns 325A as masks to form a plurality of light shields 324a and a plurality of narrow carved portions 321a on transparent substrate 321.

Figure 35F:
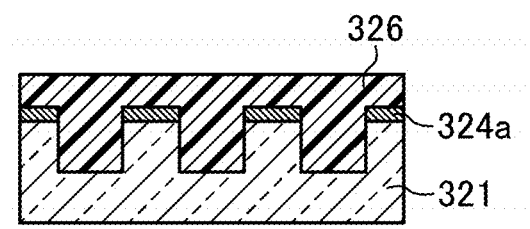
FIG. 35F is a sectional view of the order of the processes indicating the method of making the waveguides of the photomask corresponding to the layout in FIG. 34A.

Next, as illustrated in FIG. 35F, second resist film 326 is formed by coating on transparent substrate 321 in which narrow carved portions 321a have been formed.

Figure 35G:
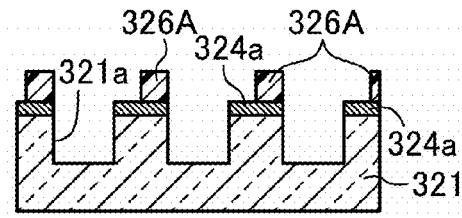
FIG. 35G is a sectional view of the order of the processes indicating the method of making the waveguides of the photomask corresponding to the layout in FIG. 34A.
Figure 35H:
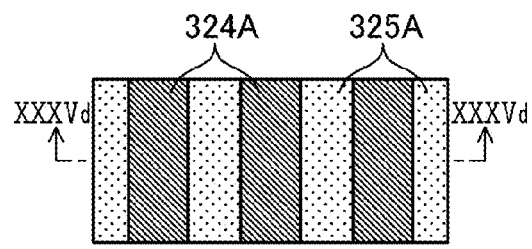
FIG. 35H is a plan view of the process in FIG. 35D.
Figure 35I:
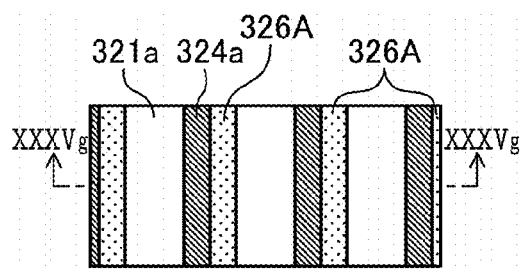
FIG. 35I is a plan view of the process in FIG. 35G.

Next, as illustrated in FIG. 35G, second resist patterns 326A are formed from second resist film 326 by the lithography method with openings provided to expose narrow carved portions 321a and regions of light shields 324a, the regions being about half in one side of light shields 324a in a stretching direction (line direction). FIG. 35I illustrates a planar layout of second resist pattern 326A in this case. Subsequently, light shields 324a are etched with use of second resist patterns 326A as masks to obtain the layout illustrated in FIGS. 35A and 35B.

The first layout is the simplest layout and, even when a fine dimension is formed upon a mask manufacturing process, does not require a fine dimension in a resist pattern and a resist space pattern formed in exposure and development processes.

Figure 34B:
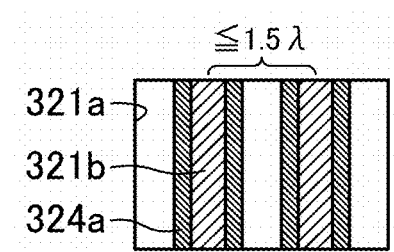
FIG. 34B is a schematic enlarged plan view illustrating a modified example of a layout for adjusting an effective transmittance of the waveguide of the photomask according to the fifth exemplary embodiment.

FIG. 34B illustrates a second layout including waveguides in which light shields 324a are arranged at boundaries between narrow carved portions 321a and exposed portions 321b of transparent substrate 321.

A process flow of making photomask 32 having the second layout illustrated in FIG. 34B will be described with reference to FIGS. 36A to 36I.

Figure 36A:
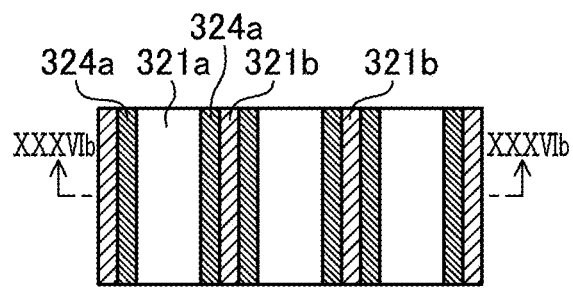
FIG. 36A is a schematic enlarged plan view illustrating the waveguide of the photomask corresponding to the layout in FIG. 34B.
Figure 36B:
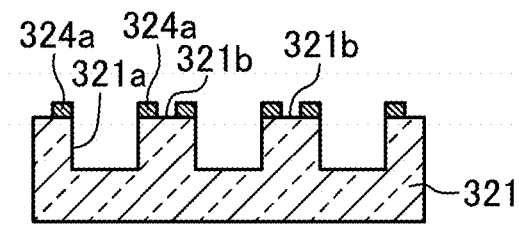
FIG. 36B is a sectional view along line XXXVIb-XXXVIb in FIG. 36A.

FIGS. 36A and 36B illustrate the second layout in FIG. 34B again. FIG. 36B illustrates a sectional configuration along line XXXVIb-XXXVIb in FIG. 36A. FIGS. 36C to 36I illustrate a process flow of photomask 32 employing the present configuration. Each sectional view corresponds to a cross section along line XXXVIb-XXXVIb in FIG. 36A.

Figure 36C:
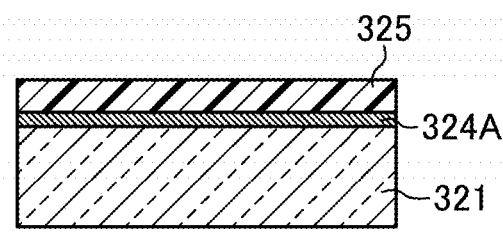
FIG. 36C is a sectional view of an order of processes indicating a method of making the waveguides of the photomask corresponding to the layout in FIG. 34B.

First, as illustrated in FIG. 36C, light shielding film 324A is formed on transparent substrate 321. Subsequently, first resist film 325 is formed by coating on light shielding film 324A.

Figure 36D:
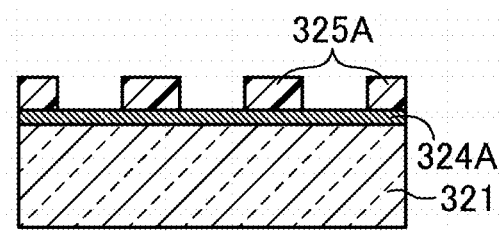
FIG. 36D is a sectional view of an order of processes indicating the method of making the waveguides of the photomask corresponding to the layout in FIG. 34B.

Next, as illustrated in FIG. 36D, first resist patterns 325A are formed from first resist film 325 by the lithography method with openings provided in formation regions of narrow carved portions 321a. FIG. 36H illustrates a planar layout of first resist pattern 325A in this case.

Figure 36E:
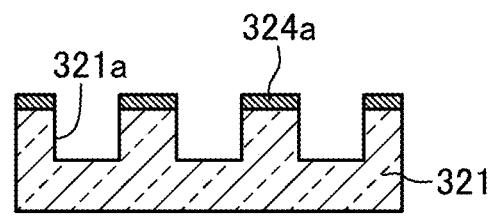
FIG. 36E is a sectional view of an order of processes indicating the method of making the waveguides of the photomask corresponding to the layout in FIG. 34B.

Next, as illustrated in FIG. 36E, light shielding film 324A and transparent substrate 321 are etched with use of first resist patterns 325A as masks to form a plurality of light shields 324a and a plurality of narrow carved portions 321a in transparent substrate 321.

Figure 36F:
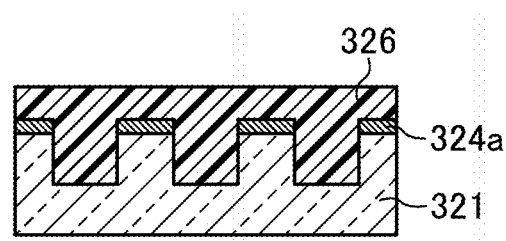
FIG. 36F is a sectional view of an order of processes indicating the method of making the waveguides of the photomask corresponding to the layout in FIG. 34B.

Next, as illustrated in FIG. 36F, second resist film 326 is formed by coating on transparent substrate 321 in which narrow carved portions 321a have been formed.

Figure 36G:
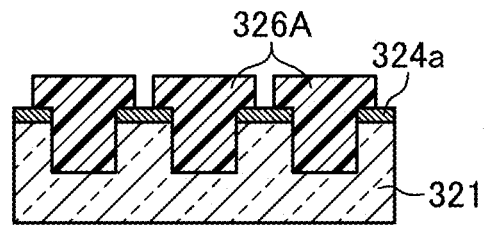
FIG. 36G is a sectional view of an order of processes indicating the method of making the waveguides of the photomask corresponding to the layout in FIG. 34B.
Figure 36H:
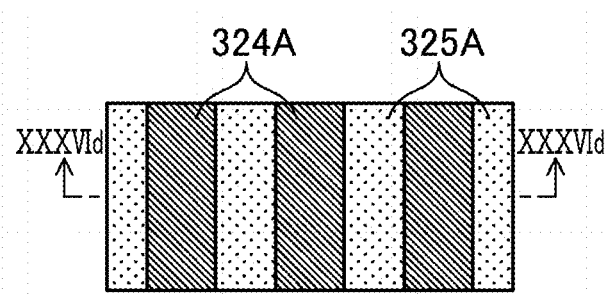
FIG. 36H is a plan view of the process in FIG. 36D.
Figure 36I:
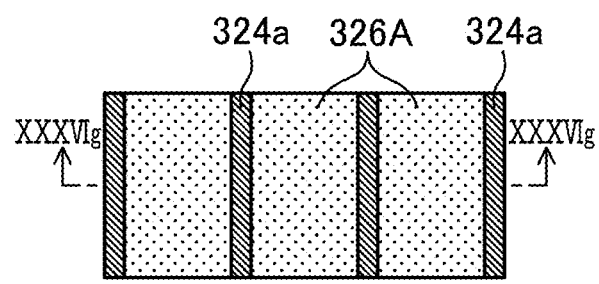
FIG. 36I is a plan view of the process in FIG. 36G.

Next, as illustrated in FIG. 36G, second resist patterns 326A are formed from second resist film 326 by the lithography method with openings provided to expose center portions of light shields 324a in the stretching direction (line direction). FIG. 36I illustrates a planar layout of second resist pattern 326A in this case. Subsequently, light shields 324a are etched with use of second resist patterns 326A as masks to obtain the layout illustrated in FIGS. 36A and 36B.

The feature of the second layout is that exposed portions 321b of transparent substrate 321 are arranged at the center portions of light shields 324a in the stretching direction. Thus, in a second resist patterning process illustrated as the sectional configuration in FIG. 36G and the planar configuration in FIG. 36I, it is possible to provide a margin corresponding to the widths of light shields 324a when an opening pattern to be provided on second resist pattern 326A is aligned.

That is, even when misalignment occurs upon removal of the center portion of each light shield 324a, unless the misalignment occurs to such a degree that light shields 324a that are to be finally left are removed, a ratio among narrow carved portions 321a, light shields 324a and exposed portions 321b of transparent substrate 321 does not change. Hence, photomask 32 having the second layout provides an effect that, even when the misalignment is caused at the first and second resist patterning in the mask making process, effective phases and transmittances do not change.

Figure 34C:
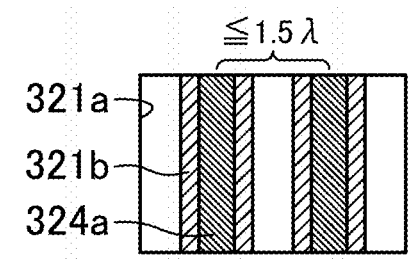
FIG. 34C is a schematic enlarged plan view illustrating a modified example of a layout for adjusting an effective transmittance of the waveguide of the photomask according to the fifth exemplary embodiment.

FIG. 34C illustrates a third layout including waveguides formed by arranging exposed portions 321b of transparent substrate 321 at boundaries between narrow carved portions 321a and light shields 324a.

A process flow of making photomask 32 having the third layout illustrated in FIG. 34C will be described with reference to FIGS. 37A to 37I.

Figure 37A:
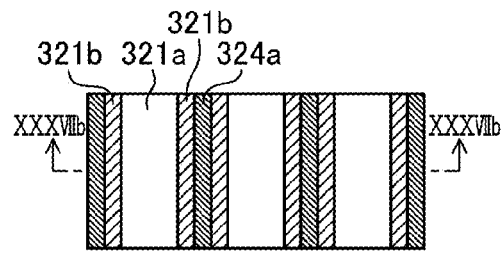
FIG. 37A is a schematic enlarged plan view illustrating the waveguide of the photomask corresponding to the layout in FIG. 34C.
Figure 37B:
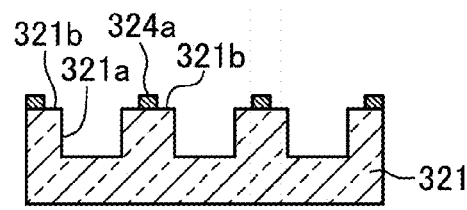
FIG. 37B is a sectional view along line XXXVIIb-XXXVIIb in FIG. 37A.

FIGS. 37A and 37B illustrate the third layout in FIG. 34C again. FIG. 37B illustrates a sectional configuration along line XXXVIIb-XXXVIIb in FIG. 37A. FIGS. 37C to 37I illustrate the process flow of photomask 32 employing the present configuration. Each sectional view corresponds to a cross section along line XXXVIIb-XXXVIIb in FIG. 37A.

Figure 37C:
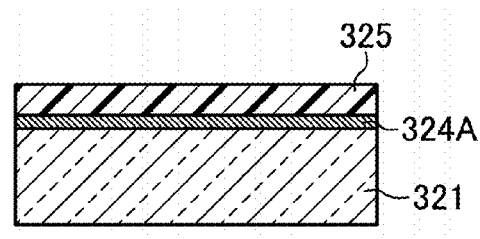
FIG. 37C is a sectional view of an order of processes indicating a method of making the waveguides of the photomask corresponding to the layout in FIG. 34C.

First, as illustrated in FIG. 37C, light shielding film 324A is formed on transparent substrate 321. Subsequently, first resist film 325 is formed by coating on light shielding film 324A.

Figure 37D:
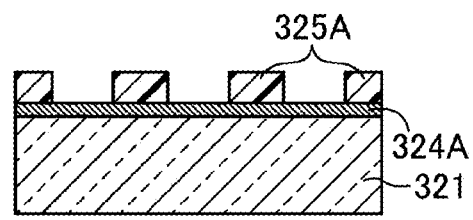
FIG. 37D is a sectional view of the order of processes indicating the method of making the waveguides of the photomask corresponding to the layout in FIG. 34C.

Next, as illustrated in FIG. 37D, first resist patterns 325A are formed from first resist film 325 by the lithography method with openings provided in formation regions of narrow carved portions 321a. FIG. 37H illustrates a planar layout of first resist pattern 325A in this case.

Figure 37E:
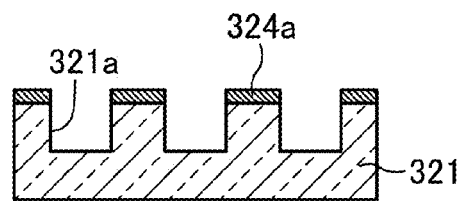
FIG. 37E is a sectional view of the order of processes indicating the method of making the waveguides of the photomask corresponding to the layout in FIG. 34C.

Next, as illustrated in FIG. 37E, light shielding film 324A and transparent substrate 321 are etched with use of first resist patterns 325A as masks to form a plurality of light shields 324a and a plurality of narrow carved portions 321a on transparent substrate 321.

Figure 37F:
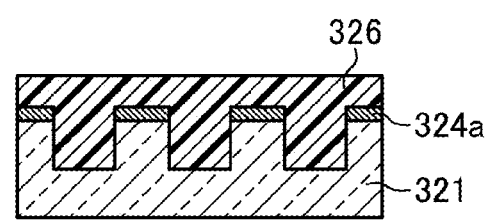
FIG. 37F is a sectional view of the order of processes indicating the method of making the waveguides of the photomask corresponding to the layout in FIG. 34C.

Next, as illustrated in FIG. 37F, second resist film 326 is formed by coating on transparent substrate 321 in which narrow carved portions 321a have been formed.

Figure 37G:
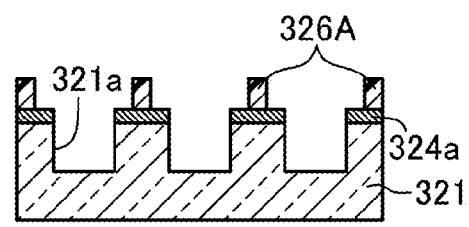
FIG. 37G is a sectional view of the order of processes indicating the method of making the waveguides of the photomask corresponding to the layout in FIG. 34C.
Figure 37H:
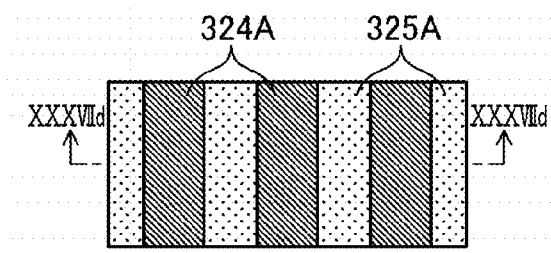
FIG. 37H is a plan view of the process in FIG. 37D.
Figure 37I:
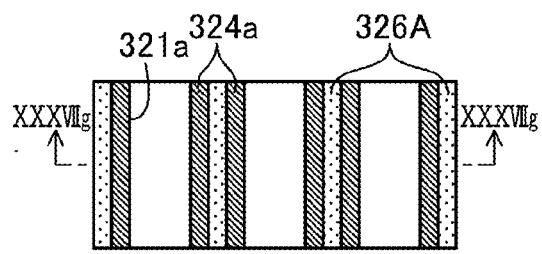
FIG. 37I is a plan view of the process in FIG. 37G.

Next, as illustrated in FIG. 37G, second resist patterns 326A are formed from second resist film 326 by the lithography method, to mask center portions of light shields 324a in the stretching direction (line direction). FIG. 37I illustrates a planar layout of second resist pattern 326A in this case. Subsequently, light shields 324a are etched with use of second resist patterns 326A as masks to obtain the layout illustrated in FIGS. 37A and 37B.

The feature of the third layout is that light shields 324a are arranged on center portions of exposed portions 321b of transparent substrate 321. Thus, in a second resist patterning process illustrated as the sectional configuration in FIG. 37G and the planar configuration in FIG. 37I, it is possible to provide a margin corresponding to widths of exposed portions 321b of transparent substrate 321 when an opening pattern provided to second resist pattern 326A is aligned.

That is, even when misalignment occurs at a portion at which each light shield 324a is to be left, unless the portion is not misaligned to such a degree that exposed portions 321b of transparent substrate 321 which are to be finally left are removed, a ratio among narrow carved portions 321a, light shields 324a and exposed portions 321b of transparent substrate 321 does not change. Hence, photomask 32 having the third layout provides an effect that, even when the misalignment is caused at the first and second resist patterning in the mask making process, effective phases and transmittances do not change.

Figure 34D:
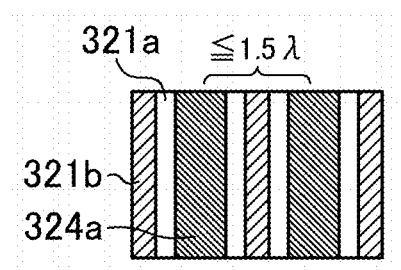
FIG. 34D is a schematic enlarged plan view illustrating a modified example of a layout for adjusting an effective transmittance of the waveguide of the photomask according to the fifth exemplary embodiment.

FIG. 34D illustrates a fourth layout including waveguides in which narrow carved portions 321a are arranged at boundaries between exposed portions 321b of transparent substrate 321 and light shields 324a. Narrow carved portion 321a of the fourth layout differs from narrow carved portions 321a of the first to third layouts in a planar shape. For example, exposed portion 321b on the surface of transparent substrate 321 is formed along a center portion of narrow carved portion 321a in the stretching direction (line direction) in narrow carved portion 321a of the fourth layout.

A process flow of making photomask 32 having the fourth layout illustrated in FIG. 34D will be described with reference to FIGS. 38A to 38I.

Figure 38A:
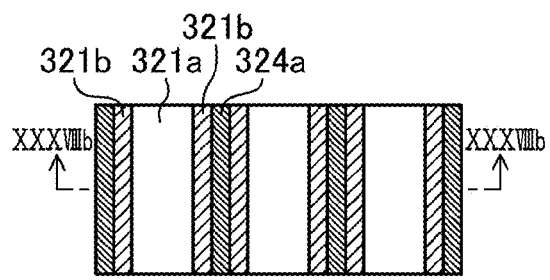
FIG. 38A is a schematic enlarged plan view illustrating the waveguide of the photomask corresponding to the layout in FIG. 34D.
Figure 38B:
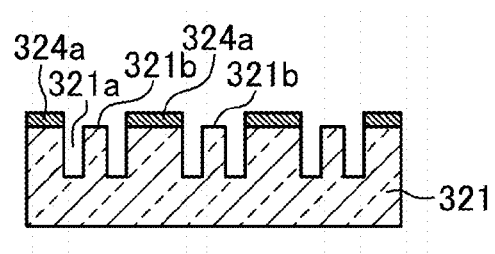
FIG. 38B is a sectional view along line XXXVIIIb-XXXVIIIb in FIG. 38A.

FIGS. 38A and 38B illustrate the fourth layout in FIG. 34D again. FIG. 38B illustrates a sectional configuration along line XXXVIIIb-XXXVIIIb in FIG. 38A. FIGS. 38C to 38I illustrate the process flow of photomask 32 employing the present configuration. Each sectional view corresponds to a cross section along line XXXVIIIb-XXXVIIIb in FIG. 38A.

Figure 38C:
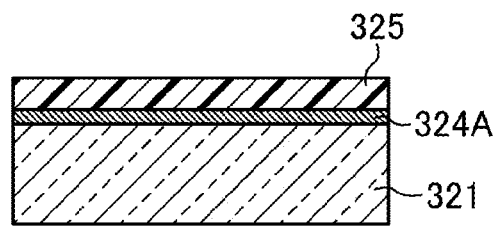
FIG. 38C is a sectional view of an order of processes indicating a method of making the waveguides of the photomask corresponding to the layout in FIG. 34D.

First, as illustrated in FIG. 38C, light shielding film 324A is formed on transparent substrate 321. Subsequently, first resist film 325 is formed by coating on light shielding film 324A.

Figure 38D:
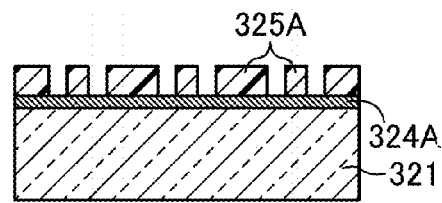
FIG. 38D is a sectional view of the order of processes indicating the method of making the waveguides of the photomask corresponding to the layout in FIG. 34D.

Next, as illustrated in FIG. 38D, first resist patterns 325A are formed from first resist film 325 by the lithography method with openings provided on formation regions of narrow carved portions 321a. FIG. 38H illustrates a planar layout of first resist pattern 325A in this case.

Figure 38E:
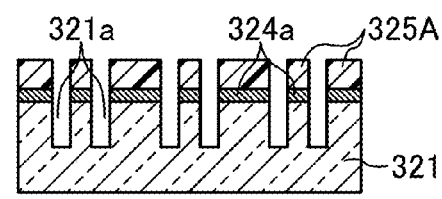
FIG. 38E is a sectional view of the order of processes indicating the method of making the waveguides of the photomask corresponding to the layout in FIG. 34D.

Next, as illustrated in FIG. 38E, light shielding film 324A and transparent substrate 321 are etched with use of first resist patterns 325A as masks to form a plurality of light shields 324a and a plurality of narrow carved portions 321a on transparent substrate 321.

Figure 38F:
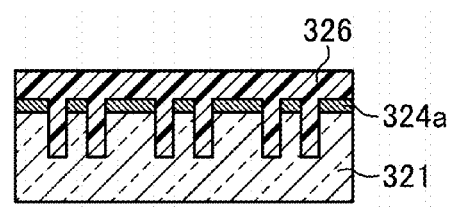
FIG. 38F is a sectional view of the order of processes indicating the method of making the waveguides of the photomask corresponding to the layout in FIG. 34D.

Next, as illustrated in FIG. 38F, second resist film 326 is formed by coating on transparent substrate 321 on which narrow carved portions 321a have been formed.

Figure 38G:
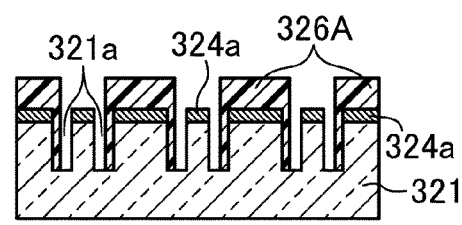
FIG. 38G is a sectional view of the order of processes indicating the method of making the waveguides of the photomask corresponding to the layout in FIG. 34D.
Figure 38H:
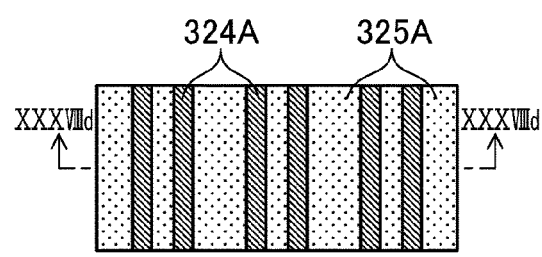
FIG. 38H is a plan view of the process in FIG. 38D.
Figure 38I:
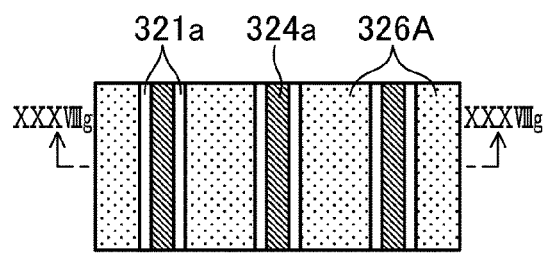
FIG. 38I is a plan view of the process in FIG. 38G.

Next, as illustrated in FIG. 38G, second resist patterns 326A are formed from second resist film 326 by the lithography method, to expose light shields 324a which cover exposed portions 321b of transparent substrate 321, exposed portions 321b sandwiched by narrow carved portions 321a which are close to each other. FIG. 38I illustrates a planar layout of second resist pattern 326A in this case. Subsequently, light shields 324a are etched with use of second resist patterns 326A as masks to obtain the layout illustrated in FIGS. 38A and 38B.

The feature of the fourth layout is a structure in which exposed portions 321b of transparent substrate 321 and light shields 324a are isolated by narrow carved portions 321a. Consequently, in the second resist patterning process illustrated as the sectional configuration in FIG. 38G and the planar configuration in FIG. 38I, it is possible to provide a margin corresponding to widths of narrow carved portions 321a for alignment and a process dimension of second resist patterns 326A.

That is, even when misalignment and a dimension mistake caused by a dimension error occur at portions at which light shields 324a are removed, as long as pattern edges are included in narrow carved portions 321a, a ratio among narrow carved portions 321a, light shields 324a and exposed portions 321b of transparent substrate 321 does not change. Hence, photomask 32 having the fourth layout provides an effect that, even when the misalignment is caused at the first and second patterning or a dimension error is caused at the second patterning when a mask is made, effective phases and transmittances do not change.

Figure 34E:
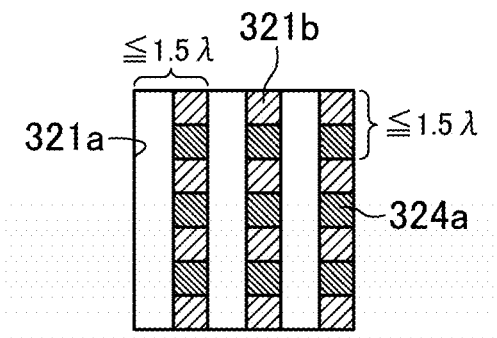
FIG. 34E is a schematic enlarged plan view illustrating a modified example of a layout for adjusting an effective transmittance of the waveguide of the photomask according to the fifth exemplary embodiment.

FIG. 34E illustrates a fifth layout including waveguides in which isolated light shields 324a are cyclically arranged on exposed portions 321b of transparent substrate 321 and along the stretching direction (line direction) of exposed portions 321b.

A process flow of making photomask 32 having the fifth layout illustrated in FIG. 34E will be described with reference to FIGS. 39A to 39I.

Figure 39A:
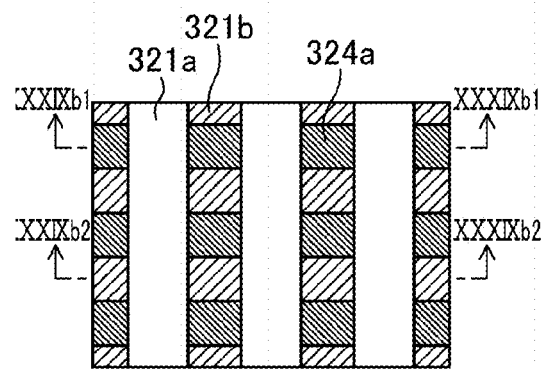
FIG. 39A is a schematic enlarged plan view illustrating the waveguide of the photomask corresponding to the layout in FIG. 34E.
Figure 39A:
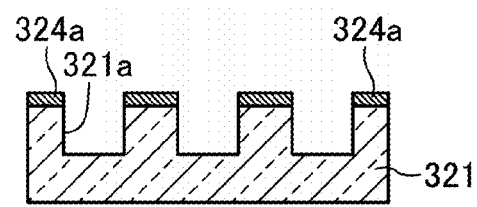
Figure 39A:
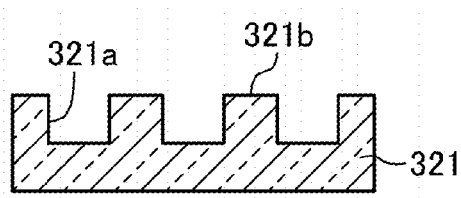

FIGS. 39A and 39B illustrate the fifth layout in FIG. 34E again. FIG. 39B1 illustrates a sectional configuration along line XXXIXb1-XXXIXb1 in FIG. 39A. FIG. 39B2 illustrates a sectional configuration along line XXXIXb2-XXXIXb2 in FIG. 39A. FIGS. 39C to 39I illustrate the process flow of photomask 32 employing the present configuration. Each sectional view corresponds to a cross section along line XXXIXb1-XXXIXb1 in FIG. 39A.

Figure 39C:
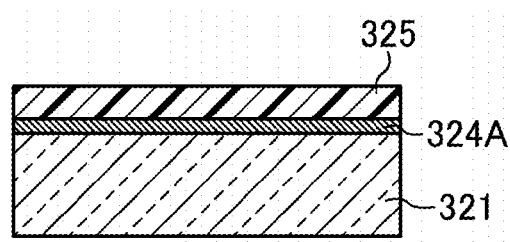
FIG. 39C is a sectional view of an order of processes indicating a method of making the waveguides of the photomask corresponding to the layout in FIG. 34E.

First, as illustrated in FIG. 39C, light shielding film 324A is formed on transparent substrate 321. Subsequently, first resist film 325 is formed by coating on light shielding film 324A.

Figure 39D:
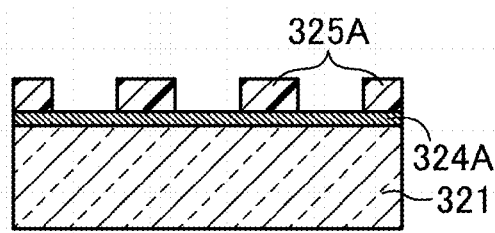
FIG. 39D is a sectional view of the order of processes indicating the method of making the waveguides of the photomask corresponding to the layout in FIG. 34E.

Next, as illustrated in FIG. 39D, first resist patterns 325A are formed from first resist film 325 by the lithography method with openings provided on formation regions of narrow carved portions 321a. FIG. 39H illustrates a planar layout of first resist pattern 325A in this case.

Figure 39E:
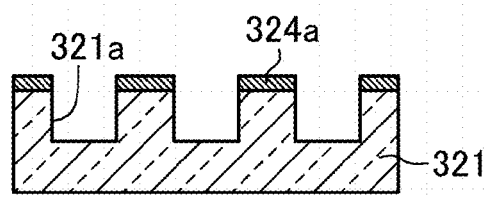
FIG. 39E is a sectional view of the order of processes indicating the method of making the waveguides of the photomask corresponding to the layout in FIG. 34E.

Next, as illustrated in FIG. 39E, light shielding film 324A and transparent substrate 321 are etched with use of first resist patterns 325A as masks to form a plurality of light shields 324a and a plurality of narrow carved portions 321a on transparent substrate 321.

Figure 39F:
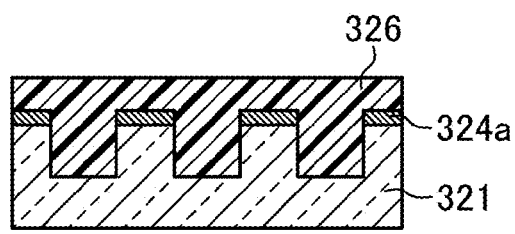
FIG. 39F is a sectional view of the order of processes indicating the method of making the waveguides of the photomask corresponding to the layout in FIG. 34E.
Figure 39H:
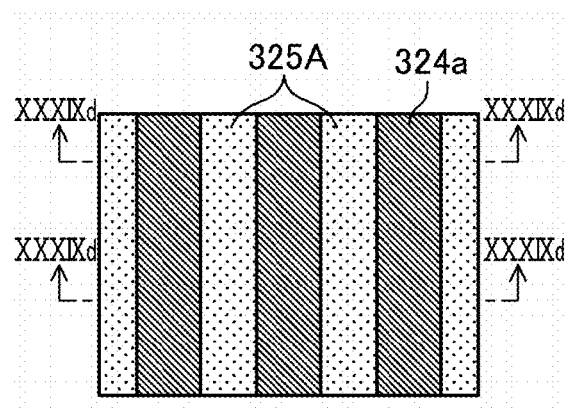
FIG. 39H is a plan view of the process in FIG. 39D.

Next, as illustrated in FIG. 39F, second resist film 326 is formed by coating on transparent substrate 321 in which narrow carved portions 321a have been formed.

Figure 39I:
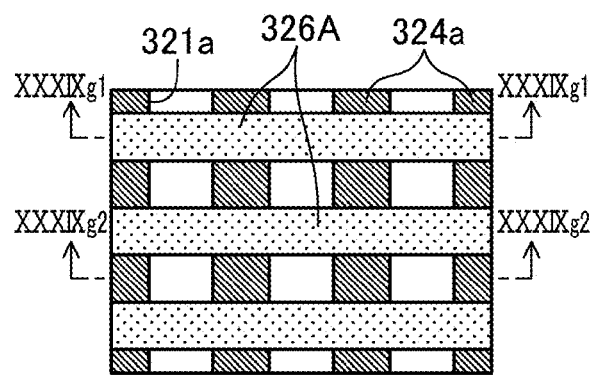
FIG. 39I is a plan view of the process in FIGS. 39G1 and 39G2.

Next, as illustrated in FIGS. 39G1 and 39G2, second resist patterns 326A are formed from second resist film 326 by the lithography method, to extend with an interval from each other in a direction perpendicular to a stretching direction of narrow carved portions 321a in transparent substrate 321. FIG. 39I illustrates a planar layout of second resist pattern 326A in this case. Subsequently, light shields 324a are etched with use of second resist patterns 326A as masks to obtain the layout illustrated in FIGS. 39A, 39B1 and 39B2.

The fifth layout is formed by performing patterning process of making photomask 32 two times, and a first patterning is performed along the stretching direction of narrow carved portions 321a and a second patterning is performed in a direction perpendicular to the stretching direction. Hence, the fifth layout provides an effect that, even when misalignment occurs at the first and second patterning upon alignment for exposure or the like, effective phases and transmittances do not change.

In addition, similarly to the first layout in FIG. 34A, even when a fine dimension is formed upon a mask manufacturing process, a fine dimension is not required in a resist pattern and a resist space pattern formed in exposure and development processes.

The modified examples of the layout of narrow carved portions 321a, light shields 324a and exposed portions 321b of transparent substrate 321 have been described assuming a linear pattern. Next, layouts applicable to a general two-dimensional layout will be described with reference to FIGS. 40A to 40F.

Layouts illustrated in FIGS. 40A to 40F each employ a configuration of a waveguide where narrow carved portions 321a, exposed portions 321b of transparent substrate 321 and light shields 324a are provided in a region segmented to a 1.5-fold dimension or less of an exposure wavelength, and the layout provided to the region is repeatedly arranged. Consequently, a waveguide can be configured by collecting the regions to be formed into a region of any shape. Consequently, it is possible to realize a phase distribution and a transmittance distribution of any two-dimensional shape.

Figure 40A:
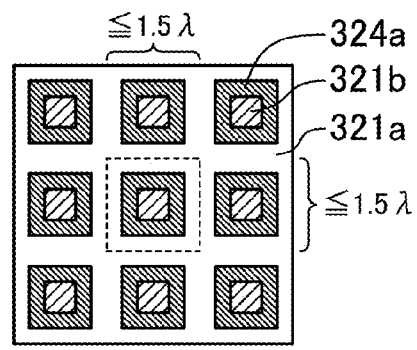
FIG. 40A is a schematic enlarged plan view illustrating a modified example of a layout for adjusting an effective transmittance of the waveguide of the photomask according to the fifth exemplary embodiment.
Figure 40B:
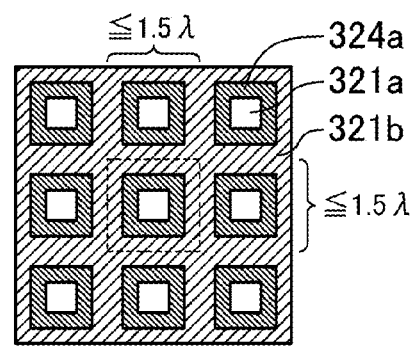
FIG. 40B is a schematic enlarged plan view illustrating a modified example of a layout for adjusting an effective transmittance of the waveguide of the photomask according to the fifth exemplary embodiment.

FIGS. 40A and 40B illustrate the layouts in which light shields 324a are arranged at boundaries between narrow carved portions 321a and exposed portions 321b of transparent substrate 321. A difference between these layouts is which of exposed portions 321b and narrow carved portions 321a are formed as isolated patterns. In FIG. 40A, exposed portions 321b of transparent substrate 321 are formed as the isolated patterns. By contrast with this, in FIG. 40B, narrow carved portions 321a are formed as the isolated patterns. These layouts both provide the same effect as that of the layout illustrated in FIG. 34B in a photomask making process.

Figure 40C:
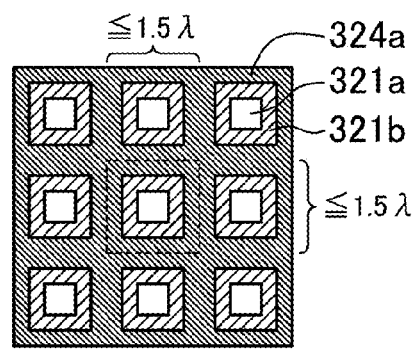
Figure 40D:
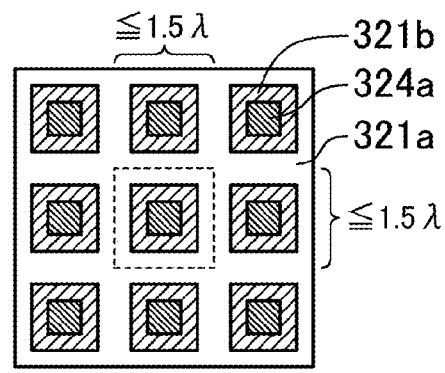

FIGS. 40C and 40D illustrate layouts in which exposed portions 321b of transparent substrate 321 are arranged at boundaries between narrow carved portions 321a and light shields 324a. A difference between these layouts is which of narrow carved portions 321a and light shields 324a are formed as isolated patterns. In FIG. 40C, narrow carved portions 321a are formed as the isolated patterns. By contrast with this, in FIG. 40D, light shields 324a are formed as the isolated patterns. These layouts provide the same effect as that of the layout illustrated in FIG. 34C in the photomask making process.

Figure 40E:
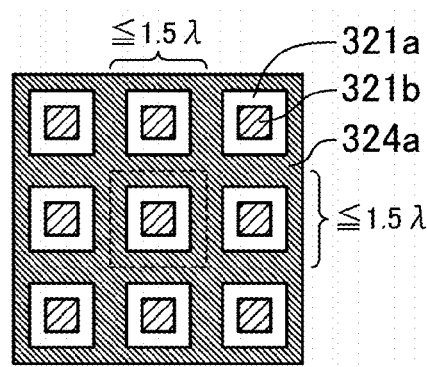
Figure 40F:
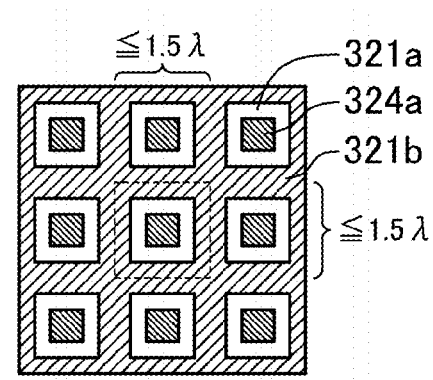

FIG. 40E and FIG. 40F illustrate layouts in which narrow carved portions 321a are arranged at boundaries between exposed portions 321b of transparent substrate 321 and light shields 324a. A difference between these layouts is which of exposed portions 321b and light shields 324a are formed as isolated patterns. In FIG. 40E, exposed portions 321b of transparent substrate 321 are formed as the isolated patterns. By contrast with this, in FIG. 40F, light shields 324a are formed as the isolated patterns. These layouts both provide the same effect as that of the layout illustrated in FIG. 34D in the photomask making process.

The layouts including all of narrow carved portions 321a and exposed portions 321b of transparent substrate 321 and light shields 324a have been described above. However, a layout in which exposed portions 321b of transparent substrate 321 are entirely covered by light shields 324a can also adjust phase shift and transmittances.

Thus, photomask 32 according to the fifth exemplary embodiment includes waveguides 323a to 323c formed composed of air filled in narrow carved portions 321a provided to transparent substrate 321, and regions between narrow carved portions 321a in transparent substrate 321. Further, any phase can be set, and partial light shields 324a are provided on exposed portions 321b between narrow carved portions 321a in transparent substrate 321. Consequently, photomask 32 can realize any transmittance.

Thus, it is possible to make a photomask for proximity exposure which can generate an amplitude intensity distribution and a phase distribution of light beams on a propagation plane between a lens and an exposure object used for projection transfer exposure. Consequently, even when proximity exposure is performed with gaps of several tens of µm, it is possible to realize lithography which can form patterns having dimensions corresponding to an exposure wavelength in good shapes.

In addition, similarly to the third exemplary embodiment, each waveguide is preferably configured to satisfy a relationship of at least one of following (1) and (2).

(1) The interval between narrow carved portions 321a is longer near main pattern 322, and sequentially becomes shorter with increasing distance from main pattern 322.

(2) The width of narrow carved portions 321a is narrower near main pattern 322, and sequentially becomes wider with increasing distance from main pattern 322.

A configuration where waveguides 323a to 323c including light shields 324a are provided to transparent substrate 321 has been described above. However, a configuration where a transmissive film is provided to transparent substrate 321, and waveguides including light shields 324a are provided to the provided transmissive film may be employed.

In particular, similarly to the third exemplary embodiment, when a main pattern corresponding to a desired pattern is a linear pattern, waveguides which are provided at positions sandwiching the linear pattern from both sides and include light shields are preferably configured such that waveguides having the same phase shifter function make a pair symmetrically with respect to a center line of the linear pattern.

Furthermore, in the present exemplary embodiment and in each modified example, too, the main pattern in a region corresponding to a desired pattern is provided with an exposed surface portion at which the transparent substrate is exposed. This configuration is preferable to enhance light intensities in the main pattern, yet is not indispensable similarly to the third exemplary embodiment.

Further, similarly to modified example 4 of the second exemplary embodiment, in the fifth exemplary embodiment, too, a configuration where a semi-transparent film is provided on a principal surface of a transparent substrate, an exposed surface portion at which the surface of the transparent substrate is exposed is provided as a main pattern and waveguides including light shields are provided to the semi-transparent film may be employed. Thus, it is possible to enhance amplitude intensities of light beams transmitted through the main pattern compared to amplitude intensities of light beams transmitted through the waveguides which are provided in a periphery of the main pattern and include light shields. As a result, similarly to modified example 4 of the second exemplary embodiment, when there are figures of different dimensions, a light intensity distribution is effectively formed.

Further, similarly to modified example 5 of the second exemplary embodiment, in the fifth exemplary embodiment, too, a configuration may be employed where a semi-transparent film which adjusts transmittances of light beams and a transparent film which adjusts phases of the light beams are sequentially stacked on the transparent substrate, an exposed surface portion at which the surface of the transparent substrate is exposed is provided at a position corresponding to a main pattern, and waveguides including light shields are provided in the transparent film in a periphery of the main pattern, with the semi-transparent film sandwiched between the transparent substrate and the transparent film. Thus, similarly to modified example 5 of the second exemplary embodiment, it is possible to easily obtain a structure which can realize desired transmittances and desired phases.

Sixth Exemplary Embodiment

The sixth exemplary embodiment will be described below with reference to FIGS. 41A and 41B.

Figure 41A:
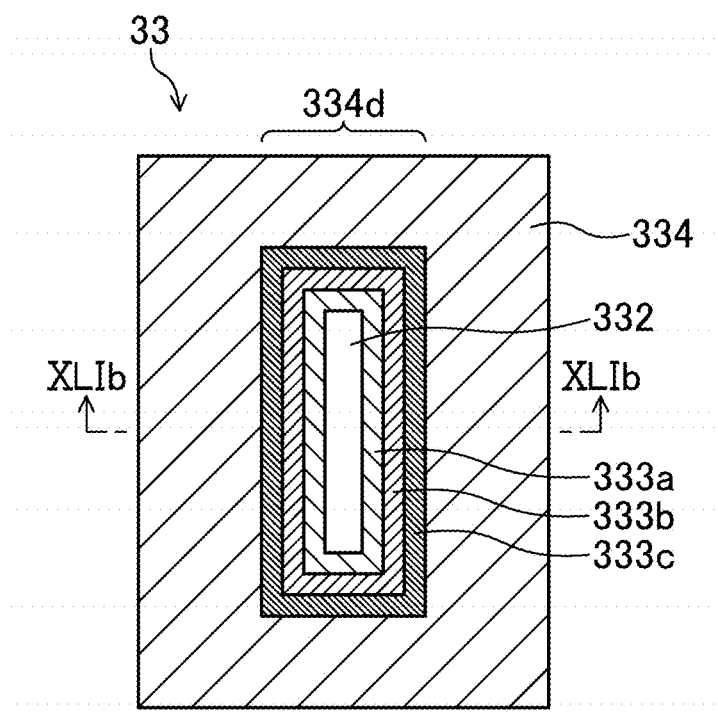
Figure 41B:
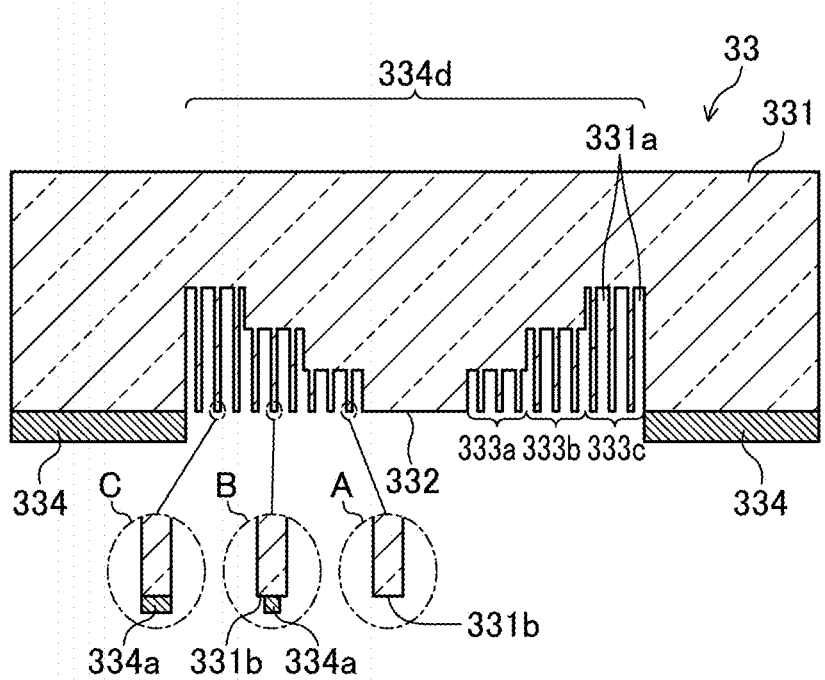

As illustrated in FIGS. 41A and 41B, similarly to the fourth exemplary embodiment, photomask 33 according to the sixth exemplary embodiment includes phase shifters 333a to 333c which are provided in mask pattern opening 334d and in a periphery of main pattern 332 which corresponds to a desired pattern, phase shifters 333a to 333c composed of carved portions of different carving depths. The carving depth of the carved portions which compose phase shifters 333a to 333c sequentially becomes deeper with increasing distance from main pattern 332. Further, a waveguide including a plurality of narrow carved portions is provided to each carved portion.

In the sixth exemplary embodiment, phase shifter (waveguide) 333a, for example, which produces one phase change is entirely provided to one carved portion. Photomask 33 according to the present exemplary embodiment differs from photomask 31 according to the fourth exemplary embodiment in that light shields 334a formed of light shielding films are selectively provided on surfaces (exposed portions 331b) in regions between narrow carved portions 331a which compose each waveguide on transparent substrate 331 made of glass or quartz.

In the present exemplary embodiment, light shield 334a is not provided to first phase shifters 333a at positions close to main pattern 332 which is the exposed surface portion. Light shields 334a are partially provided to exposed portions 331b of second phase shifters 333b on an outer side of first phase shifters 333a, and light shields 334a are entirely provided to surfaces of exposed portions 331b of third phase shifters 333c on an outer side of second phase shifters 333b.

FIG. 41B illustrates an enlarged sectional view of exposed portion 331b of first phase shifter 333a as region A, an enlarged sectional view of exposed portion 331b and light shield 334a of second phase shifter 333b as region B, and an enlarged sectional view of light shield 334a of third phase shifter 333c as region C.

Similarly to the fifth exemplary embodiment, according to the above configuration, a rate of light shields 334a provided to phase shifters 333a to 333c is increased with increasing distance from main pattern 332. Consequently, it is possible to lower amplitude intensities of light beams transmitted through phase shifters 333a to 333c. i.e., effective transmittances with increasing distance from main pattern 332.

That is, photomask 33 according to the present exemplary embodiment can realize the same effect as those of photomasks 31 and 32 according to the fourth exemplary embodiment and the fifth exemplary embodiment.

As described above, photomask 33 according to the sixth exemplary embodiment includes phase shifters 333a to 333c which are waveguides composed of air filled in narrow carved portions 331a, and the regions between narrow carved portions 331a in transparent substrate 331. Further, the carving depth of carved portions which compose phase shifters 333a to 333c becomes deeper with increasing distance from main pattern 332. Consequently, photomask 33 can realize any phase with small mask making man-hours with less load. Further, photomask 33 can have any transmittance by selectively providing light shields 334a on exposed portions 331b between narrow carved portions 331a on transparent substrate 331.

Thus, it is possible to make a photomask for proximity exposure which can generate an amplitude intensity distribution and a phase distribution of light beams on a propagation plane between a lens and an exposure object used for projection transfer exposure. Consequently, even when proximity exposure is performed with gaps of several tens of µm, it is possible to realize lithography which can form patterns having dimensions corresponding to an exposure wavelength in good shapes.

Further, modified examples of a planar layout composed of narrow carved portions 331a and exposed portions 331b of transparent substrate 331 and light shields 334a can include the layouts described in the fifth exemplary embodiment with reference to FIGS. 34A to 34E and 40A to 40F.

Similarly to the fifth exemplary embodiment, photomask 33 according to the sixth exemplary embodiment can be made by the process flow illustrated in FIGS. 35A to 39I and 40A to 40F. Consequently, it is possible to obtain the same effect as that in the fifth exemplary embodiment. In addition, a process of making photomask 33 according to the sixth exemplary embodiment differs from the process of making photomask 32 according to the fifth exemplary embodiment in that the depths of carved portions are different among phase shifters 333a to 333c and therefore a carving process needs to be performed while adjusted to a plurality of depths. Hence, etching for carving light shields 334 and transparent substrate 331 is performed a plurality of times for each depth of carved portions.

An example where one type of waveguide (phase shifter) is provided to one carved portion has been described in the present exemplary embodiment. However, a plurality of types of waveguides (phase shifters) may be provided to one carved portion.

Further, similarly to the third exemplary embodiment, dimensions of the narrow carved portions which compose the waveguide, and a thickness between the narrow carved portions in the transparent substrate are also preferably equal to an exposure wavelength or less.

Further, similarly to the third exemplary embodiment, each waveguide is preferably configured to satisfy a relationship of at least one of following (1) and (2).

(1) The interval between narrow carved portions 331a is longer near main pattern 332, and sequentially becomes shorter with increasing distance from main pattern 332.

(2) The width of narrow carved portions 331a is narrower near main pattern 332, and sequentially becomes wider with increasing distance from main pattern 332.

A configuration where the carved portions which include light shields 334a and include waveguides which compose phase shifters 333a to 333c are provided in transparent substrate 331 has been described above. However, a configuration where transmissive films are provided to the transparent substrate, and carved portions which include light shields and include waveguides which compose phase shifters are provided to the provided transmissive films may also be employed.

In particular, similarly to the second exemplary embodiment and the third exemplary embodiment, when a main pattern corresponding to a desired pattern is a linear pattern, carved portions which are provided at positions sandwiching the linear pattern from both sides and include waveguides including light shields are preferably configured such that carved portions having the same depth and waveguides adopting the same structure form a pair symmetrically with respect to a center line of the linear pattern.

Further, similarly to the second exemplary embodiment and the third exemplary embodiment, light shield 334 is preferably provided around the mask pattern opening including main pattern 332 and phase shifters 333a to 333c in the periphery of main pattern 332.

Furthermore, in the present exemplary embodiment, main pattern 332 is provided with an exposed surface portion at which transparent substrate 331 is exposed. This configuration is preferable to enhance light intensities in main pattern 332, yet is not indispensable similarly to the second exemplary embodiment and the third exemplary embodiment.

Further, similarly to modified example 4 of the second exemplary embodiment, in the sixth exemplary embodiment, too, a configuration may be employed where a semi-transparent film is provided on a principal surface of a transparent substrate, an exposed surface portion at which the surface of the transparent substrate is exposed is provided as a main pattern, and carved portions including waveguides and including light shields are formed on the semi-transparent film to form a plurality of phase shifters. Thus, it is possible to enhance amplitude intensities of light beams transmitted through the main pattern compared to amplitude intensities of light beams transmitted through the carved portions including the waveguides provided in the periphery of the main pattern. As a result, similarly to modified example 4 of the second exemplary embodiment, when there are figures of different dimensions, a light intensity distribution is effectively formed.

Further, similarly to modified example 5 of the second exemplary embodiment, in the sixth exemplary embodiment, too, a configuration may be employed where a semi-transparent film which adjusts transmittances of light beams and a transparent film which adjusts phases of light beams are sequentially stacked on a transparent substrate, an exposed surface portion at which the surface of the transparent substrate is exposed is provided at a position corresponding to a main pattern, and carved portions including light shields and waveguides are provided in the transparent film in a periphery of the main pattern, with the semi-transparent film sandwiched between the transparent substrate and the transparent film. Thus, similarly to modified example 5 of the second exemplary embodiment, it is possible to easily obtain a structure which can realize desired transmittances and desired phases.

Seventh Exemplary Embodiment

The seventh exemplary embodiment will be described below with reference to FIGS. 42A and 42B.

Figure 42A:
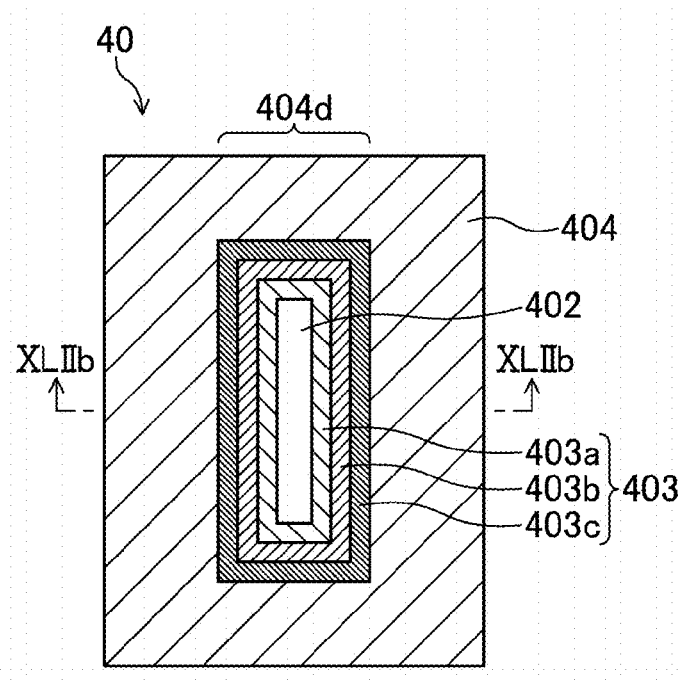
Figure 42B:
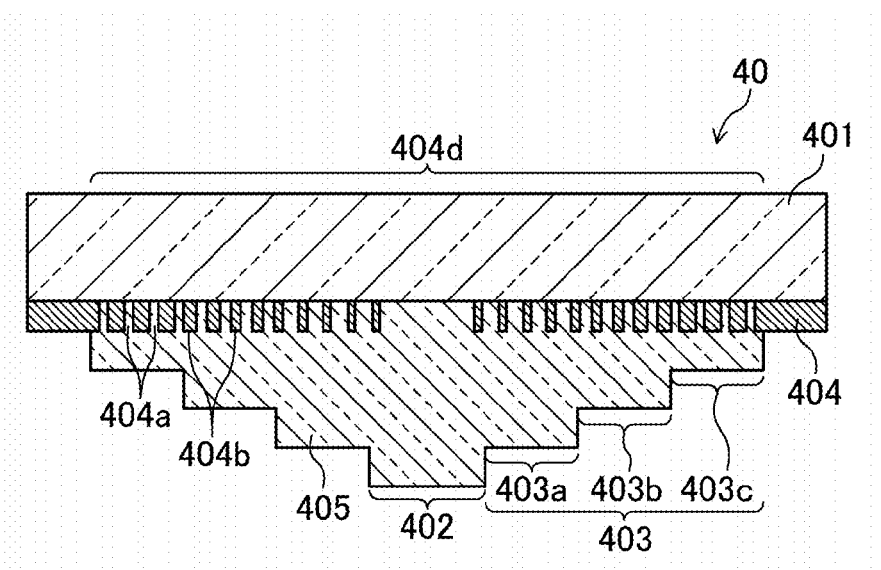

FIGS. 42A and 42B illustrate a photomask according to the present exemplary embodiment.

As illustrated in FIG. 42A, photomask 40 according to the present exemplary embodiment includes linear main pattern 402 at a position corresponding to a desired linear transfer pattern. In a periphery of main pattern 402, auxiliary pattern 403 is provided which allows a desired transfer pattern to be formed on an exposure object spaced a predetermined distance apart from photomask 40. Auxiliary pattern 403 has a phase shifter function which can adjust transmission intensities and phases of transmitted light beams. Auxiliary pattern 403 is composed of first phase shifter 403a, second phase shifter 403b and third phase shifter 403c in order from a position closer to main pattern 402. In this regard, advancement of phase planes of light beams transmitted through phase shifters 403a to 403 increases from first phase shifter 403a to second phase shifter 403b and third phase shifter 403c provided at positions farther from main pattern 402 than first phase shifter 403a. In other words, a phase plane in first phase shifter 403a which is the closest to main pattern 402 is delayed the most. Further, transmission intensities of phase shifters 403a to 403c become weaker in order from first phase shifter 403a to third phase shifter 403c.

In the present exemplary embodiment, auxiliary pattern portion 403 can easily realize a function which can adjust transmission intensities and phases of transmitted light beams. FIG. 42B illustrates the sectional configuration.

As illustrated in FIG. 42B, photomask 40 according to the present exemplary embodiment includes transparent substrate 401 which is made of, for example, glass, quartz or the like and allows exposure light beams to be transmitted, light shield 404 which is formed on a principal surface of transparent substrate 401, is formed of a light shielding film made of chrome (Cr) or the like and includes linear micro openings 404a, and transparent film 405 which is formed across light shield 404.

In this regard, a phase distribution of light beams can be realized by, for example, composing phase shifters 403a to 403c of carved portions formed such that a film thickness of transparent film 405 becomes thinner with increasing distance from main pattern 402. Further, the transmission intensities of light beams can be realized based on, for example, arrangement positions (layouts) of a plurality of micro openings 404a provided to phase shifters 403a to 403c.

In the present exemplary embodiment, a region including main pattern 402 and auxiliary pattern 403 provided around main pattern 402 is mask pattern opening 404d of light shield 404. In this regard, regions at an inner side of mask pattern opening 404d on light shield 404 and sandwiched by micro openings 404a are light shields 404b.

According to this configuration, phase shifters 403a to 403c which compose auxiliary pattern 403 can adjust transmittances and phases of light beams transmitted through phase shifters 403a to 403c by optionally adjusting widths of micro openings 404a of light shield 404 and the film thickness of transparent film 405.

More specifically, when the dimension of micro opening 404a provided to light shield 404 and a width dimension between micro openings 404a, i.e., the width dimension of light shield 404b is equal to an exposure wavelength or less, light beams are transmitted at light intensities which depend on an area ratio of micro openings 404a, i.e., an opening area ratio per unit area. Thus, it is possible to adjust effective transmittances of light beams. The effective transmittances in phase shifters 403a to 403c can be approximated as follows. In this regard, AK represents an area of micro openings 404a, and AD represents an area of light shields 404b.

Effective Transmittance=$(AK)/(AK+AD)$

In this regard, preferably, micro opening 404a and light shield 404b collectively having a 1.5-fold dimension of the exposure wavelength or less are repeatedly arranged. Thus, an average dimension of micro openings 404a and light shields 404b is made to be equal to the exposure wavelength or less. Consequently, openings 404a and light shields 404b can be regarded as a material having average optical characteristics as a whole instead of individual optical characteristics.

Various modified examples of layouts of micro openings 404a and light shields 404b will be described below with reference to FIGS. 43A, 43B and 44.

Figure 43A:
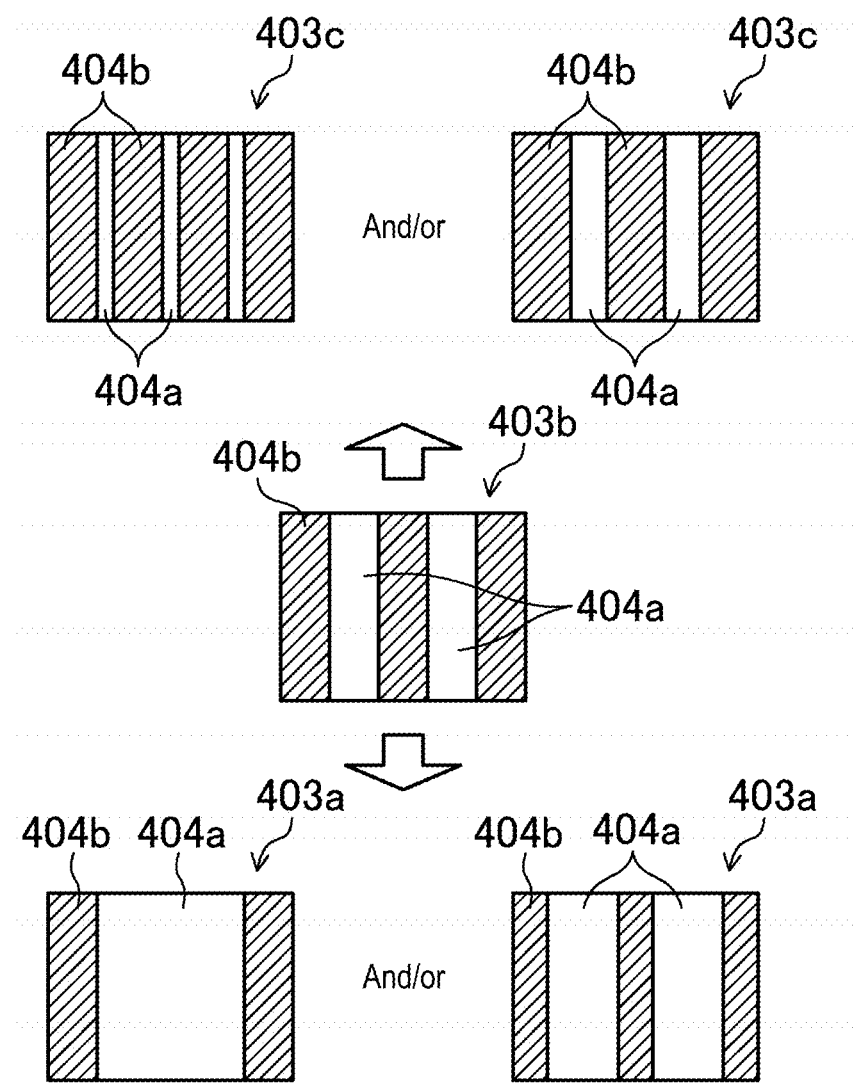

FIG. 43A schematically illustrates a relationship among first phase shifters 403a, second phase shifters 403b and third phase shifters 403c as to linear micro openings 404a and light shields 404b included in first phase shifters 403a, second phase shifters 403b and third phase shifters 403c. In first phase shifters 403a, second phase shifters 403b and third phase shifters 403c, widths of micro openings 404a and light shields 404b are configured to satisfy a relationship of at least one of following (1) and (2) such that intensities of transmitted light beams become weaker in order of first phase shifters 403a, second phase shifters 403b and third phase shifters 403c, i.e., such that intensity of light beam transmitted through first phase shifter 403a is the strongest.

(1) The width of micro openings 404a is the widest in first phase shifter 403a, and becomes narrower in order of second phase shifter 403b and third phase shifter 403c.

(2) The width of light shields 404b is the narrowest in first phase shifter 403a, and becomes wider in order of second phase shifter 403b and third phase shifter 403c.

A configuration where micro openings 404a and light shields 404b are linearly formed has been assumed above. However, these micro openings 404a and light shields 404b may be configured to be isolated. For example, planar shapes of micro openings 404a and light shields 404b may be rectangular shapes or other polygonal shapes. This is because, when micro openings 404a and light shields 404b are alternately provided each having a dimension equal to or less than a wavelength of light beams, effective transmittances are determined based on a value of a composition ratio between micro openings 404a and light shields 404b independently of planar shapes of micro openings 404a and light shields 404b.

FIG. 43B illustrates an example where light shields 404b have isolated patterns. In this regard, a plurality of light shields 404b has, for example, rectangular shapes when seen in a plan view, and are cyclically arranged. An arrangement cycle of this cyclic arrangement is preferably a 1.5-fold dimension of the exposure wavelength or less. In such a case, preferably, an area ratio which light shields 404b occupy in a predetermined region is the lowest in first phase shifter 403a, and becomes higher in order of second phase shifter 403b and third phase shifter 403c. When the planar shapes of individual light shields 404b are formed in similar shapes, areas of and intervals between individual light shields 404b are preferably configured to satisfy a relationship of at least one of following (1) and (2).

(1) The interval between light shields 404b is the longest in first phase shifter 403a and becomes shorter in order of second phase shifter 403b and third phase shifter 403c.

(2) The area ratio of light shields 404b is the lowest in first phase shifter 403a and becomes higher in order of second phase shifter 403b and third phase shifter 403c.

Figure 44:
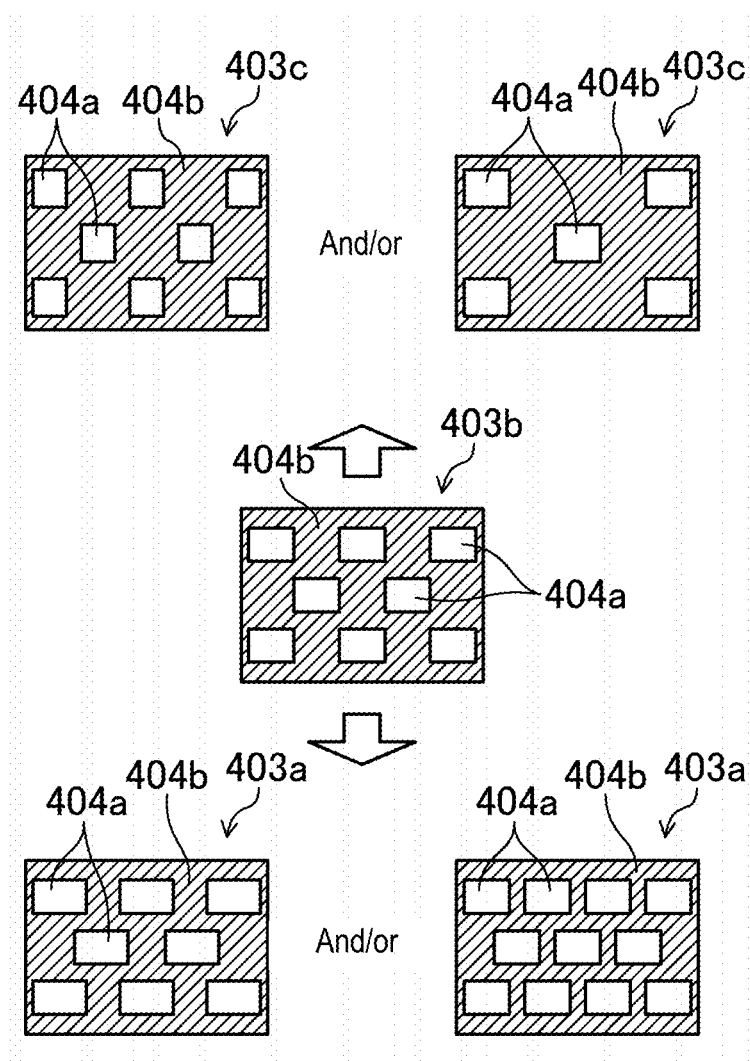

Further, FIG. 44 illustrates an example where micro openings 404a have isolated patterns. In this case, too, similarly to above light shields 404b, micro openings 404a are cyclically arranged, and this arrangement cycle is preferably 1.5-fold of the exposure wavelength or less.

Preferably, the area ratio of micro openings 404a which occupy in a predetermined region is the lowest in third phase shifter 403c, and becomes higher in order of second phase shifter 403b and first phase shifter 403a. When the planar shapes of individual light shields 404b are formed in similar shapes, areas of and intervals between individual light shields 404b are preferably configured to satisfy a relationship of at least one of following (1) and (2).

(1) The interval between micro openings 404a is the longest in third phase shifter 403c and becomes shorter in order of second phase shifter 403b and first phase shifter 403a.

(2) The area ratio of micro openings 404a is the lowest in third phase shifter 403c and becomes higher in order of second phase shifter 403b and first phase shifter 403a.

According to the above configuration, photomask 40 according to the present exemplary embodiment can sequentially lower effective transmittances of light beams with increasing distance from main pattern 402 toward a periphery of main pattern 402.

As described above, by providing a plurality of micro openings 404a to a film which forms light shield 404, it is possible to realize a transmittance distribution of light beams. Further, by providing transparent film 405 including adequate carved portions which are phase shifters 403a to 403c, on light shield 404 including a plurality of micro openings 404a, it is possible to adjust a phase distribution of light beams.

In the present exemplary embodiment, transparent film 405 is provided to main pattern 402 and phase shifters 403a to 403c provided in a periphery of main pattern 402. Transparent film 405 is configured such that phase planes of exposure light beams transmitted through phase shifters 403a to 403c spaced apart from main pattern 402 sequentially advance with increasing distance from the main pattern.

More specifically, as to transparent film 405 provided on light shield 404, a film thickness of transparent film 405 in an upper portion of main pattern 402 is configured to be thicker than film thicknesses of phase shifters 403a to 403c provided in the periphery of main pattern 402.

Further, the film thickness of transparent film 405 in the region which composes phase shifters 403a to 403c is configured to sequentially become thinner with increasing distance from main pattern 402. That is, the film thickness of transparent film 405 is the thickest in first phase shifter 403a, and sequentially becomes thinner in order of second phase shifter 403b and third phase shifter 403c.

In addition, for example, a PMMA film or a $SiO_2$ film can be used for transparent film 405.

As described above, photomask 40 according to the present exemplary embodiment can have any effective transmittance distribution with use of the layout of micro openings 404a provided to light shield 404. Further, it is possible to have any phase distribution according to a distribution of the film thicknesses of transparent film 405 provided on light shield 404. Consequently, it is possible to more easily realize a photomask which can reliably reproduce an amplitude distribution and a phase distribution on a propagation plane used for projection transfer exposure. That is, according to the present exemplary embodiment, it is possible to form a fine pattern equivalent to that of projection transfer exposure.

In addition, even a configuration where light shields 404b are not provided to phase shifters 403a to 403c can provide an effect of condensing exposure light beams by adjusting the film thickness of transparent film 405.

Eighth Exemplary Embodiment

The eighth exemplary embodiment will be described below with reference to FIGS. 45A and 45B. In the present exemplary embodiment, a substrate for a photomask employs a configuration where a semi-transparent film is stacked on a transparent substrate, and carved portions provided to the transparent substrate and the semi-transparent film provided on the transparent substrate are used to realize a phase distribution of light beams.

FIGS. 45A and 45B illustrate a photomask according to the present exemplary embodiment.

As illustrated in FIG. 45A, photomask 50 according to the present exemplary embodiment includes linear main pattern 502 at a position corresponding to a desired linear transfer pattern. In a periphery of main pattern 502, carved portion 503a and semi-transparent portion 505a provided to a periphery of carved portion 503a are provided to allow a desired transfer pattern to be formed on an exposure object spaced a predetermined distance apart from photomask 50.

In the present exemplary embodiment, a region including main pattern 502, and carved portion 503a and semi-transparent portion 505a which are provided around main pattern 502 is mask pattern opening 504d of light shield 504. Hence, carved portion 503a and semi-transparent portion 505a exposed at mask pattern opening 504d are auxiliary pattern 503. Auxiliary pattern 503 has a phase shifter function which can adjust transmission intensities and phases of transmitted light beams.

Further, as illustrated in FIG. 45B, the sectional configuration of photomask 50 includes transparent substrate 501 which is made of, for example, glass, quartz or the like and allows exposure light beams to be transmitted, semi-transparent film 505 which is formed on a principal surface of transparent substrate 501 and is formed of a PMMA film or a $SiO_2$ film whose transmittance of light beams has been adjusted based on a composition, and light shield 504 which is formed in a circumference of semi-transparent film 505 and is formed of a light shielding film made of chrome (Cr) or the like.

In this regard, in a region around main pattern 502 at which the principal surface of transparent substrate 501 is exposed, carved portion 503a is provided which is carved to have such a depth that causes 120° advance in terms of phases of exposure light beams.

Further, semi-transparent portion 505a which is a portion of semi-transparent film 505 exposed at mask pattern opening 504d is configured to have such a thickness that a delay of 120° occurs in terms of phases of exposure light beams compared to main pattern 502. This is equivalent to that the phase plane advances 240°.

Hence, when a carving depth of transparent substrate 501 is 120°+360°×n (in this regard, n represents an integer) and a film thickness of semi-transparent portion 505a is 240°+360°×m (in this regard, m represents an integer), it is possible to realize a configuration where phase planes of exposure light beams advance more with increasing distance from main pattern 502.

Further, a configuration may be employed where phases in carved portion 503a advance 120° or less, i.e., for example, 90° compared to phases of light beams transmitted through main pattern 502 which is an exposed surface portion provided to transparent substrate 501, and phases of light beams transmitted through semitransparent portion 505a advance 120° or less, i.e., for example, 90° compared to main pattern 502.

Furthermore, as to semi-transparent film 505 which is semi-transparent portion 505a and is stacked on transparent substrate 501, by adjusting the transmittance of semi-transparent film 505 to provide such semi-transparency that, for example, the amplitude intensity becomes half, it is possible to achieve a configuration where transmittances of exposure light beams lower with increasing distance from the main pattern.

According to the above configuration, when main pattern 502, carved portion 503a and semi-transparent portion 505a are adjusted to provide a distribution obtained by ternarizing by 0°, 120° and 240° a phase distribution on a propagation plane between a lens and an exposure object used for projection transfer exposure, it is possible to obtain photomask 50 which can realize a resolution equivalent to that obtained by the projection transfer exposure even in proximity exposure.

In this case, a pattern width of semi-transparent portion 505a provided in a periphery of carved portion 503a is preferably narrowed compared to the pattern width of carved portion 503a provided in a periphery of main pattern 502. This configuration corresponds to the feature of the photomask which reproduces a phase distribution on a propagation plane of light beams as described in the first exemplary embodiment.

Further, in the present exemplary embodiment, carved portion 503a and semi-transparent portion 505a form a pattern shape which surrounds main pattern 502, and light shield 504 is formed in the periphery of mask pattern opening 504d. However, light shield 504 may be partially formed on an inner side of mask pattern opening 504d.

Further, similarly to the fifth exemplary embodiment and the sixth exemplary embodiment, by partially providing waveguides to carved portion 503a or semi-transparent portion 505a, it is possible to partially change effective transmittances of light beams in carved portion 503a and change effective transmittances of light beams in semi-transparent portion 505a. Furthermore, when main pattern 502 is a linear pattern, carved portion 503a and semi-transparent portion 505a provided at positions sandwiching the linear pattern from both sides are preferably configured such that carved portion 503a and semi-transparent portion 505a having the same depth make a pair symmetrically with respect to a center line of the linear pattern.

Further, light shield 504 is preferably provided on semi-transparent film 505 and in a periphery of carved portion 503a and semi-transparent portion 505a provided to main pattern 502 and in a periphery of main pattern 502.

Furthermore, main pattern 502 provided in a region corresponding to a desired pattern and having a protruding sectional shape is provided in a center portion of mask pattern opening 504d. However, main pattern 502 is not limited to the protruding sectional shape. For example, main pattern 502 may be formed to be deeper than carved portion 503a by carving transparent substrate 501 to a depth corresponding to a phase change of an integer multiple of 360°.

Further, in the present exemplary embodiment, waveguides may be configured inside carved portion 503a of transparent substrate 501 or inside semi-transparent portion 505a to further segment a phase distribution.

As described above, the photomasks according to the first to eighth exemplary embodiments can make light beams transmitted through the photomasks form a predetermined shape at a position spaced a predetermined distance apart from the photomasks. That is, even a simple exposure method such as proximity exposure can form a smaller pattern than a limit dimension which a conventional photomask can form.

Further, with use of a lens function, it is possible to form a transfer image at a predetermined focal position. Consequently, even projection transfer exposure of an equal magnification for a small opening dimension through which light beams are not transmitted with sufficient intensities in a conventional technique can form a light condensed image and form a fine pattern.

Ninth Exemplary Embodiment

The ninth exemplary embodiment will be described below with reference to FIGS. 46A to 46D. In the present exemplary embodiment, an example of a pattern forming method will be described which uses the photomask according to one of the first to eighth exemplary embodiments and the modified examples of first to eighth exemplary embodiments.

First, as illustrated in FIG. 46A, processing target film 601 such as a metal film or an insulation film is formed on a principal surface of substrate 600.

Next, as illustrated in FIG. 46B, positive resist film 602 is formed on processing target film 601 by a coating method.

Next, as illustrated in FIG. 46C, photomask 650 according to one of the first to eighth exemplary embodiments and the modified examples of the first to eighth exemplary embodiments such as the photomask according to the first exemplary embodiment illustrated in FIG. 1B is irradiated with exposure light beams. Thus, resist film 602 is exposed by the transmitted light beams transmitted through photomask 650. In this regard, in a periphery of a main pattern of photomask 650, a plurality of phase shifters 651 are provided to condense light beams transmitted through photomask 650.

For example, in this exposure process, resist film 602 is first exposed with use of an exposure light beam source. In this case, light beams transmitted through photomask 650 are condensed on substrate 600, and, in a subsequent development process, resist film 602 is irradiated with such exposure energy that resist film 602 melts to form latent image portion 602a.

Next, as illustrated in FIG. 46D, by developing exposed resist film 602 and removing latent image portion 602a, resist pattern 602A having fine pattern 602b on resist film 602 is formed.

Next, although not illustrated, by etching processing target film 601 with use of resist pattern 602A as an etching mask, and removing a region of processing target film 601 which is not covered with resist pattern 602A, a pattern having a desired shape is formed on processing target film 601. In this regard, resist pattern 602A is used as an etching mask for etching processing target film 601. However, resist pattern 602A can also be used as an injection mask for injecting ions in a desired region of substrate 600, without forming processing target film 601.

Thus, according to the pattern forming method according to the ninth exemplary embodiment, it is possible to provide the same effect as that in the first exemplary embodiment and, in addition, the same effects as those in the second to eighth exemplary embodiments. More specifically, proximity exposure is performed on processing target film 601 coated with resist film 602 and substrate 600 coated with resist film 602 through photomask 650 according to the present disclosure. In this case, phase shifters 651 in an opening of photomask 650 condense light beams transmitted through photomask 650 on resist film 602, so that it is possible to form a fine pattern.

In addition, a positive resist process has been used in the present exemplary embodiment. Instead, even when a negative resist process is used, it is possible to provide the same effect as that in the present exemplary embodiment.

Further, all exemplary embodiments have been described assuming an exposure method which uses a flat plate mask as a photomask. However, the present disclosure is not limited to this. For example, the present disclosure is also effective even when an exposure method which uses a roller photomask is used.

An exposure device which uses a roller photomask will be described below as one modified example of the ninth exemplary embodiment.

Modified Example of Ninth Exemplary Embodiment

An exposure device which uses a roller photomask will be described with reference to FIGS. 47A and 47B.

FIG. 47A illustrates roller photomask 701. Roller photomask 701 has a cylindrical shape, and there is cavity 702 inside cylindrical photomask 701. An inner wall of cylindrical photomask 701 is formed of transparent substrate 703 made of glass, quartz or the like. A mask pattern is drawn on a surface of an outer side of transparent substrate 703. The mask pattern is formed on mask pattern formation portion 704. A region of the outer wall of photomask 701 except for mask pattern formation portion 704 is covered by light shielding film 705. In this case, mask pattern formation portion 704 is formed as a component including the photomask according to one of the first to eighth exemplary embodiments and the modified examples of the first to eighth exemplary embodiments.

FIG. 47B schematically illustrates the exposure device which uses roller photomask 701, and an operation of the exposure device. In this regard, cavity 702 of cylindrical photomask 701 is seen from a lateral direction.

As illustrated in FIG. 47B, light source 706 is provided in cavity 702 of cylindrical photomask 701. At a position spaced apart from photomask 701, processing target substrate 707 is arranged. Further, photomask 701 is held rotatably around light source 706. By contrast with this, processing target substrate 707 is held movably in a direction parallel to a principal surface of processing target substrate 707. In this case, by synchronizing a rotation speed of photomask 701 and a moving speed of processing target substrate 707, the mask pattern drawn on the outer wall of cylindrical photomask 701 is exposed to be formed on processing target substrate 707.

By processing a surface of roller photomask 701, the exposure device according to the present exemplary embodiment can condense light beams transmitted through photomask 701, on a position spaced a predetermined distance apart from photomask 701, i.e., on a surface of processing target substrate 707 on which a resist film (not illustrated) has been formed. As a result, it is possible to form a fine pattern in a large area.

The photomask and the pattern forming method which uses the photomask according to the present disclosure are useful for micromachining of semiconductors and large area elements such as video panels and energy elements such as solar power generation.

What is claimed is:

1. A photomask comprising:
   a transparent substrate; and
   a light shield provided to the transparent substrate and shielding an exposure light beam, wherein
   the light shield includes a translucent mask pattern opening,
   the mask pattern opening includes a plurality of translucent regions which are provided to a periphery of a region corresponding to a desired pattern, and allow exposure light beams to be transmitted through at least three different phases, and
   the plurality of translucent regions are configured such that a phase plane of an exposure light beam transmitted through a translucent region of the plurality of translucent regions, the translucent region spaced apart from the region corresponding to the desired pattern, advances more toward an exposure object spaced a predetermined distance apart than a phase plane of an exposure light beam transmitted through a translucent region of the plurality of translucent regions, the translucent region being close to the region corresponding to the desired pattern, such that the exposure light beams that are transmitted through the mask pattern opening form a projection image of the desired pattern on the exposure object.

2. The photomask according to claim 1, wherein exposure light beams that are transmitted through the respective translucent regions are configured to be lowered in transmission intensity as a distance from the region corresponding to the desired pattern increases.

3. The photomask according to claim 1, wherein the mask pattern opening includes a main pattern provided in the region corresponding to the desired pattern, an auxiliary pattern is provided in a periphery of the region corresponding to the desired pattern, the auxiliary pattern allowing an exposure light beam to be transmitted at a phase different from a phase of the main pattern, the auxiliary pattern including the plurality of translucent regions, the auxiliary pattern includes a first phase shifter provided to a region close to the main pattern, and a second phase shifter provided to a region far from the main pattern, and a phase plane of an exposure light beam transmitted through the second phase shifter is configured to advance more toward the exposure object than a phase plane of an exposure light beam transmitted through the first phase shifter.

4. The photomask according to claim 3, wherein the light shield is provided around the auxiliary pattern.

5. The photomask according to claim 3, wherein the main pattern and the auxiliary pattern are linear, and the first phase shifter and the second phase shifter are provided to make a pair at positions sandwiching the main pattern on both sides of a stretching direction of the main pattern.

6. The photomask according to claim 3, wherein at least one of the first phase shifter and the second phase shifter has a width equal to or more than an exposure wavelength.

7. The photomask according to claim 3, wherein a phase difference between exposure light beams that are transmitted through the first phase shifter and the second phase shifter is 120° or less.

8. The photomask according to claim 3, wherein each of the first phase shifter and the second phase shifter is linear, and a width of the second phase shifter is narrower than a width of the first phase shifter.

9. The photomask according to claim 3, wherein a width of the second phase shifter is a 0.71-fold width of the first phase shifter or less.

10. The photomask according to claim 3, wherein each of the first phase shifter and the second phase shifter is linear, and a length of the second phase shifter is shorter than a length of the first phase shifter.

11. The photomask according to claim 3, wherein the main pattern includes a protruding corner which protrudes outward, and the auxiliary pattern is not provided to a periphery of the protruding corner.

12. The photomask according to claim 3, wherein the main pattern includes a protruding corner which protrudes outward, and a width of the auxiliary pattern is narrow in a periphery of the protruding corner.

13. The photomask according to claim 3, wherein the main pattern includes a linear end or a protruding corner which protrudes outward, the first phase shifter and the second phase shifter are provided in parallel to an outer circumference of the main pattern, and the second phase shifter is divided in the end or a periphery of the protruding corner.

14. The photomask according to claim 3, wherein the auxiliary pattern includes a pattern which produces the same phase as a phase of the main pattern or produces a phase different from the phase of the main pattern by an integer multiple of 360°.

15. The photomask according to claim 3, wherein the first phase shifter and the second phase shifter are formed by carving the transparent substrate.

16. The photomask according to claim 3, further comprising a transparent film provided on the mask pattern opening on the transparent substrate, wherein a thickness of a formation region of the first phase shifter in the transparent film is thicker than a thickness of a formation region of the second phase shifter in the transparent film.

17. The photomask according to claim 16, wherein a thickness of a formation region of the main pattern in the transparent film is thicker than the thicknesses of the formation regions of the first phase shifter and the second phase shifter in the transparent film.

18. The photomask according to claim 16, wherein a plurality of linear light shields are provided in a region between the transparent substrate and the transparent film, and yet, to the first phase shifter and the second phase shifter, and a width of each of the plurality of light shields is equal to or less than a wavelength of the exposure light beam.

19. The photomask according to claim 18, wherein an interval between adjacent ones of the light shields provided to the first phase shifter is longer than an interval between adjacent ones of the light shields provided to the second phase shifter.

20. The photomask according to claim 18, wherein an interval between adjacent ones of the light shields is equal to or less than the wavelength of the exposure light beam.

21. The photomask according to claim 18, wherein a width of each of the light shields provided to the first phase shifter is narrower than a width of each of the light shields provided to the second phase shifter.

22. The photomask according to claim 16, wherein a plurality of isolated light shields including micro openings are provided in a region between the transparent substrate and the transparent film and to the first phase shifter and the second phase shifter, and an area ratio per unit area of the micro openings provided to the first phase shifter is higher than an area ratio per unit area of the micro openings provided to the second phase shifter.

23. The photomask according to claim 16, wherein a plurality of isolated light shields including micro openings are provided in a region between the transparent substrate and the transparent film, and yet, to the first phase shifter and the second phase shifter, and an interval between adjacent ones of the micro openings provided to the first phase shifter is shorter than an interval between adjacent ones of the micro openings provided to the second phase shifter.

24. The photomask according to claim 16, wherein
a plurality of isolated light shields are provided in a region between the transparent substrate and the transparent film, and yet, to the first phase shifter and the second phase shifter, and
an area ratio per unit area of the plurality of light shields provided to the first phase shifter is lower than an area ratio per unit area of the plurality of light shields provided to the second phase shifter.

25. The photomask according to claim 16, wherein
a plurality of isolated light shields are provided in a region between the transparent substrate and the transparent film, and yet, to the first phase shifter and the second phase shifter, and
an interval between adjacent ones of the light shields provided to the first phase shifter is longer than an interval between adjacent ones of the light shields provided to the second phase shifter.

26. The photomask according to claim 1, wherein
the mask pattern opening includes an auxiliary pattern provided to a periphery of the region corresponding to the desired pattern,
the auxiliary pattern includes a first carved portion provided in a region close to the region corresponding to the desired pattern, and a second carved portion provided in a region far from the region corresponding to the desired pattern,
the first carved portion and the second carved portion are formed by carving the transparent substrate, and
a depth of the second carved portion is deeper than a depth of the first carved portion.

27. The photomask according to claim 26, wherein
the auxiliary pattern includes a third carved portion in a region farther from the region corresponding to the desired pattern than the second carved portion, and
a depth of the third carved portion is deeper than one of the depth of the first carved portion and the depth of the second carved portion.

28. The photomask according to claim 1, wherein
the mask pattern opening includes an auxiliary pattern provided to a periphery of the region corresponding to the desired pattern,
the auxiliary pattern includes a first waveguide provided in a region close to the region corresponding to the desired pattern, and a second waveguide provided in a region far from the region corresponding to the desired pattern,
each of the first waveguide and the second waveguide is made of a translucent material having a thickness and a gap equal to or less than a wavelength of the exposure light beam, and
a phase plane of an exposure light beam transmitted through the second waveguide is configured to advance more toward the exposure object than a phase plane of an exposure light beam transmitted through the first waveguide.

29. The photomask according to claim 28, wherein
each of the first waveguide and the second waveguide is composed of a plurality of narrow carved portions provided in the transparent substrate,
a width of each of the narrow carved portions is equal to or less than the wavelength of the exposure light beam, and
an interval between adjacent ones of the narrow carved portions is equal to or less than the wavelength of the exposure light beam.

30. The photomask according to claim 29, wherein
an interval between adjacent ones of the narrow carve portions in the second waveguide is shorter than an interval between adjacent ones of the narrow carved portions of the first waveguide.

31. The photomask according to claim 29, wherein
a width of each of the narrow carved portions of the second waveguide is wider than a width of each of the narrow carved portions of the first waveguide.

32. The photomask according to claim 29, wherein
a depth of each of the narrow carved portions of the first waveguide is the same as a depth of each of the narrow carved portions of the second waveguide.

33. The photomask according to claim 29, wherein
a depth of each of the narrow carved portions of the second waveguide is deeper than a depth of each of the narrow carved portions of the first waveguide.

34. The photomask according to claim 29, wherein
a carved portion having a width equal to or more than the wavelength of the exposure light beam is provided to at least one of a region between the first waveguide and the second waveguide, and a region which is farther from the region corresponding to the desired pattern than the second waveguide and is adjacent to the second waveguide.

35. The photomask according to claim 29, wherein
light shields are each provided on a surface of a region between adjacent ones of the narrow carved portions in the transparent substrate.

36. The photomask according to claim 35, wherein
the light shields are each provided so as to a center portion of the surface.

37. The photomask according to claim 35, wherein
the light shields are each provided to expose a center portion of the surface.

38. The photomask according to claim 35, wherein
the light shields are cyclically and repeatedly disposed in at least one of the first waveguide and the second waveguide.

39. The photomask according to claim 35, wherein
a ratio of an exposed portion of the surface between the narrow carved portions of the second waveguide to the light shield is smaller than a ratio of an exposed portion of the surface between the narrow carved portions of the first waveguide to the light shield.

40. The photomask according to claim 35, wherein
the narrow carved portions, the light shields and exposed portions on surfaces between the narrow carved portions are cyclically and repeatedly disposed in at least one of the first waveguide and the second waveguide.

41. The photomask according to claim 40, wherein
a cycle at which the narrow carved portions, the light shields and the exposed portions are repeatedly disposed is 1.5-fold of the wavelength of the exposure light beam or less.

42. The photomask according to claim 41, wherein
a rate of the narrow carved portions of the second waveguide is higher than a rate of the narrow carved portions of the first waveguide.

43. The photomask according to claim 41, wherein
a rate of the light shields in the second waveguide is higher than a rate of the light shields in the first waveguide.

44. The photomask according to claim 41, wherein
a rate of the exposed portions in the second waveguide is lower than a rate of the exposed portions in the first waveguide.

45. The photomask according to claim 26, wherein
a main pattern at which a surface of the transparent substrate is exposed is provided in the region corresponding to the desired pattern.

46. The photomask according to claim 26, wherein
the first carved portion and the second carved portion are formed by carving the transparent substrate.

47. The photomask according to claim 26, further comprising a semi-transparent film provided between the transparent substrate and the light shield,
wherein the first carved portion and the second carved portion are formed by carving the semi-transparent film.

48. The photomask according to claim 26, further comprising a semi-transparent film and a transparent film which are provided between the transparent substrate and the light shield, the semi-transparent film being provided at the transparent substrate and the transparent film being provided at the light shield,
wherein the first carved portion and the second carved portion are formed by carving the transparent film.

49. The photomask according to claim 29, wherein
the plurality of narrow carved portions are formed by carving the transparent substrate.

50. The photomask according to claim 29, further comprising a semi-transparent film provided between the transparent substrate and the light shield,
wherein the plurality of narrow carved portions are formed by carving the semi-transparent film.

51. The photomask according to claim 29, further comprising a semi-transparent film and a transparent film which are provided between the transparent substrate and the light shield, the semi-transparent film being provided at the transparent substrate and the transparent film being provided at the light shield,
wherein the plurality of narrow carved portions are formed by carving the transparent film.

52. The photomask according to claim 1, further comprising a semi-transparent film provided between the transparent substrate and the light shield, wherein
a main pattern at which the transparent substrate is exposed is provided in the region corresponding to the desired pattern in the mask pattern opening,
a carved portion formed by carving the transparent substrate is provided adjacently to the main pattern, and
a semi-transparent portion at which the semi-transparent film is exposed is provided on an outer side of the carved portion.

53. The photomask according to claim 52, wherein
a phase difference between exposure light beams that are transmitted through the main pattern and the carved portion is 120° or less.

54. The photomask according to claim 52, wherein
a phase difference between exposure light beams that are transmitted through the main pattern and the semi-transparent portion is 120° or less.

55. The photomask according to claim 28, wherein
a main pattern at which a surface of the transparent substrate is exposed is provided in the region corresponding to the desired pattern.

* * * * *